US007579214B2

(12) United States Patent
Yamazaki et al.

(10) Patent No.: US 7,579,214 B2
(45) Date of Patent: Aug. 25, 2009

(54) SEMICONDUCTOR DEVICE AND A METHOD OF MANUFACTURING THE SAME

(75) Inventors: Shunpei Yamazaki, Setagaya (JP); Jun Koyama, Atsugi (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 262 days.

(21) Appl. No.: 11/041,747

(22) Filed: Jan. 25, 2005

(65) Prior Publication Data

US 2005/0121672 A1    Jun. 9, 2005

Related U.S. Application Data

(62) Division of application No. 09/794,244, filed on Feb. 28, 2001, now Pat. No. 6,882,012.

(30) Foreign Application Priority Data

Feb. 28, 2000  (JP) .............................. 2000-050644
Mar. 13, 2000  (JP) .............................. 2000-069556

(51) Int. Cl.
    *H01L 21/00* (2006.01)
(52) U.S. Cl. .................. 438/107; 438/109; 438/110; 438/153; 438/149; 438/151; 438/164; 257/59; 257/72; 257/79; 257/347; 257/686; 257/723
(58) Field of Classification Search ............ 438/148, 438/166, 487, 981, 153, 107, 109, 110, 149, 438/197, 151, 154, 164; 257/723, 686, 59, 257/72, 347
See application file for complete search history.

(56) References Cited

U.S. PATENT DOCUMENTS 5,130,833 A    7/1992  Mase (Continued)

FOREIGN PATENT DOCUMENTS

EP    0 921 517    6/1999

(Continued)

OTHER PUBLICATIONS

Hermann Schenk et al., "Polymers for Light Emitting Diodes," EuroDisplay '99 Proceedings, pp. 33-37.

*Primary Examiner*—Thao X Le
*Assistant Examiner*—Thanh Y Tran
(74) *Attorney, Agent, or Firm*—Eric J. Robinson; Robinson Intellectual Property Law Office, P.C.

(57) ABSTRACT

To form a driver circuit to be mounted to a liquid crystal display device or the like on a glass substrate, a quartz substrate, etc., and to provide a display device mounting driver circuits formed from different TFTs suited for their respective operational characteristics. A stick driver circuit on the scanning line side and a stick driver circuit on the data line side are different in structure, and have different TFTs in which the thickness of a gate insulating film, the channel length and other parameters are varied depending on required circuit characteristics. In the stick driver on the scanning line side, which is composed of a shift register circuit, a level shifter circuit, and a buffer circuit, the buffer circuit has a TFT with a thick gate insulating film because it is required to have a withstand voltage of 30 V. The stick driver circuit on the data line side, which is composed of a shift register circuit, a latch circuit, a level shifter circuit, and a D/A converter circuit, is driven at a high frequency, and hence its shift register circuit and latch circuit have thin gate insulating films and the channel length thereof is shorter than that of the TFT of the buffer circuit.

46 Claims, 36 Drawing Sheets

U.S. PATENT DOCUMENTS

| | | |
|---|---|---|
| 5,148,301 A | 9/1992 | Sawatsubishi |
| 5,200,847 A | 4/1993 | Mawatari et al. |
| 5,206,749 A | 4/1993 | Zavracky et al. |
| 5,247,190 A | 9/1993 | Friend et al. |
| 5,261,156 A | 11/1993 | Mase et al. |
| 5,317,236 A | 5/1994 | Zavracky et al. |
| 5,399,502 A | 3/1995 | Friend et al. |
| 5,545,577 A | 8/1996 | Tada |
| 5,552,618 A | 9/1996 | Taniguchi et al. |
| 5,654,811 A | 8/1997 | Spitzer et al. |
| 5,710,612 A | 1/1998 | Mase |
| 5,766,977 A | 6/1998 | Yamazaki |
| 5,834,327 A | 11/1998 | Yamazaki et al. |
| 6,025,901 A | 2/2000 | Adachi et al. |
| 6,118,502 A | 9/2000 | Yamazaki et al. |
| 6,147,667 A | 11/2000 | Yamazaki et al. |
| 6,165,824 A | 12/2000 | Takano et al. |
| 6,362,866 B1 | 3/2002 | Yamazaki et al. |
| 6,465,268 B2 | 10/2002 | Hirakata et al. |
| 6,709,901 B1 * | 3/2004 | Yamazaki et al. ............ 438/149 |
| 2002/0102823 A1 * | 8/2002 | Yamaguchi et al. ......... 438/487 |
| 2003/0160236 A1 | 8/2003 | Yamazaki et al. |

FOREIGN PATENT DOCUMENTS

| | | |
|---|---|---|
| JP | 4-012327 | 1/1992 |
| JP | 5-142571 | 6/1993 |
| JP | 07-014880 | 1/1995 |
| JP | 9-054334 | 2/1997 |
| JP | 10-092576 | 4/1998 |
| JP | 10-197897 | 7/1998 |
| JP | 11-26596 | 1/1999 |
| JP | 11-160734 | 6/1999 |
| JP | 2001-330860 | 11/2001 |
| WO | WO 90/13148 | 11/1990 |

* cited by examiner

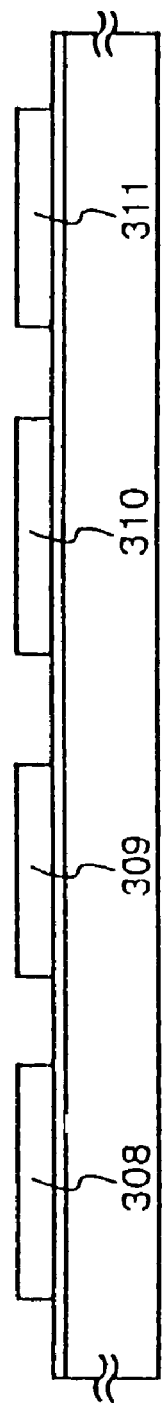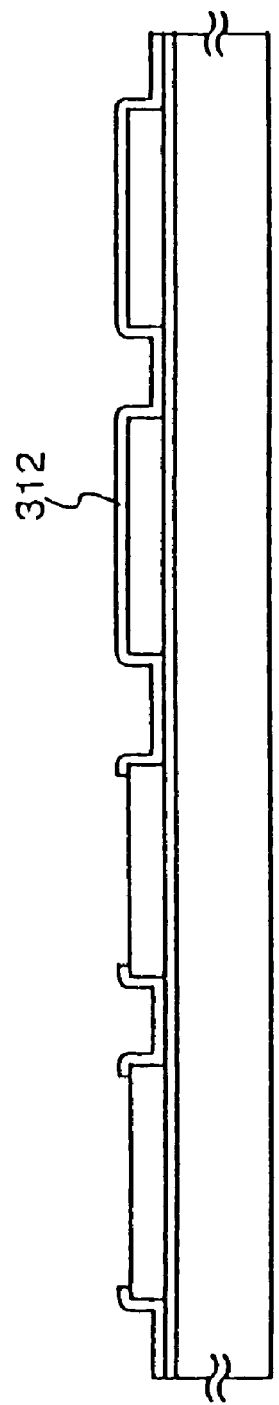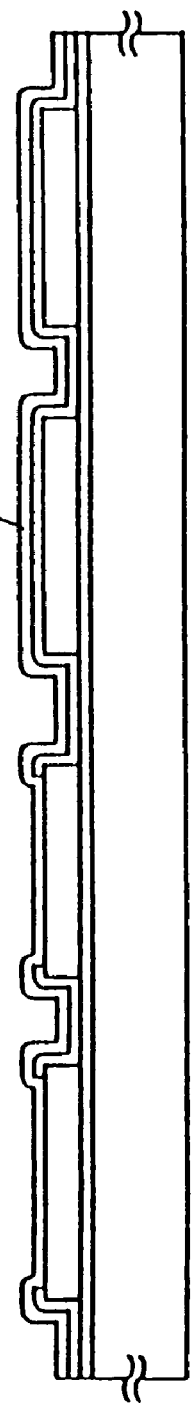

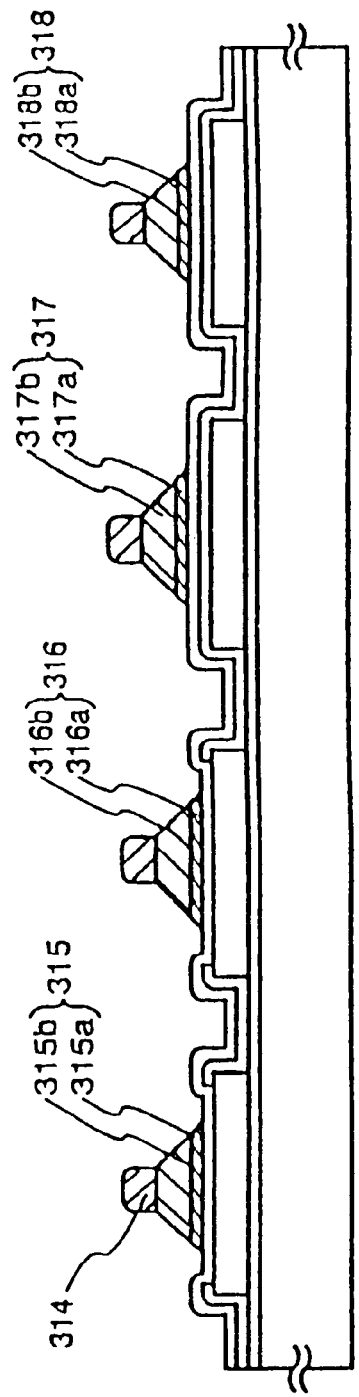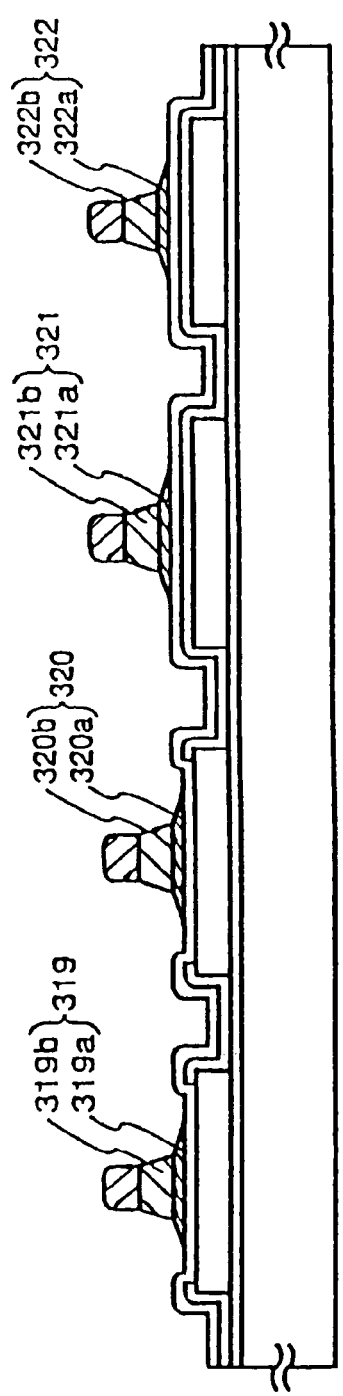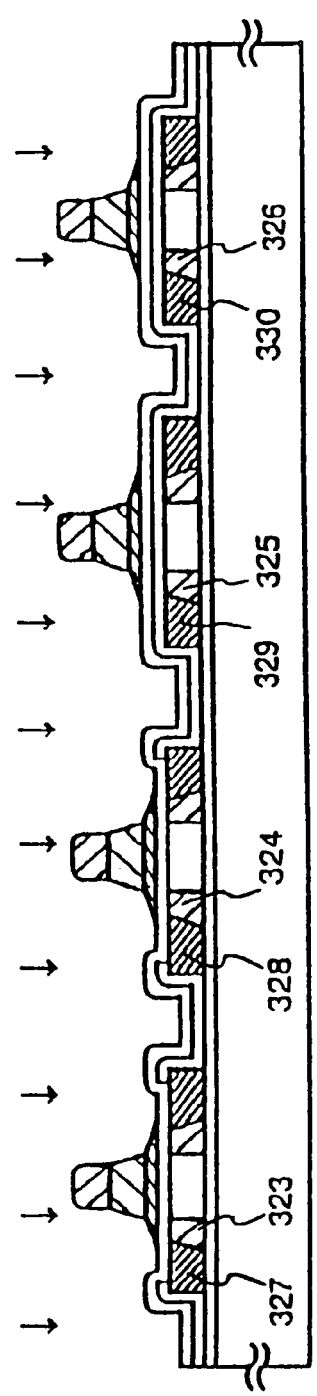

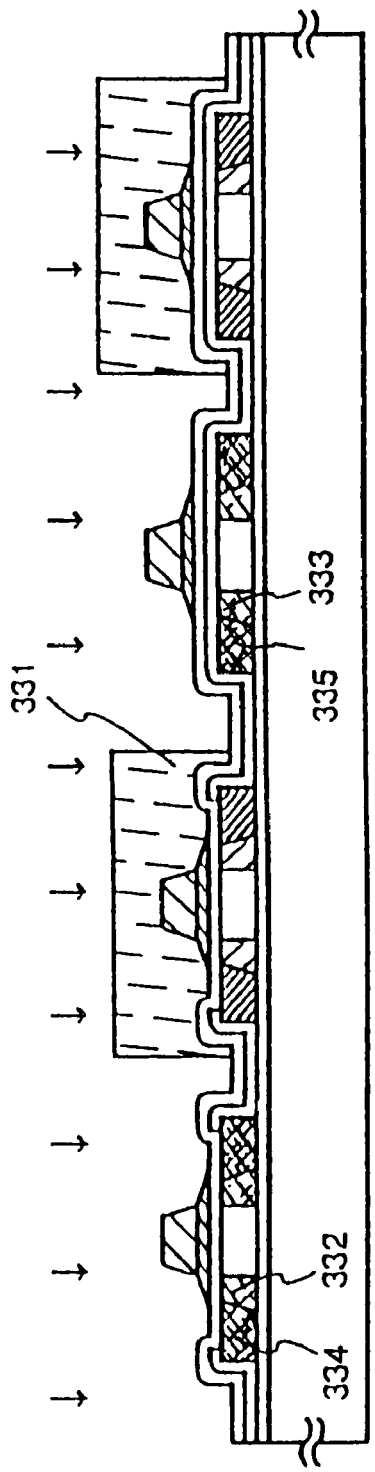
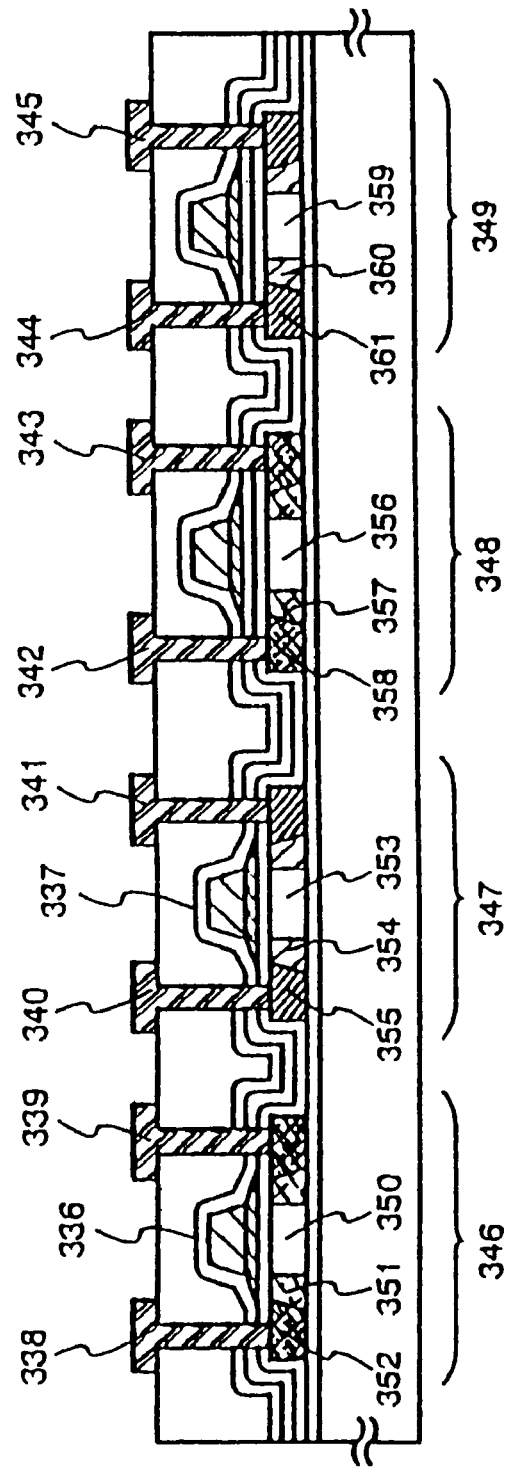
Fig. 7D
Fig. 7E

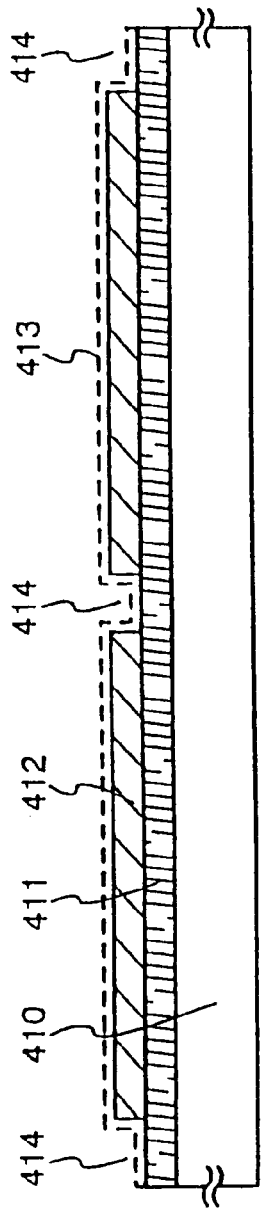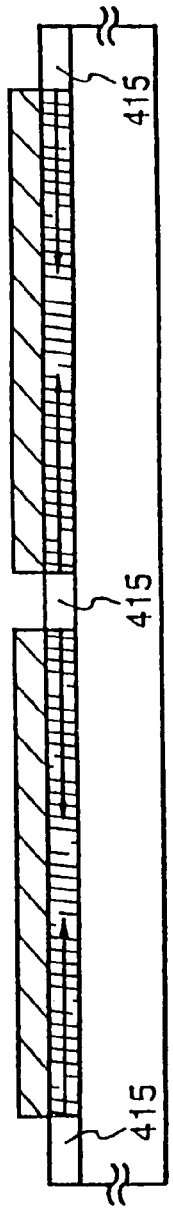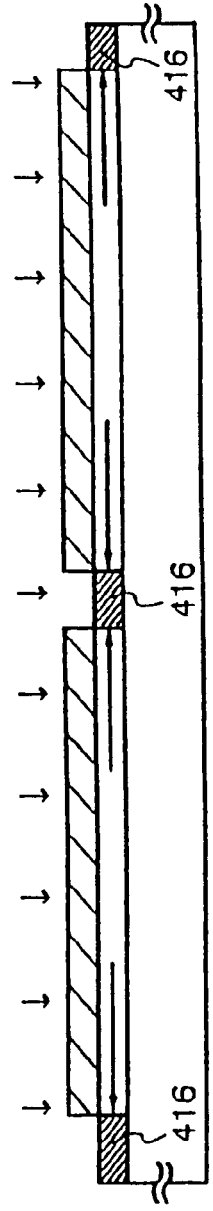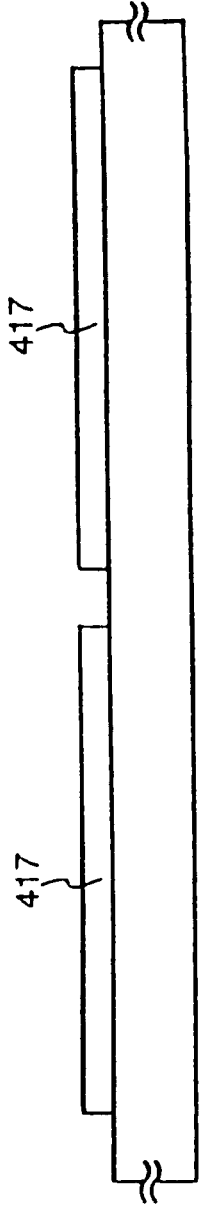

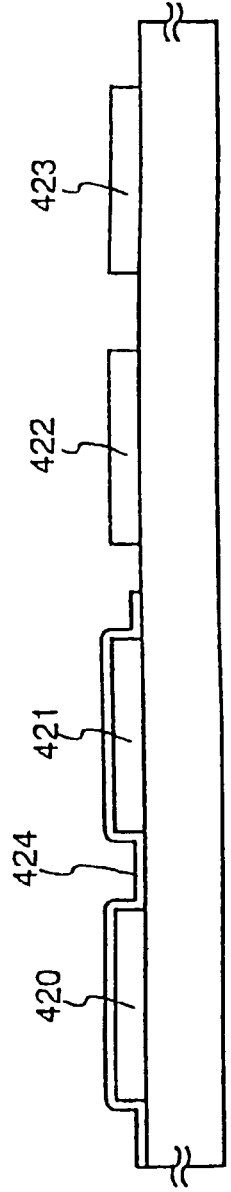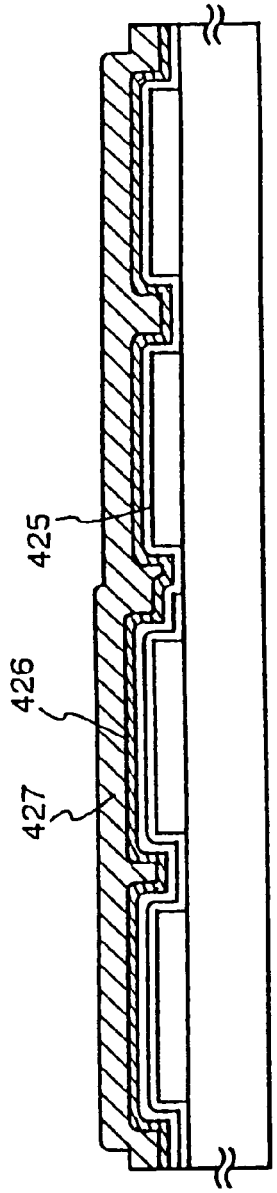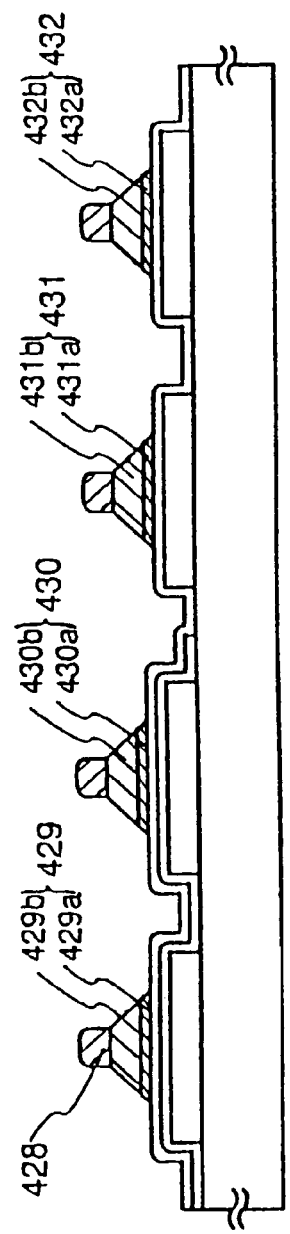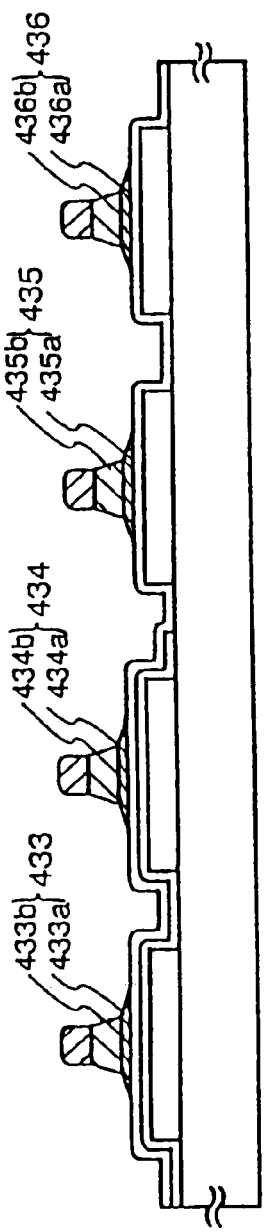

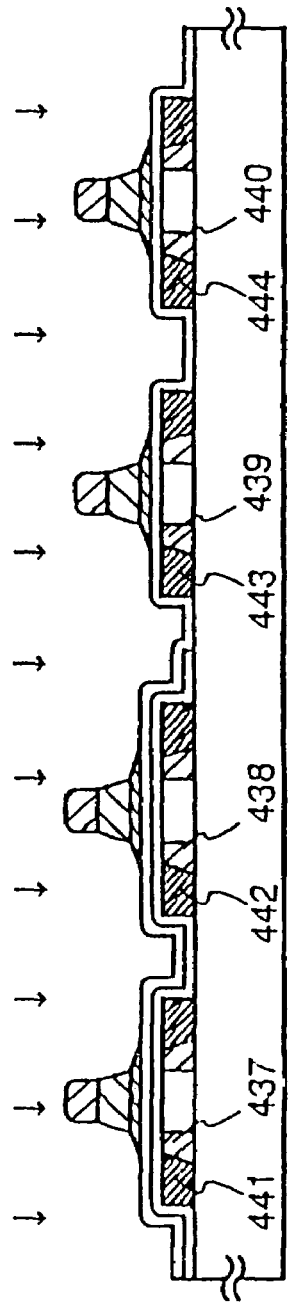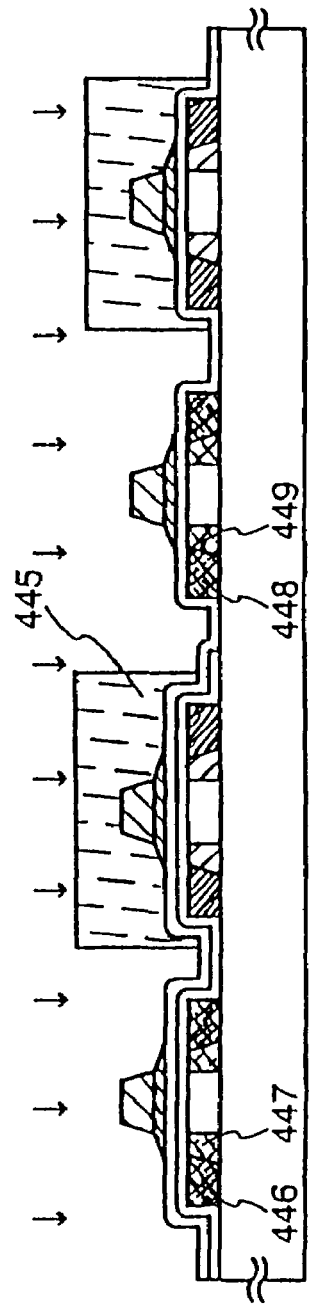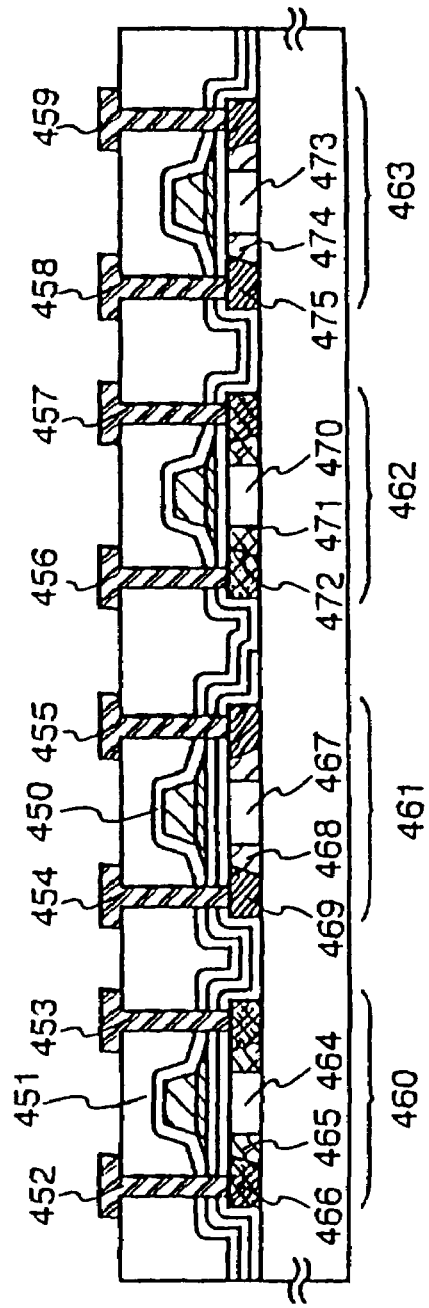

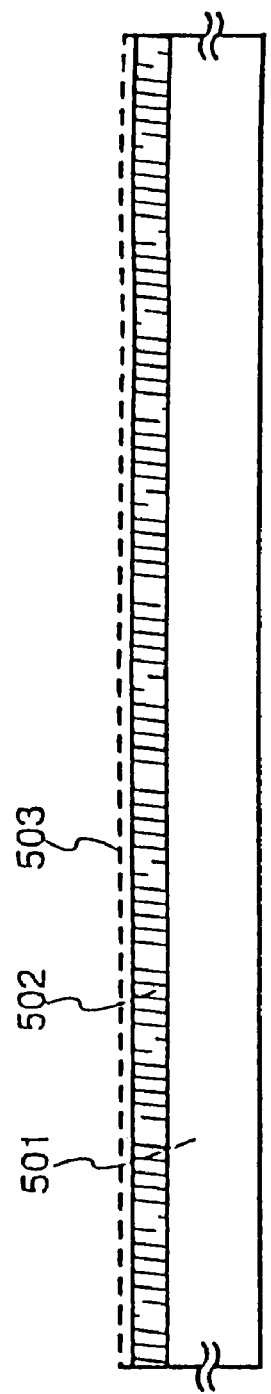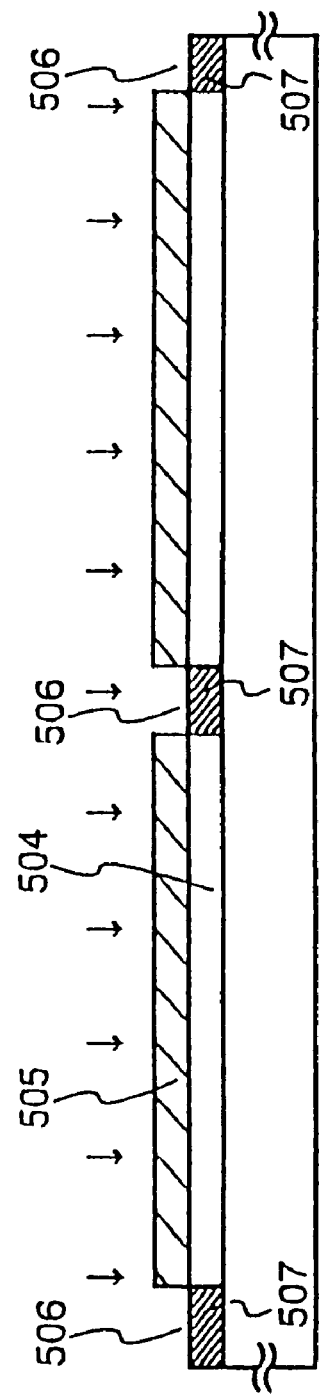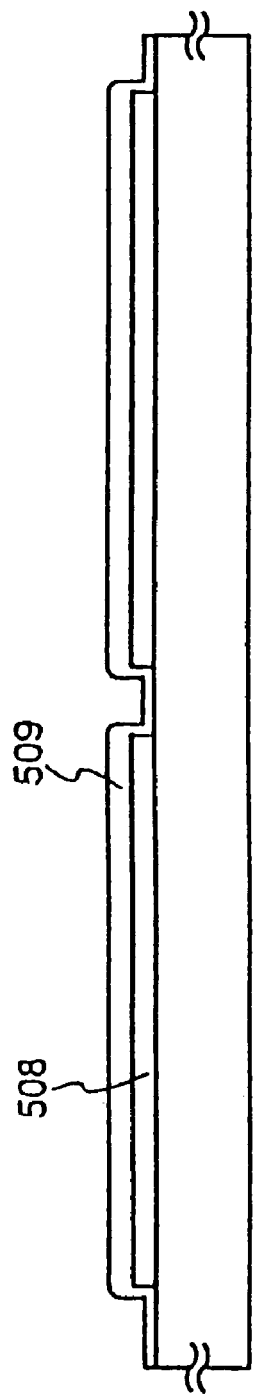

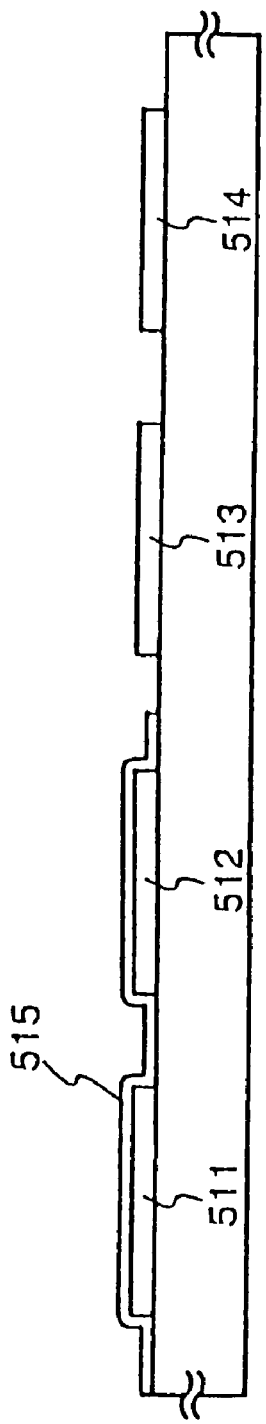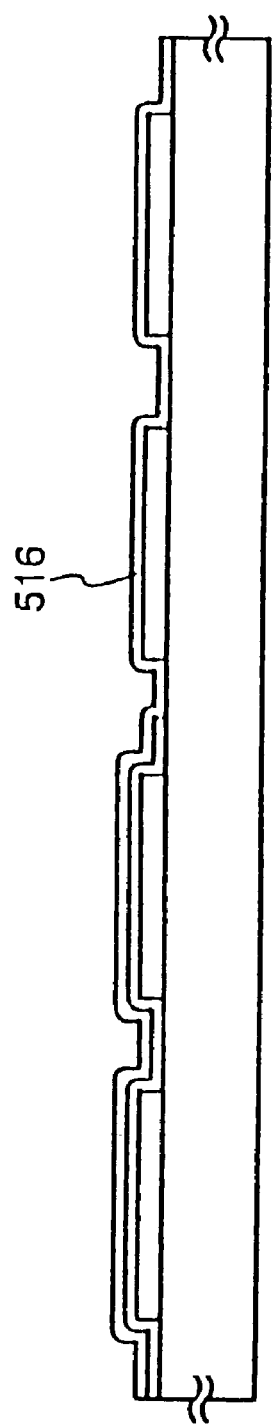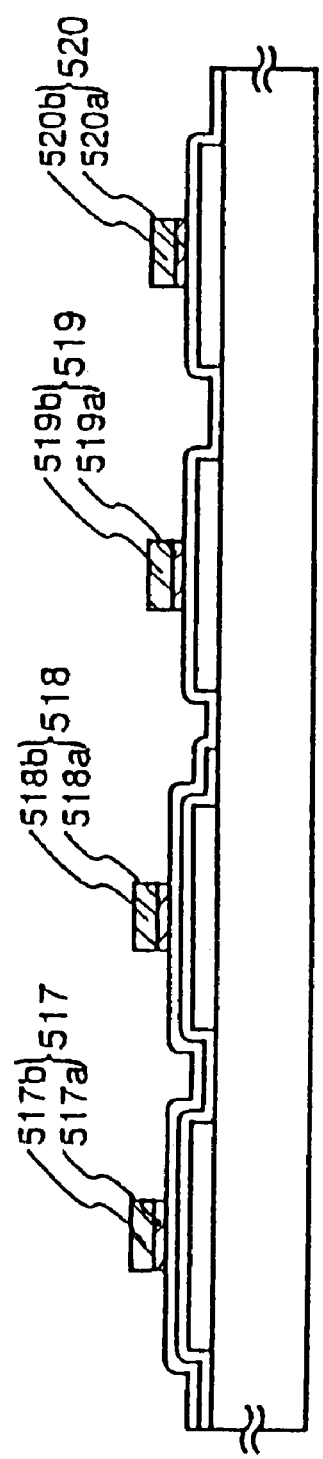

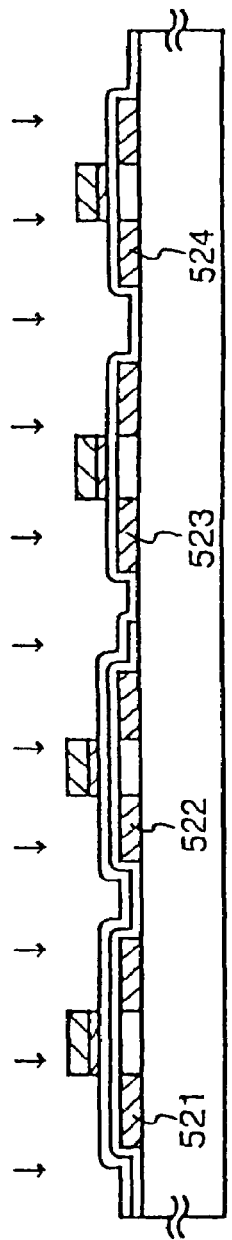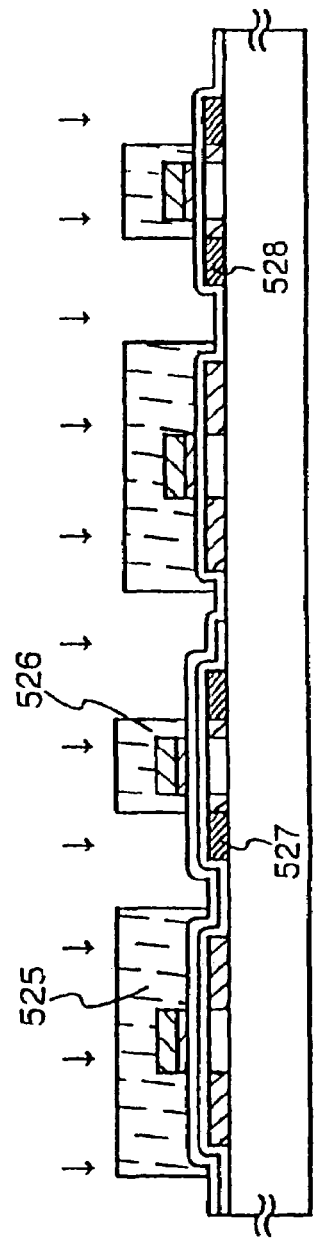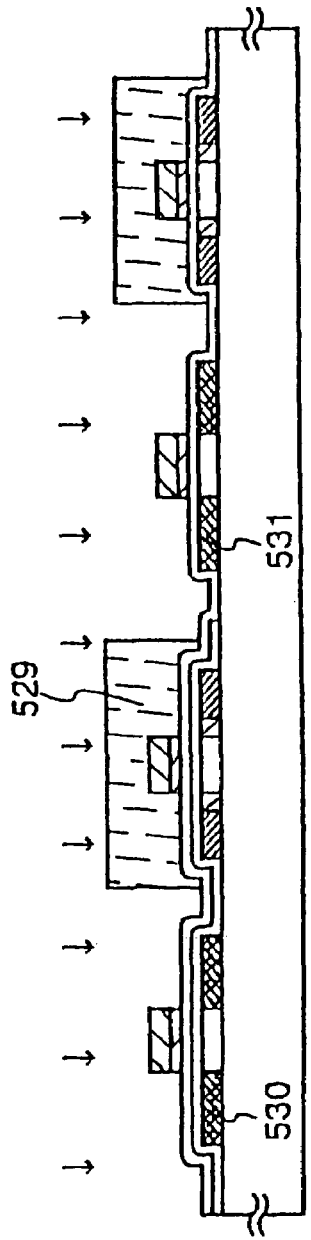

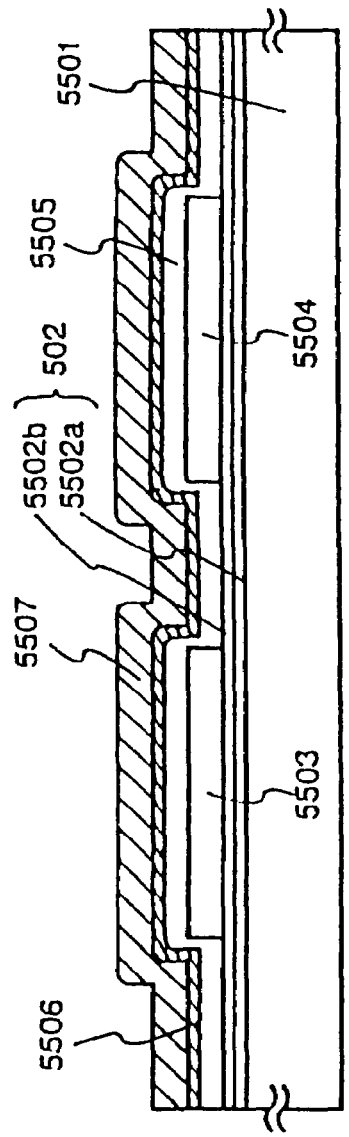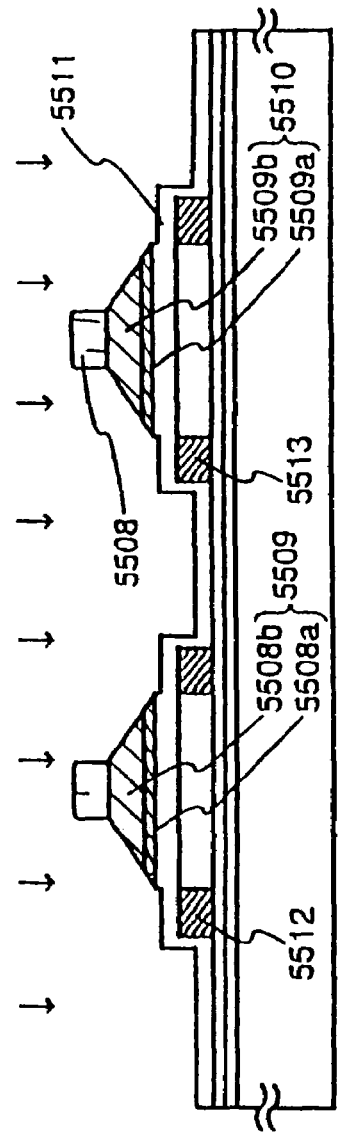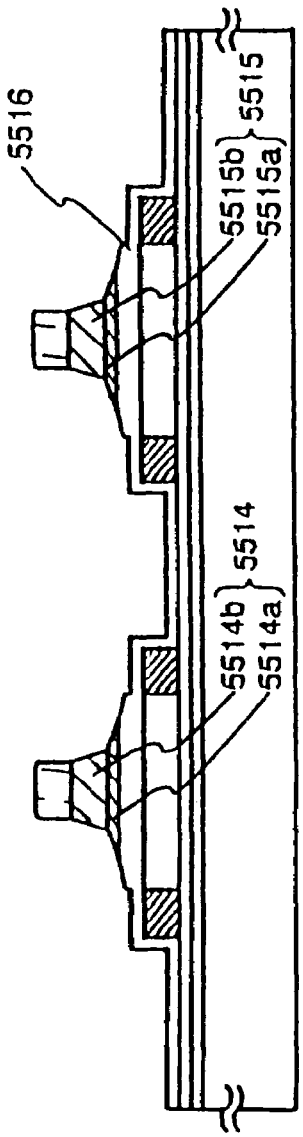

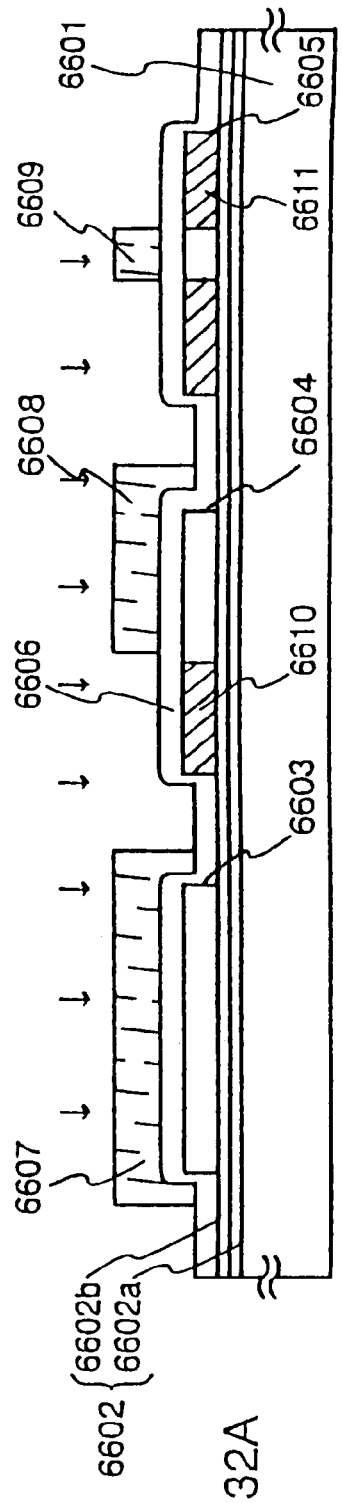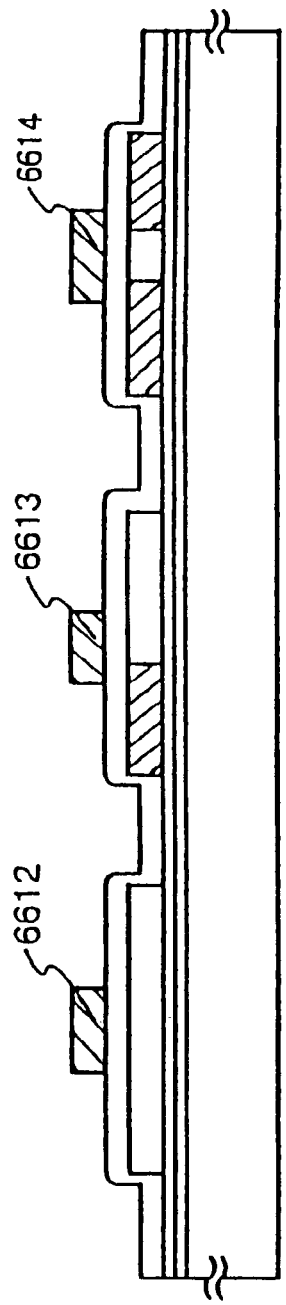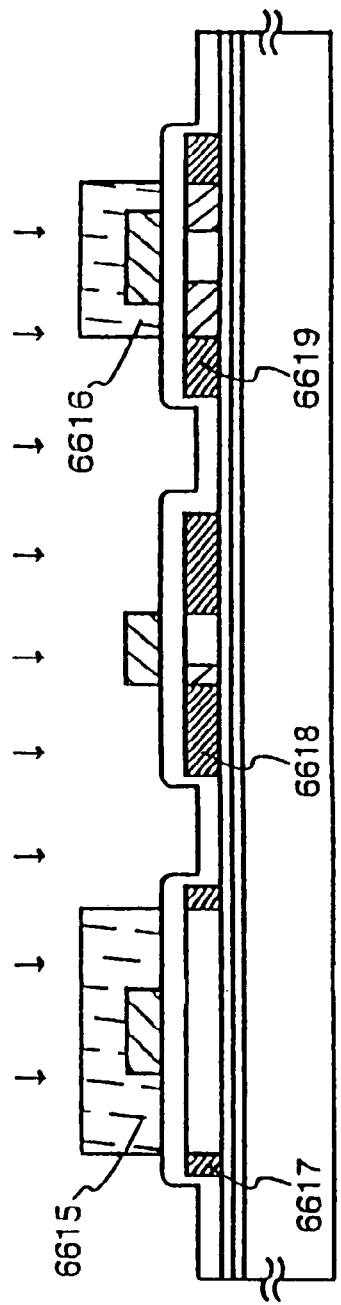

SEMICONDUCTOR DEVICE AND A METHOD OF MANUFACTURING THE SAME

BACKGROUND OF THE INVENTION

1. Field of the Invention

The present invention relates to a semiconductor device having a display portion for displaying information such as images and characters. More particularly, the present invention relates to a structure of a driver circuit for transmitting a signal to each pixels in a pixel region that constitutes a display portion, to a method of manufacturing the same, and to amounting method thereof. Also, the present invention relates to a semiconductor device having a region in which thin film transistors are arranged in matrix, and in particular, to a circuit structure, its manufacturing method and its mounting method, which is formed separately with the above matrix circuit. Note that, throughout this specification, a semiconductor device denotes a general device that can function by utilizing semiconductor characteristics and that the category of semiconductor devices includes electronic equipment.

2. Description of the Related Art

In display devices provided with a liquid crystal layer or a light-emitting layer, an active matrix display, in which thin film transistors (TFTs) are arranged in matrix to form the pixel region, is known as means for forming a screen for displaying an image etc. Representative example thereof is an active matrix liquid crystal display device, and is used for various types of electronic equipment such as a notebook type personal computer (note PC), a mobile computer, a portable telephone, and a liquid crystal television, which is propagating widely. Compared to a CRT, it is possible to make this type of display device lighter weight and thinner, and depending upon its use, there is a demand for giving the screen a large surface area and increasing the density of pixels.

Techniques of forming a channel-forming region of TFT by using an amorphous semiconductor film, typically amorphous silicon, have superior productivity. The amorphous semiconductor film has the characteristic of being able to be formed on a relatively low cost, large surface area substrate, such as barium borosilicate glass and aluminum borosilicate glass. However, the largest value of the electric field effect mobility that can be obtained in a TFT in which the channel forming region is formed from the amorphous silicon film, is only on the order of 1 $cm^2$/Vsec. The TFT can therefore be used as a switching TFT (a pixel TFT) to be formed in the pixel region, but cannot be used for forming a driver circuit to drive it. Consequently, the driver circuit for the pixel TFT uses an IC chip manufactured on a single crystal silicon substrate, and is mounted in the periphery of the pixel region by a TAB (tape automated bonding) method or a COG (chip on glass) method.

The TAB method is a method of mounting an IC chip, in which a wiring is formed on a flexible insulating substrate using such as copper foil, and the IC chip is mounted directly thereon. Further, one edge of the flexible substrate is connected to an input terminal of the display device. On the other hand, the COG method is a method of sticking the IC chip directly onto a wiring pattern along its pattern, which is formed on the substrate of the display device, thereby being connected.

Also, the techniques of mounting the driver circuit on the substrate of the display device, as disclosed in Japanese Patent Application Laid-open Nos. Hei 7-014880 and Hei 11-160734, in which a driver circuit is formed from a TFT, manufactured by a non-single crystal semiconductor material on a substrate such as glass or quartz, and partitioned into strips (such substrates having a driver circuit cut into a strip shape are hereafter referred to as stick drivers), have been disclosed as other methods of mounting the driver circuit.

Whichever method is used, it is preferable to make the region in which the driver circuit is mounted as small as possible on the substrate on which the pixel region is formed, and various designs have been ingeniously made for the method of driver circuit mounting, including the wiring layout.

In such display devices, if the number of pixels increases, then the number of IC chips to be mounted thereon will also inevitably become large. In an RGB full color display XGA panel, the number of terminals on the data line side of the pixel region alone becomes approximately 3000, further, 4800 are necessary for UXGA. The size of the IC chip is limited by the wafer size in the manufacturing process, and the practical size limit of the longer side is on the order of 20 mm. In this IC chip, the pitch of the output terminals depends on a method of forming contact by plating, and is generally 50 to 200 im, and 50 to 80 im if the pitch is made minute, which is said as a limit thereof. Even a pitch of 50 μm is attained, one IC chip can only cover 400 connection terminals. Approximately 8 IC chips are required on only the data line side in the above XGA panel, and 12 IC chips are necessary for the UXGA panel.

A method of manufacturing a long size IC chip has also been considered, but the number of strip shape IC chips which can be cut out from a circular shape silicon wafer is naturally lowered, and therefore the method is not practical. In addition, the silicon wafer itself has a fragile nature, and if a rather long IC chip is manufactured, then the probability of breakage increases. Also, the mounting of the IC chips requires precise placement of the same and reduction in contact resistance of the terminal portion. If the number of IC chips joined to one panel increases, then the probability of defects developing increases, which leads to a fear of reducing the yield in that process. In addition, the temperature coefficient of the silicon which becomes the substrate of the IC chip differs from the temperature coefficient of the glass substrate on which the pixel region is formed, and therefore problems such as warping develop after the two substrates are joined. This becomes a cause of a lowering in the reliability of the element due to the developed mechanical stress, as well as of direct defects such as an increase in the contact resistance.

On the other hand, it is possible to form the driver circuit with a length equal to that of the pixel region by using the stick driver, and also possible to form the driver with one stick driver to be mounted. However, if an area of surface of the circuit portion increases, the number of stick drivers which become defective due to a single point defect increases, and therefore the number which can be cut out of one substrate is reduced, causing a reduction in the process yield.

From the viewpoint of productivity, a method of forming a plurality of stick drivers from TFTs manufactured from a crystalline semiconductor film on a large surface area glass substrate or quartz substrate is considered superior. However, the driving frequency differs between the scanning line side and the data line side, and further, the value of the driving voltage applied also differs. Specifically, the TFTs in the stick driver of the scanning line side must withstand on the order of 30 V, while the driving frequency is equal to or less than 100 KHz, and therefore no high speed operationability is required. A voltage resistance on the order of 12 V is sufficient for the TFTs in the stick driver of the data line side, but high speed operation is required such that a driving frequency at 3 V is on the order of 65 MHz. Thus, it is necessary to make the structure of the stick driver and the TFTs within the drivers different in accordance with the different specifications to be required.

SUMMARY OF THE INVENTION

Based on this background, the present invention has an object to provide a method of manufacturing a driver circuit, which is be mounted on a liquid crystal display device or an EL display device, on a glass substrate or a quartz substrate, and to provide a display device in which a driver circuit formed from TFTs which satisfy the operational characteristic required by each circuits, is mounted.

To attain the above-mentioned object of the present invention, is characterized in that, in a display device having a first substrate on which a pixel region is formed, and a second substrate on which an opposing electrode is formed, a driver circuit formed using a TFT having a crystalline semiconductor layer and an input-output terminal dependent on the driver circuit are taken as a single unit to form a plurality of the units on a third substrate, and stick drivers obtained by partitioning the third substrate into separate units are then mounted onto the first substrate.

The structure of each circuit of the stick driver differs between the scanning line side and the data line side, and the thickness of the gate insulating film of the TFT, the channel length, etc. are made different depending upon the required circuit characteristics. For example, a stick driver on the scanning line side, which is composed of a shift register circuit, a level shifter circuit, and a buffer circuit, the TFT of the buffer circuit, which is required to withstand 30 V, has a gate insulating film which is thicker than that of the TFT of the shift register circuit. Also, a stick driver on the data line side, which is composed of a shift register circuit, a latch circuit, a level shifter circuit, and a D/A converter circuit, the thickness of the gate insulating film of the shift register circuit and the latch circuit is made thin, and the channel length is formed shorter than that of the other TFTs in order to drive the stick driver at a high frequency.

Further, means of lowering the frequency of a digital signal input to the stick driver is provided by forming a signal dividing circuit, formed in the data line side which requires a high frequency digital signal input. The load of the TFT of the stick driver is thus reduced, increasing the reliability of the driver circuit. The signal dividing circuit is provided with n input portions and m×n output portions, and by receiving the input signal from each of the n input portion, and by transmitting a corrected digital signal, in which the pulse length of the input digital signal is expanded in time, from the m×n output portions, thereby reducing the frequency of the input digital signal. The corrected digital signal may be expanded in time to several times the length of the input digital signal pulse.

The fundamental concept of the present invention is shown in FIG. 25. A plurality of driver circuits are formed on a first substrate 1001, on which a display region 1002 is formed, and on a third substrate 1006, and stick drivers obtained by cutting the third substrate 1006 into a strip shape or a rectangular shape at each driver circuits, are joined to the first substrate. The structure of the driver circuits differs between the scanning line side and the data line side, but, in any event, a plurality of stick drivers are mounted on each sides. FIG. 25 shows a mode of mounting stick drivers 1003, 1004 and stick drivers 1007, 1008, on which the scanning line driver circuit and the data line driver circuit are formed thereon, respectively.

From the point of view of increasing productivity, the stick driver is suitable in that plural ones are built on the large surface area of the third substrate. For example, the large surface area substrate with dimensions of 300×400 mm or 550×650 mm is used to form a plurality of circuit patterns thereon, which makes the driver circuit portion and the input-output terminal to be one unit, and then finally partitioned to obtain the stick drivers. In this case, the length of the shorter side of the stick driver is set from 1 to 6 mm, and the length of the longer side is made within 10 to 60 mm.

To form a circuit pattern with a sub-micron design rule, it is suitable to employ a stepper method for its exposing. Applying stepper method to exposing a square region having one side 30 to 60 mm can be exposed at once, though it depends on its optical system. Therefore, regarding the size of the stick driver, it is desirable that, in particular, the length of the longer side of the stick driver is set so as to adjust the exposing region.

In partitioning to such size, a method of forming an outline on the surface of the glass substrate by utilizing an instrument such as a diamond tip, and then acting with an external force to break along the outline, can be performed. A machine for performing this type of process is referred to as a glass scriber, and the working width of the edge must be not less than 100 µm, and it is necessary to have a margin of a 100 to 500 µm. Further, there is also an error of ±100 µm in the positional alignment precision of markers formed on the substrate. Therefore, it is necessary to have a margin of 1 to 5 mm in order to cut out stick drivers having a short side length of 2 mm using the glass scriber, and therefore there is a limit on how many stick devices can be taken from one substrate. On the other hand, a dicing device using a blade dicing method of cutting a silicon wafer into several dies has a blade width of 0.02 to 0.05 mm, and even considering the positional alignment precision, the substrate can be partitioned at a precision equal to or less than 100 µm.

Consequently, a method of effectively taking out stick drivers from one substrate is a method of dividing into a processing region for cutting by the low working precision glass scriber, and into a processing region for cutting by the high working precision dicing device. Specifically, a group is made from a region having a length of 100 to 200 mm on a side, and a plurality of stick drivers having a short side length of 1 to 6 mm are placed within the group. The partitioning between groups is then performed using the glass scriber, and the dicing device is used in order to cut out the stick drivers from the partitioned groups.

Further, in the stick drivers on the data line side, a channel length of TFT to be formed is set from 0.3 to 1 µm, and in addition, in order to form the required circuits within the limited surface area as described above, the stick drivers are formed with a design rule that is smaller than that of the stick drivers on the scanning line side. A technique of exposure using a stepper method is employed as a preferable method.

As described above, according to the present invention, there is provided a semiconductor device, in which a plurality of scanning lines and a plurality of data lines are provided so as to intersect with each other via an insulating layer, the semiconductor device comprising: a first substrate having a pixel region on which thin film transistors having an amorphous semiconductor are arranged in correspondence with the intersecting portion; a second substrate on which an opposing electrode corresponding to the pixel region is formed; a third substrate made from glass or quartz, formed in a region external to the pixel region of the first substrate, and having a driver circuit formed from a plurality of thin film transistors having a crystalline semiconductor; and a liquid crystal layer sandwiched between the first substrate and the second substrate, characterized in that: the third substrates are formed in plural; and the plurality of thin film transistors include a first thin film transistor formed from a first gate insulating film and a second thin film transistor formed from a second gate insulating film.

Further, a method of manufacturing a semiconductor device according to the present invention is characterized by comprising: a first step of forming a pixel region, on a first substrate, on which a semiconductor device is provided, in which a plurality of scanning lines and a plurality of data lines are provided so as to intersect with each other via an insulating layer, and thin film transistors having an amorphous semiconductor are arranged in correspondence with the intersecting portion; a second step of forming an opposing electrode that corresponds to the pixel region on a second substrate; a third step of joining together the first substrate and the second substrate, while sandwiching a liquid crystal layer in between; a fourth step of forming, on a third substrate, a plurality of units containing as one unit a driver circuit formed from thin film transistors having a crystalline semiconductor, and an input terminal and an output terminal depend on the driver circuit; a fifth step of partitioning the plurality of driver circuits formed on the third substrate into each pieces to form a stick shape substrate; a sixth step of electrically connecting the stick shape substrate and a periphery of the pixel region of the first substrate by joining together the output terminals of the driver circuit with the plurality of scanning lines or data lines in the pixel region so as to correspond with each other in a plurality of locations, characterized in that the fourth step contains a step of forming a first thickness gate insulating film, and a step of forming a second thickness gate insulating film.

BRIEF DESCRIPTION OF THE DRAWINGS

In the accompanying drawings:

FIGS. 6A to 6F are cross-sectional drawings explaining the process of manufacturing a driver circuit formed on the stick driver;

FIGS. 7A to 7E are cross-sectional drawings explaining the process of manufacturing a driver circuit formed on the stick driver;

FIGS. 9A to 9D are cross-sectional drawings explaining the process of manufacturing a driver circuit formed on the stick driver;

FIGS. 10A to 10G are cross-sectional drawings explaining the process of manufacturing a driver circuit formed on the stick driver;

FIGS. 12A to 12F are cross-sectional drawings explaining the process of manufacturing a driver circuit formed on the stick driver;

FIGS. 13A to 13E are cross-sectional drawings explaining the process of manufacturing a driver circuit formed on the stick driver;

FIGS. 31A to 31F are cross-sectional drawings explaining a manufacturing process of the driver circuit formed on the stick driver;

FIGS. 32A to 32E are cross-sectional drawings explaining a manufacturing process of the driver circuit formed on the stick driver.

DETAILED DESCRIPTION OF THE PREFERRED EMBODIMENTS

Embodiment Mode 1

Figure 1:
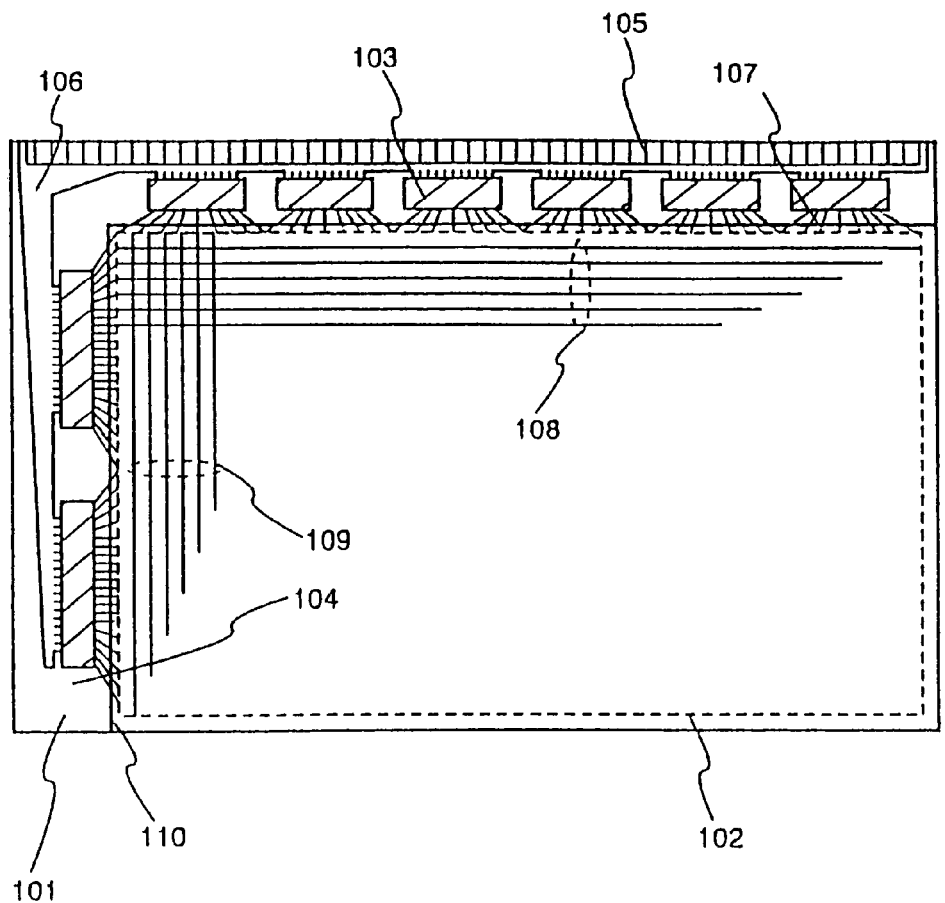
FIG. 1 shows the structure of a display device in which stick drivers are mounted.

FIG. 1 is a diagram showing the structure of a display device of the present invention. A pixel region 102 is formed on a substrate 101. A second substrate 110, on which an opposing electrode is formed, is joined to the region in which the pixel region 102 has been formed, through a liquid crystal layer (not shown in the figure). The interval between the first substrate and the second substrate, namely the thickness of the liquid crystal layer, is determined by spacers, and is set from 3 to 8 µm for a nematic liquid crystal, and between 1 and 4 µm for a sumectic liquid crystal. It is preferable to use a non-alkaline glass such as aluminum borosilicate glass or barium borosilicate glass for the first substrate and the second substrate, and a thickness of 0.3 to 1.1 mm (typically 0.7 mm)

is adopted, and therefore the thickness of the liquid crystal layer can be relatively ignored in outward appearance.

The pixel region 102 forms a matrix in which a scanning line (corresponding to gate wiring) group 108 and a data line group 109 intersect, and a TFT is arranged corresponding to each intersection portion. The structure of the TFTs arranged in this case is not particularly limited, however, a reverse stagger type TFT in which an amorphous silicon layer is used as an active layer is typically used. It is possible to form an amorphous silicon layer by plasma CVD at a temperature equal to or less than 300° C., and even for a non-alkaline glass substrate with external dimensions of 550×650 mm, for example, the film thickness required for forming the TFTs can be formed in several tens of seconds. A characteristic of such a manufacturing technique can be extremely usefully applied to the production of a display device with a large screen.

Stick drivers 103 and 104 in which a driver circuit is formed are mounted in a region external to the pixel region 102. Reference numeral 103 denotes driver circuits on the data line side, and reference numeral 104 denotes driver circuits on the scanning line side, and both are partitioned into a plurality of circuits and mounted. In order to form the pixel region corresponding to a full color RGB, 3072 wirings are required on the data line side, and 768 are required on the scanning line side for the XGA class. Further, for the UXGA class, 4800 and 1200 are required on the data line side and on the scanning line side, respectively. The data lines and scanning lines reaching the number mentioned above are, at the edge portion of the pixel region 102, divided up into several blocks to form lead lines 107 and grouped together corresponding to the output terminal pitch of the stick drivers 103 and 104.

On the other hand, an external input terminal 105 is formed in the edge portion of the substrate 101, and an FPC (flexible printed circuit) for connecting this portion to external circuits is joined. The space between the external input terminal 105 and the stick drivers is joined by connection wirings 106 formed on the substrate 101, which are finally gathered together corresponding to the pitch of the input terminals of the stick drivers.

Figure 2:
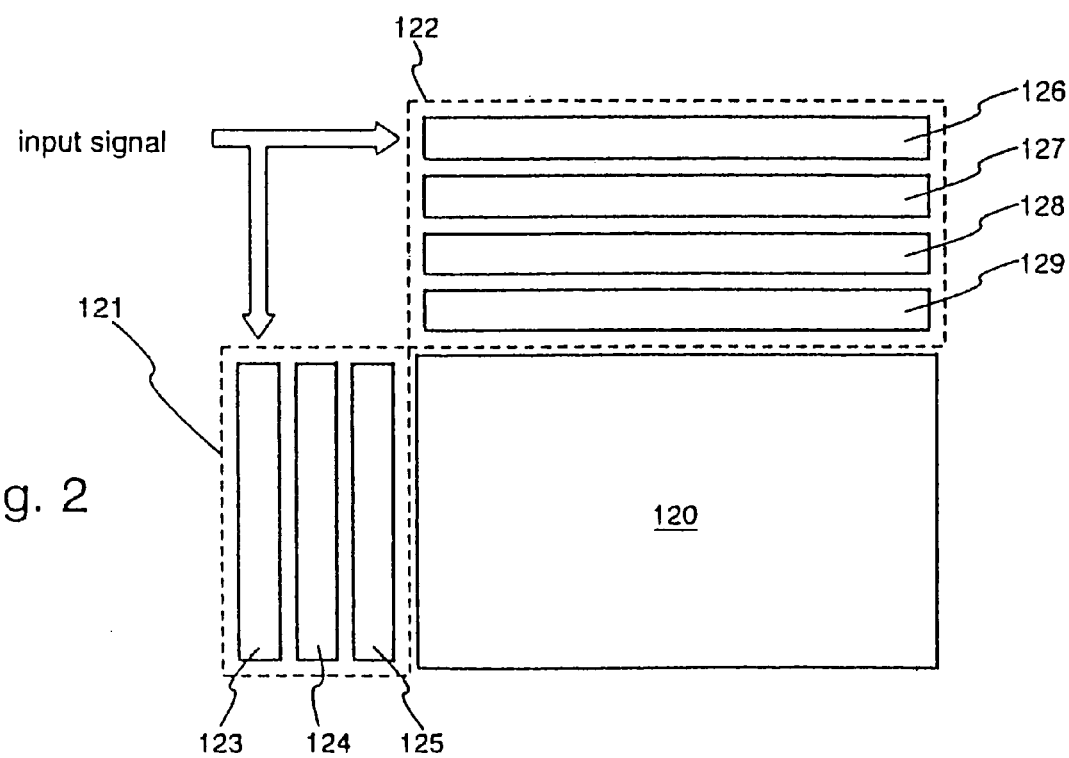
FIG. 2 is a block diagram explaining a circuit structure of a pixel region and the stick drivers.

The circuit structure of the stick drivers differs between on the scanning line side and on the data line side. An example is shown in FIG. 2, showing a state, similar to FIG. 1, in which scanning line side stick drivers 121 and data line side stick drivers 122 are formed outside of a pixel region 120. The structure of the scanning line side stick driver 121 is composed of a shift register circuit 123, a level shifter circuit 124, and a buffer circuit 125. Of those, although the buffer circuit 125 is required to have a voltage resistance on the order of 30 V, the operating frequency is on the order of 100 kHz, and therefore the TFTs forming this circuit are formed with a gate insulating film having a thickness of 150 to 250 nm, and a channel length of 1 to 2 µm, in particular. On the other hand, the data line side stick driver is composed of a shift register circuit 126, a latch circuit 127, a level shifter circuit 128, and a D/A converter circuit 129. The shift register circuit 126 and the latch circuit 127 are driven at a driving voltage of 3 V with a frequency equal to or greater than 50 MHz (for example, 65 MHz), and therefore the TFTs forming this circuit are formed with a gate insulating film having a thickness of 20 to 70 nm, and a channel length of 0.3 to 1 µm, in particular.

Figure 3A:
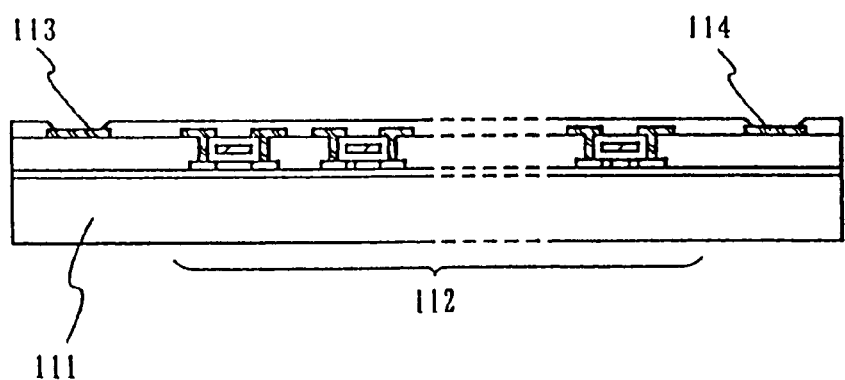
FIGS. 3A and 3B are cross-sectional drawings explaining the structure of the stick driver.

The stick drivers forming these types of driver circuit are formed on a third substrate 111, as shown in FIG. 3A, and a circuit portion 112 formed from TFTs, an input terminal 113, and an output terminal 114 are formed. A channel forming region, a source region, and a drain region of TFTs of the driver circuit portion 112 are formed from a crystalline semiconductor film. It is possible to use a film obtained by crystallizing an amorphous semiconductor film by a laser crystallization method or a thermal crystallization method as the crystalline semiconductor film, and in addition, it is also possible to form the above regions with a single crystal semiconductor layer formed by using an SOI technique.

Figure 3B:
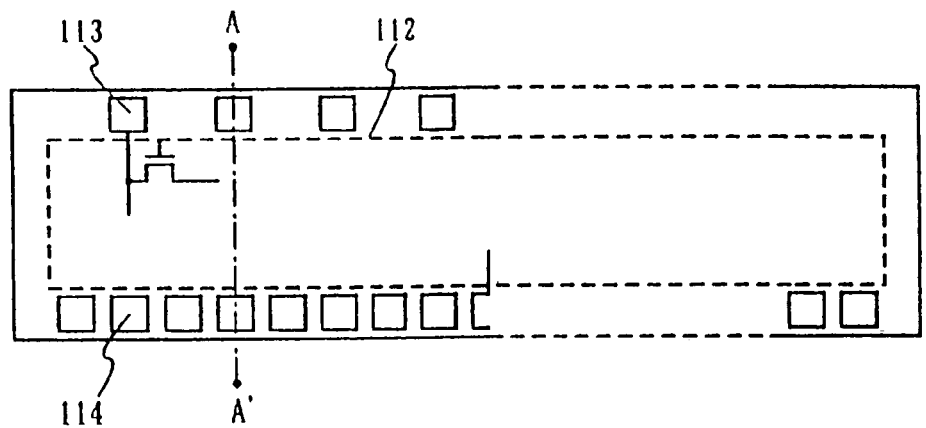

FIG. 3B is a top view of the stick driver, and the cross-sectional diagram of FIG. 3A corresponds to a cut along the line A-A'. A plurality of output terminals for connecting to the data lines or the scanning lines of the pixel region are formed at a pitch of 40 to 100 µm. Further, the input terminals 113 are also similarly formed corresponding to the number required. The input terminals 113 and the output terminals 114 are formed with a square shape or a rectangular shape in which the length of one side is from 30 to 100 µm. As shown in FIG. 6, the stick drivers are not formed in correspondence with the length of one side of the pixel region, but are formed into a rectangular shape or a stripe shape having a long side length of 15 to 80 mm, and a short side length of 1 to 6 mm. If the size of the pixel region, namely the size of the screen, is made large, then as one example, the length of one side of the screen of the size 20 becomes 443 nm. Of course it is possible to form the stick drivers corresponding to this length, but in order to ensure the strength of the substrate, this cannot become a practical shape. Rather, handling a plurality of stick drivers formed with a length of 10 to 60 mm and then divided becomes easy, and the manufacturing yield is also improved.

The superiority of the external dimensions of the stick driver over an IC chip is in the length of the long side, and from the viewpoint of productivity, when a minute pattern to which a sub-micron design rule is applied is exposed with a stepper, it is not suitable to form the IC chip at length of 10 to 60 mm. Even if it is not impossible, the number of IC chips, which can be taken out of a circular silicon wafer, is reduced, and therefore it cannot be practically selected. On the other hand, the driver circuits of the stick drivers are formed on a glass substrate, and as there is no limitation on what shape of substrate is used as a parent, there is no loss of productivity. By thus using the stick driver formed with a long side length of 15 to 80 mm, the corresponding number required for mounting in the pixel region is less than for a case of using IC chips, and therefore the manufacturing yield can be increased.

Figure 4A:
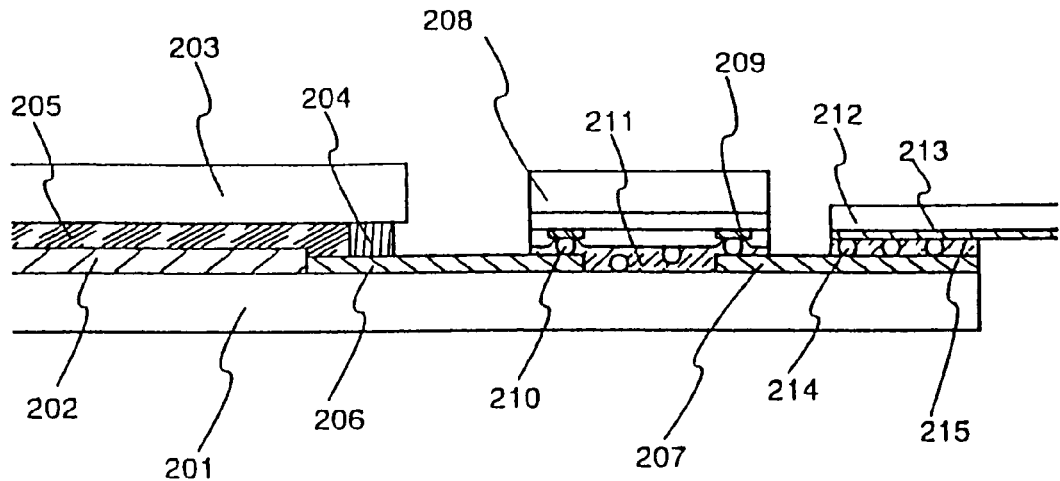
FIGS. 4A and 4B are diagrams explaining an example of a method of mounting a stick driver.
Figure 4B:
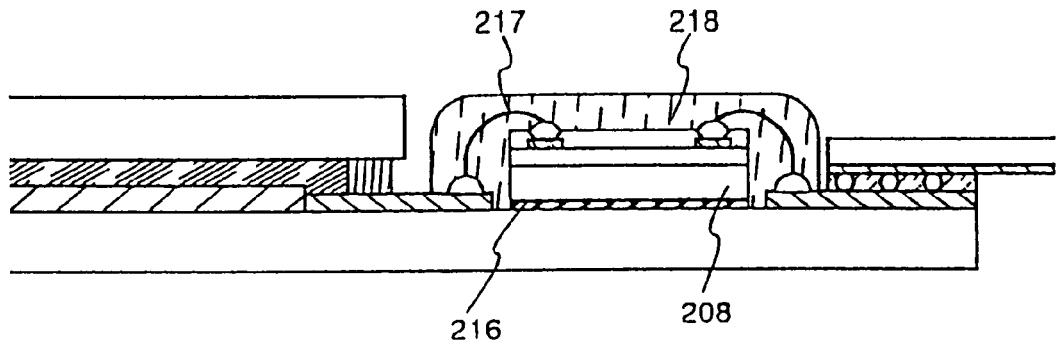

The method of mounting the stick drivers, manufactured using the third substrate, on the first substrate is similar to the COG method, and a method such as a connection method using an anisotropic conductive material or a wire bonding method can be employed. One such example is shown in FIGS. 4A and 4B. FIG. 4A shows an example of a stick driver 208 mounted in a first substrate 201 using an anisotropic conductive material. A pixel region 202, a lead line 206, and a connection wiring and input-output terminal 207 are formed on the first substrate 201. A second substrate is bonded to the first substrate 201 by a sealing material 204, and a liquid crystal layer 205 is formed in between. Further, an FPC 212 is bonded to one end of the connection wiring and input-output terminal 207 by the anisotropic conductive material. The anisotropic conductive material 215 is made from a resin 215 and a conductive particle 214 having a diameter of several tens to several hundreds of µm and having a surface plated by a material such as Au. The connection wiring and input-output terminal 207 and a wiring 213 formed in the FPC 212 are electrically connected through the conductive particle 214. The stick driver 208 is also bonded to the first substrate by an anisotropic conductive material, and an input-output terminal 209 and the lead line 206 or the connection wiring and input-output terminal 207, provided in the stick driver 208, are electrically connected through a conductive particle 210 mixed throughout a resin 211.

Figure 5A:
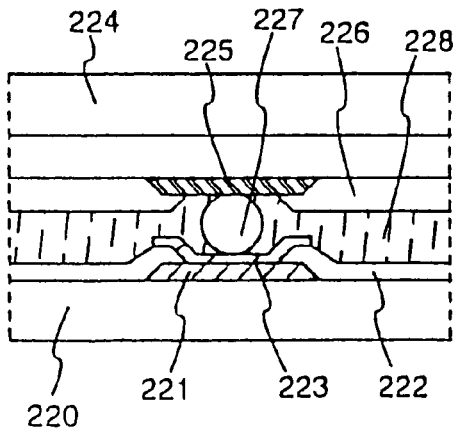
FIGS. 5A and 5B are diagrams explaining the example of a method of mounting the stick driver.

FIG. 5A is a cross-sectional diagram of a portion for explaining in detail a method of mounting a stick driver 224 in this way. It is preferable to form an input-output terminal 225 in the stick driver 224, and to form a protective insulating film 226 in the periphery portion. A first conductive layer 221, a second conductive layer 223, and an insulating layer 222 are formed on a first substrate 220, as shown in the figure, and a lead line or a connection wiring is formed from the first conductive layer 221 and the second conductive layer 223. The conductive layers and the insulating layer formed on the first substrate are formed by the same processes as the pixel TFT of the pixel region. For example, when the pixel TFT is formed into a reverse stagger type, the first conductive layer 221 is formed in the same layer as the gate electrode, and is formed from a material such as Ta, Cr, Ti, or Al. Normally, a gate insulating film is formed on a gate electrode, and the insulating layer 222 is formed from the same layer as the gate insulating film. The second conductive layer 223 formed overlapping the first conductive layer 221 is formed from the same transparent conductive film as the pixel electrode is formed from, and is formed in order to have a good contact with a conductive particle 227. By suitably setting the size and the density of the conductive particle 227 mixed into a resin 228, with this mode, it is possible to form a structure in which the stick driver and the first substrate are electrically connected.

Figure 5B:
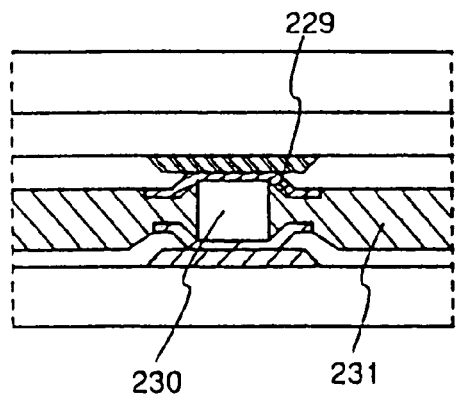

FIG. 5B is an example of the COG method using a compression force of the resin, and a barrier layer 229 is formed from a material such as Ta or Ti on the stick driver side, and approximately 20 μm size Au formed by a process such as electroless plating is made into a bump 230. A light hardened insulating resin 231 intervenes between the stick driver and the first substrate, and the compression force of the resin hardened by light hardening is utilized for pressure welding between the electrodes, thereby forming an electrical connection.

Further, the stick driver may be fixed to the first substrate by an adhesive material 216, as shown in FIG. 4B, and the input-output terminal of the stick driver may be connected to the lead line or the connection wiring by an Au wire 217. This is then sealed by a resin 218.

The method of mounting the stick driver is not limited to the methods based on FIGS. 4A and 4B, and FIGS. 5A and 5B, and it is possible to use a known method not explained here, such as the COG method, the wire bonding method, or the TAB method.

By making the thickness of the stick driver the same as the thickness of the second substrate, on which the opposing electrode is formed, the height between both becomes nearly the same, and this can contribute to making the entire display device thinner. Further, by producing each of the substrates by the same material, even if temperature changes develop in the liquid crystal display device, a thermal stress is not generated, and there is no loss of characteristics in the circuits formed from the TFTs. In addition, as shown in this embodiment mode, by mounting the driver circuits by using stick drivers having a longer size than IC chips, the required number corresponding to one pixel region can be reduced.

Embodiment Mode 2

A method of manufacturing a TFT suitably applied mainly in a stick driver of a scanning line side is explained in this embodiment mode. Circuits such as a shift register circuit and a buffer circuit are formed in the stick driver on the scanning line side. The shift register circuit is assumed to be driven at 3 to 5 V, and the buffer circuit is assumed to be driven at 33 V. The TFT structuring the buffer circuit is required to have high voltage resistance, and therefore it is necessary for the film thickness of a gate insulating film to be thicker than that of other circuit TFTs. A manufacturing method thereof will be described with reference to FIGS. 6A to 6F and FIGS. 7A to 7E.

Figure 6A:
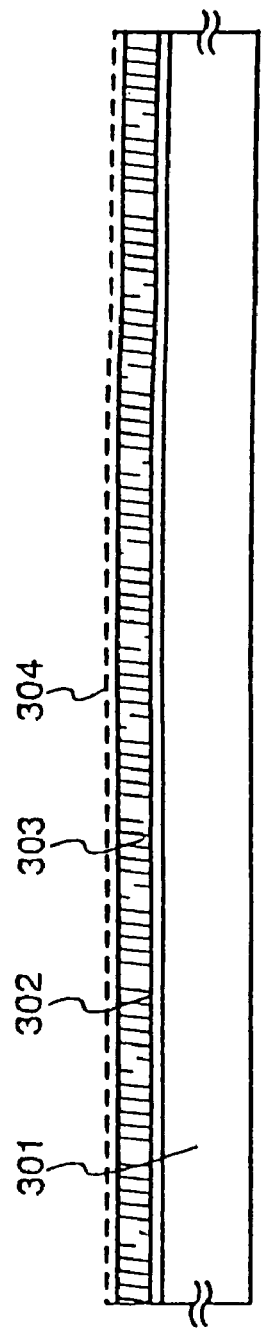

In FIG. 6A, a substrate such as a glass substrate, such as barium borosilicate glass or aluminum borosilicate glass, typically Corning Corp. #7059 or #1737, is used as a substrate 301. This type of glass substrate shrinks slightly due to the heating temperature, and if heat treatment processing is implemented at a temperature, which is from 500 to 650° C. lower than the glass distortion point, then the substrate shrinkage ratio can be reduced.

A blocking layer 302 is formed in order to prevent diffusion into a semiconductor layer of materials such as alkaline metals contained in microscopic amounts within the substrate 301, and is formed from an insulating film such as a silicon oxide film, a silicon nitride film, or a oxynitride silicon film. Further, in order to stabilize the threshold voltage ($V_{th}$) of the TFT, it is preferable to make the stress of the blocking layer into a tensile stress. The stress can be controlled by the manufacturing conditions of the above insulating film. With that as a purpose, the blocking layer is not limited to a single layer, and may also be formed by laminating a plurality of insulating films having different compositions. For example, the blocking layer can be formed by laminating a 10 to 200 nm (preferable between 50 and 100 nm) thick oxynitride silicon film manufactured by plasma CVD from $SiH_4$, $NH_3$, and $N_2O$, and a 50 to 200 nm (preferably from 100 to 150 nm) thick oxynitride silicon film manufactured similarly by plasma CVD using $SiH_4$ and $N_2O$.

A semiconductor layer 303 having an amorphous structure is formed with a thickness of 25 to 100 nm. Typical examples of semiconductor films having an amorphous structure include an amorphous silicon (a-Si) film, an amorphous silicon germanium (a-SiGe) film, an amorphous silicon carbide (a-SiC) film, and an amorphous silicon tin (a-SiSn) film, and any of these can be applied. These semiconductor films having an amorphous structure may be formed by a method such as plasma CVD, sputtering, or reduced pressure CVD, and are formed so as to contain hydrogen on the order of 0.1 to 40 atomic %. One suitable example is an amorphous silicon film manufactured by plasma CVD and made from $SiH_4$ or from $SiH_4$ and $H_2$, with a film thickness of 55 nm. Note that $Si_2H_6$ may be used as a substitute for $SiH_4$.

A catalyst element, which can lower the crystallization temperature of the amorphous semiconductor film, is then added. It is possible to directly inject the catalyst element within the amorphous semiconductor film, and a catalyst element containing layer 304 may also be formed with a thickness of 1 to 5 nm by spin coating, printing, spraying, bar coating, sputtering, or vacuum evaporation. Examples of this type of catalyst element known to be effective with respect to amorphous silicon include nickel (Ni), germanium (Ge), iron (Fe), palladium (Pd), tin (Sn), lead (Pb), cobalt (Co), platinum (Pt), copper (Cu), and gold (Au). In order to form the catalyst element containing layer 304 by spin coating, an aqueous solution containing 1 to 100 ppm (preferably 10 ppm) in terms of weight of the catalytic element is applied with the substrate rotating by a spinner.

Figure 6B:
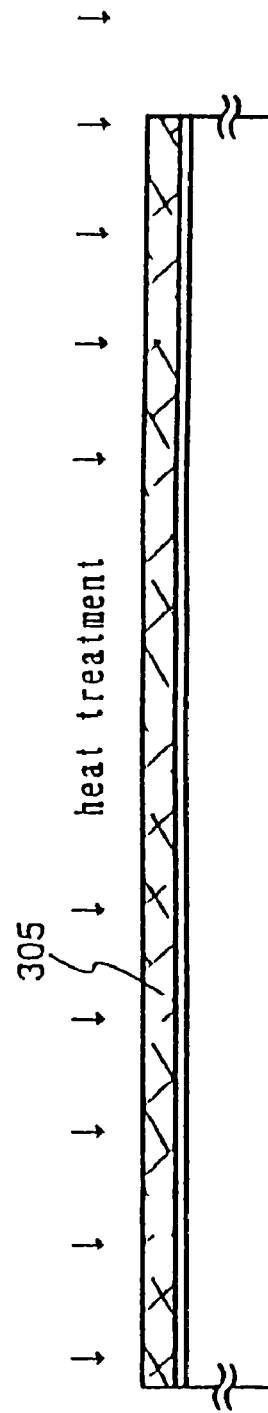

In the crystallization process shown in FIG. 6B, heat treatment is first performed at 400 to 500° C. for approximately 1 hour, reducing the amount of hydrogen contained within the amorphous silicon film to 5 atomic % or less. Heat treatment is then performed for 1 to 8 hours at 550 to 600° C. in a nitrogen atmosphere using an annealing furnace. Heat treatment is ideally performed for 4 hours at 550° C. A crystalline semiconductor film 305 can thus be obtained. A crystalline silicon film having a crystalline structure is formed from the amorphous silicon film by this type of thermal crystallization process.

However, the crystalline semiconductor film 305 manufactured by this thermal crystallization method has localized amorphous regions remaining. In this case, the existence of amorphous components possessing a broad peak at 480 cm$^{-1}$ can be confirmed by plasma spectroscopy. A laser crystallization method is a suitable method for the goal of crystallizing this type of remaining amorphous region.

A laser such as an excimer laser, a YAG laser, a YVO$_4$ laser, a YAlO$_3$ laser, and a YLF laser can be used as a laser light source used in the laser crystallization method. The excimer laser is capable of emitting high output light at a wavelength equal to or less than 400 nm, and therefore can suitably be used for crystallization of a semiconductor film. On the other hand, with solid state lasers such as the YAG laser, the YVO$_4$ laser, the YAlO$_3$ laser, and the YLF laser, the second harmonic (532 nm), the third harmonic (355 nm), or the fourth harmonic (266 nm) is used. Due to the penetration length, heating is from the surface and from the interior of the semiconductor layer when the second harmonic (532 nm) is used, and is from the surface of the semiconductor layer when the third harmonic (355 nm) or the fourth harmonic (266 nm) is used, similar to an excimer laser, and crystallization can be performed.

Figure 6C:
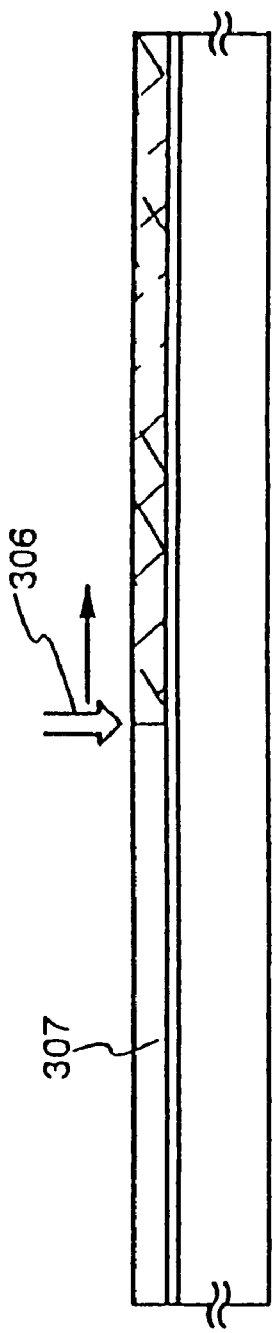

FIG. 6C shows this state, for example: a Nd:YAG laser is used, with a pulse emission frequency set to between 1 and 10 kHz, and a laser energy density from 100 to 500 mJ/cm$^2$ (typically between 100 and 400 mJ/cm$^2$), and a linear shape laser light 306 formed from an optical system containing lenses, such as a cylindrical lens, is then scanned in a direction perpendicular to its longitudinal direction (or, the substrate is moved symmetrically). The line width of the linear shape laser light 306 is set between 100 and 1000 μm, for example 400 μm. By thus jointly using a thermal crystallization method and a laser crystallization method, a crystalline semiconductor film 307 having good crystallinity can be formed.

The crystalline semiconductor film 307 formed as above is suitable as an active layer of a TFT for forming such as a channel forming region, a source region, a drain region, and an LDD region. The crystalline silicon film manufactured by the thermal crystallization method using a catalyst element such as nickel has a structure, when viewed microscopically, of a plurality of needle shape or rod shape crystals gathered together. However, the continuity of adjoining grains is high, and it is expected that almost no dangling bond is formed. Further, the majority of the crystal grains are oriented in the <110> direction. One such reason, it is thought, is that silicide compounds of the catalyst element participate in the crystal growth process when a catalyst element such as nickel is used. It is thought that among the initial nucleation, the (111) face nearly vertical with respect to the surface of the substrate grows preferentially because the film thickness of the semiconductor film is thin at 25 to 100 nm, and therefore the <110> orientation is enhanced in practice.

The crystalline semiconductor film 307 is next formed into island shape semiconductor layers 308 to 311 by an etching process. Four semiconductor layers are shown in FIG. 6D, for convenience. Subsequent explanations assume that the semiconductor layers 308 and 309 are manufactured into TFTs of circuits driven at a low voltage, such as a shift register circuit, and that the semiconductor layers 310 and 311 are manufactured into TFTs of circuits driven at a high voltage, such as a buffer circuit.

In consideration of the driving voltage of the circuits, gate insulating films formed on the semiconductor layers are formed with different film thicknesses, even though for TFTs formed on the same substrate. Therefore a two stage film deposition process is necessary. First, a gate insulating film first layer 312 is formed with a thickness of 40 to 200 nm (preferably between 70 and 90 nm). The gate insulating film first layer on the semiconductor layers 308 and 309 is then removed by selectively etching, thereby forming the state of FIG. 6E.

Continuing, a gate insulating film second layer 313 is formed similarly, as shown in FIG. 6F. As a result, when forming each of the gate insulating film first layer 312 and the gate insulating film second layer 313 with a thickness of 80 nm, the thickness of the gate insulating film on the semiconductor layers 308 and 309 can become 80 nm, and the thickness of the gate insulating film can become 160 nm on the semiconductor layers 310 and 311.

The gate insulating film is formed from an insulating film containing silicon by using plasma CVD or sputtering. A oxynitride silicon film manufactured by plasma CVD from a gas mixture of SiH$_4$ and N$_2$O is a suitable material as the gate insulating film. Of course, the gate insulating film is not limited to this type of oxynitride silicon film, and insulating films containing other silicon may also be formed. When applying a silicon oxide film, it can be formed by plasma CVD in which TEOS (tetraethyl ortho silicate) and O$_2$ are mixed, with a reaction pressure of 40 Pa, and a substrate temperature set from 300 to 400° C., and discharge at a high frequency (13.56 MHz) power density of 0.5 to 0.8 W/cm$^2$. Good characteristics as the gate insulating film can be obtained in the silicon oxide film thus manufactured by subsequent thermal annealing at 400 to 500° C.

A conductive film for forming a gate electrode is formed on the gate insulating film thus manufactured. The gate electrode of the TFT shown in this embodiment mode is formed by laminating two types of conductive materials having a selectivity of 5 to 20 or greater (preferably between 10 and 13) by dry etching. For example, the gate electrode is formed from a first conductive film made from a nitride compound conductive material and a second conductive film made from a heat resistant conductive material which obtains tolerance to 400 to 650° C. heat treatment. As a specific example, the first conductive film is formed from a material selected from the group consisting of tantalum nitride (TaN), titanium nitride (TiN), and tungsten nitride (WN), while the second conductive film is formed from an alloy material comprising one or plural members selected from the group consisting of tantalum (Ta), titanium (Ti), tungsten (W), and molybdenum (Mo). Of course, materials, which can be applied to the gate electrode, are not limited to those materials recorded here, and provided that a conductive material combination fulfills the above specifications, it is also possible to select other conductive materials. Note that the selectivity means here a ratio of the etching rate of the second conductive film to that of the first conductive film.

Although not shown in the figures, the first conductive film is formed from a TaN film having a 50 to 100 nm thickness, and the second conductive film is formed from a W film with a thickness of 100 to 400 nm in this embodiment mode. The TaN film is formed by sputtering using a Ta target and a gas mixture of Ar and nitrogen. The W film is formed by sputtering with a W target. In addition, the W film can be formed by thermal CVD using tungsten hexafluoride (WF$_6$). Whatever is used, it is necessary to make the material have low resistance for use as the gate electrode. By making the crystal grains large, it is possible to make the W film have lower resistivity, and for cases when there are many impurity elements such as oxygen within the W film, crystallization is inhibited and the resistance becomes higher. By forming the W film using a target having a purity of 99.9999%, and in addition, taking sufficient consideration so that there is no mixing in of impurities within the gas phase during film deposition, a resistivity of 9 to 20 μΩcm can be realized.

The gate electrode is formed by a two stage etching process. A mask 314 is formed from resist, as shown in FIG. 7A, and a first etching process is performed. There are no limitations placed on the etching process, but ideally an ICP (inductively coupled plasma) etching device is used, and etching is performed using $CF_4$ and $Cl_2$ as etching gasses, at a pressure of 0.5 to 2 Pa, preferably at 1 Pa, with an RF (13.56 MHz) input of 500 W from a coil shape electrode, performing plasma generation. A 100 W RF (13.56 MHz) power is input to the substrate side (sample stage) as well, substantially applying a negative self bias voltage. When $CF_4$ and $Cl_2$ are mixed, the W film and the Ta film can be etched at approximately the same rate.

In the first etching process, processing is performed so that edge portions of the first conductive film and the second conductive film are made into a tapered shape. The angle of the tapered portion is set from 15 to 45°. However, in order to etch without any residue remaining on the gate insulating film, an over-etching process, in which the etching time is increased by a ratio on the order of 10 to 20%, may be performed. The selectivity of the oxynitride silicon film is 2 to 4 (typically 3) with respect to the W film, and therefore the oxynitride silicon film is etched on the exposed surface by approximately 20 to 50 nm due to the over-etching process. First shape conductive layers 315 to 318 (first conductive layers 315a to 318b and second conductive layers 315b to 318b) are thus formed from the first conductive film and the second conductive film by the first etching process.

A second etching process is performed next, as shown in FIG. 7B. The ICP etching device is used, and $CF_4$, $Cl_2$, and $O_2$ are mixed as the etching gas, and a plasma is generated at a pressure of 1 Pa with 500 W RF power (13.56 MHz) supplied to a coil type electrode. The substrate side (sample stage) is supplied with 50 W RF (13.56 MHz) power, which, when compared to the first etching process, becomes a lower self-bias voltage. The W film is anisotropically etched in accordance with these conditions, and the Ta film is anisotropically etched at a slower etching rate, forming second shape conductive films 319 to 322 (first conductive layers 319a to 322a and second conductive layers 319b to 322b). The gate insulating film is not shown in detail in the figures, but a region not covered by the second shape conductive layers 315 to 318 is etched on the order of 20 to 50 nm, becoming thinner.

Two types of impurity regions having different concentrations are then formed, as shown in FIG. 7C. Both types of impurity regions are n-type, and an impurity element that imparts n-type conductivity, such as phosphorous (P) or arsenic (As) is added by ion doping or ion implantation. A first doping process forms first impurity regions 323 to 326 in a self-aligning manner with the second conductive layers 319b to 322b as masks. Conceptually, high acceleration voltage, low dosage conditions are selected, and the concentration of the impurity element which imparts n-type conductivity added in the first impurity regions 323 to 326 is set from $1\times10^{16}$ to $1\times10^{19}$ atoms/$cm^3$. For example, ion doping is performed using phosphine ($PH_3$) with the acceleration voltage set between 70 and 120 keV and with a dosage of $1\times10^{13}$ atoms/$cm^2$.

Low acceleration, high dosage conditions are selected for a second doping process performed next, performing the formation of impurity regions 327 to 330. The impurity element concentration of the second impurity regions 327 to 330 is set to a range of $1\times10^{20}$ to $1\times10^{21}$ atoms/$cm^3$. One example of ion doping condition to attain that concentration is a dosage set between $1\times10^{13}$ and $5\times10^{14}$ atoms/$cm^2$, and an acceleration voltage of 30 to 70 keV. Thus the first impurity regions 323 to 326 formed in the semiconductor layer are formed overlapping the first conductive layers 319a to 322a, and the second impurity regions 327 to 330 are formed external to the second shape conductive layers 319 to 322.

Third impurity regions 332 to 335 in which an impurity element for imparting p-type conductivity are formed in the semiconductor layers 308 and 310 forming p-channel type TFTs, as shown in FIG. 7D. The island shape semiconductor layers 309 and 311 forming the n-channel type TFTs are covered over their entire surface by a mask 331 as a resist at this point. Phosphorous (P) is added into each of the impurity regions 332 to 335 at different concentrations, and the p-type imparting impurity element is added by ion doping using diborane ($B_2H_6$), and even in shifted regions the p-type imparting impurity element is formed to have a concentration from $2\times10^{20}$ to $2\times10^{21}$ atoms/$cm^3$.

The impurity regions are formed in each of the semiconductor layers up through the above processes. The second conductive layers 319 to 322 function as gate electrodes. A first interlayer insulating film 336 is then formed, as shown in FIG. 7E. The first interlayer insulating film 336 is formed from a oxynitride silicon film having a thickness of 100 to 200 nm. A process of activating the impurity elements added into each of the semiconductor layers is performed next with the aim of controlling the conductivity type. Thermal annealing using an annealing furnace, laser annealing, or rapid thermal annealing (RTA) can be applied to this process. Thermal annealing is performed at 400 to 700° C., typically between 500 and 600° C., in a nitrogen atmosphere having an oxygen concentration equal to or less than 1 ppm, preferably equal to or less than 0.1 ppm.

Laser annealing uses excimer laser light having a wavelength equal to or less than 400 nm, or the second harmonic (532 nm) of a YAG laser or a $YVO_4$ laser. The activation conditions may be appropriately selected by the operator, and when the excimer laser is used, the pulse emission frequency is set to 30 Hz and the laser energy density is set from 100 to 300 mJ/$cm^2$. Further, when the YAG laser is used, the second harmonic is used, with the pulse emission frequency set from 1 to 10 KHz, and the laser energy density may be set from 200 to 400 mJ/$cm^2$. The laser light, which is collected into a linear shape having a width from 100 to 1000 μm, for example 400 μm, is then irradiated by being passed over the entire substrate surface, and the process is performed at this point so that the overlap ratio of the linear shape laser light is from 80 to 98%.

In addition, a hydrogenation process of the semiconductor layer is performed by performing heat treatment for 1 to 12 hours at 300 to 450° C. in an atmosphere containing between 3 and 100% hydrogen. This process is one of terminating dangling bonds in the semiconductor layers by thermally excited hydrogen. Plasma hydrogenation (using hydrogen, which is excited by a plasma) may also be used as another means of hydrogenation.

A second interlayer insulating film 337 is formed with an average film thickness of 1.0 to 2.0 μm using an inorganic insulating material such as silicon oxide or oxynitride silicon, or an organic insulating material. A material such as polyimide, acrylic, polyamide, polyimideamide, BCB (benzocyclobutene) can be used as the organic insulating material. For example, when using a thermally setting type polyimide, it is formed by firing in a clean oven at 300° C. after application to the substrate. Further, when acrylic is used, a two-liquid type is used, and after mixing a main material and a hardening agent, it is applied to the entire substrate by using a spinner, after which provisional heat treatment is performed on a hotplate for 60 seconds at 80° C., and then firing is performed for 60 minutes at 250° C. using a clean oven.

Wirings 338 to 345 for contacting the second impurity regions or a third impurity regions formed in the semiconductor layers are then formed. The wirings are formed from a 50 to 200 nm thick Ti film 768a, a 100 to 300 nm thick Al film 768b, and a 50 to 200 nm thick tin (Sn) film or Ti film. With the wirings 338 to 345 formed by this type of structure, the Ti film formed first contacts the semiconductor layers and the heat resistance of the contact portion is increased.

The driver circuit having the p-channel type TFTs 346 and 348, and the n-channel type TFT-s 347 and 349 can thus be formed. The gate insulating film of the p-channel type TFT 348 and the n-channel type TFT 349 is formed thicker than the gate insulating film of the p-channel type TFT 346 and the n-channel type TFT 347, becoming a structure in which voltage resistance is increased.

The p-channel type TFT 346 has: a channel forming region 350; a third impurity region 351 overlapping the second conductive film 319, which is the gate electrode; and a third impurity region 352 formed externally to the gate electrode. Further, the p-channel type TFT 348 has: a channel forming region 356; a third impurity region 357 overlapping the second conductive layer 321, which is the gate electrode; and a third impurity region 358 formed externally to the gate electrode. The p-channel type TFTs are single drain structures, and the third impurity regions function as sources or drains.

The n-channel type TFT 347 is formed from: a channel forming region 353; a first impurity region 354 overlapping the second conductive layer 320, which is the gate electrode; and a second impurity region 355 formed externally to the gate electrode. Further, the n-channel type TFT 349 is formed from: a channel forming region 359, a first impurity region 360 overlapping the second conductive layer 322, which is the gate electrode; and a second impurity region 361 formed externally to the gate electrode. The first impurity regions 354 and 360 are LDD (lightly doped drain) regions, and the second impurity regions 355 and 361 are regions functioning as source regions or drain regions. In particular, the first impurity regions are GOLD (gate overlapped drain) structures formed overlapping the gate electrodes, and therefore degradation of the TFT due to the hot carrier effect can be prevented, and even if a high voltage equal to or greater than 10 V is applied, extremely stable operation can be obtained.

Whichever is used, these TFTs are formed with a channel length of 1 to 5 μm, preferable between 1.5 and 2.5 μm. Therefore, design rules which must be applied may have a precision for line and space (line width and an interval between adjoining lines) of 0.3 to 1 μm, and on the order of 0.5 to 1.5 μm for contact holes.

The TFTs manufactured in this embodiment mode are suitable for forming the scanning line side stick driver. In particular, the p-channel type TFT 348 and the n-channel type TFT 349 shown in FIG. 7E are applied to forming circuits, such as the buffer circuit, having a high applied voltage on the order of 30 V. Further, the p-channel type TFT 346 and the n-channel type TFT 347 may be applied in forming circuits such as the shift register circuit. Processes of forming the n-channel type TFTs and the p-channel type TFTs are shown here, but it can be assumed that the same process can be easily used to form a capacitor element or a resistive element, and therefore that is omitted. Furthermore, the TFT size required for circuit formation (channel length/channel width) and the layout may suitably determined by the operator.

Embodiment Mode 3

The voltage resistance required by a stick driver TFT formed on a data line side is on the order of 12 V, but the operating frequency is equal to or greater than 50 MHz (for example, 65 MHz) at 3 V. A method of manufacturing a TFT suitable for such is explained in this embodiment mode.

Figure 8A:
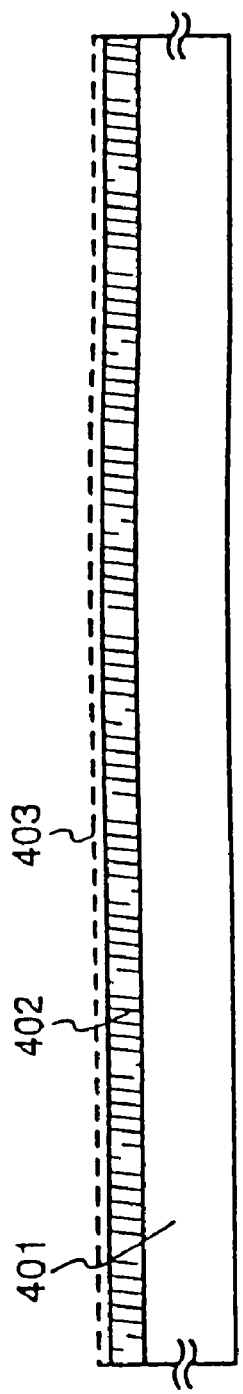
FIGS. 8A to 8C are cross-sectional drawings explaining the process of manufacturing a driver circuit formed on the stick driver.
Figure 8B:
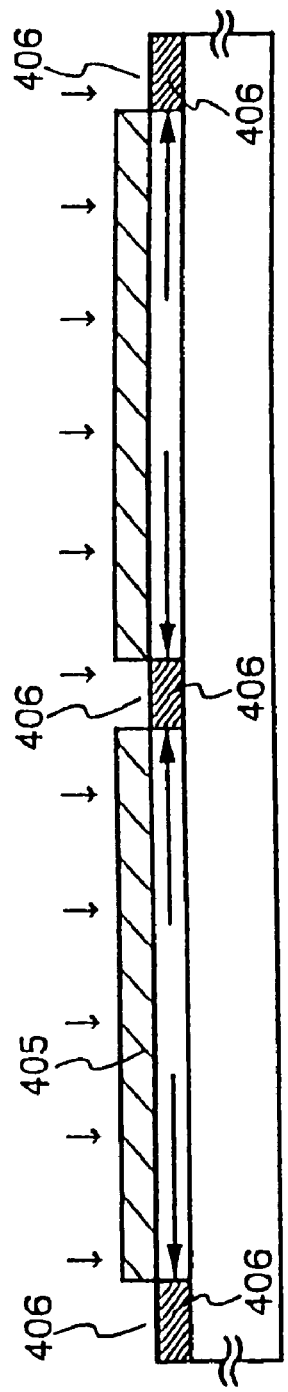
Figure 8C:
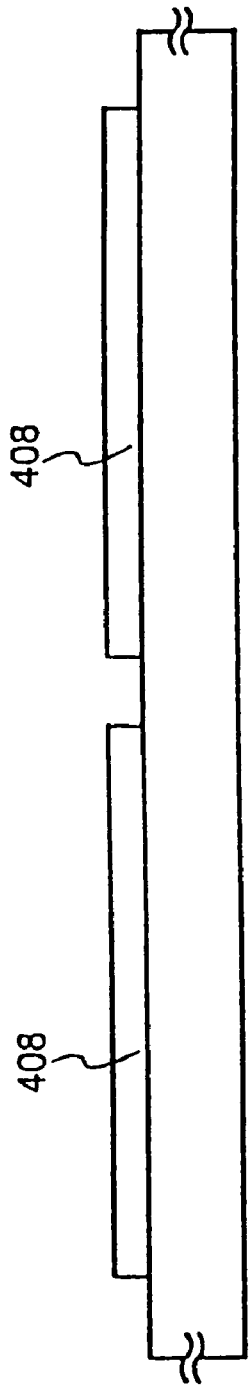

Material quality with which it is possible to realize a high electric field effect mobility and a low subthreshold coefficient (S value) is required in a crystalline semiconductor film forming a channel forming region of the TFT. In other words, the crystalline semiconductor film having characteristics in which a defect level becomes trap centered or recombination centered, and in which the grain boundary potential is low. FIGS. 8A to 8C show one example of a method of manufacturing such a crystalline semiconductor film.

A substrate able to withstand heat treatment at 600° C. (preferably 950° C.) and having an insulating surface can be applied as a substrate 401 in FIG. 8A. From the viewpoint of quality and surface finishing precision, a quartz substrate is suitable. A semiconductor film 402 having an amorphous structure and formed in intimate contact with the quartz substrate 401 is formed with a thickness of 25 to 100 nm by plasma CVD or reduced pressure CVD. Films such as an amorphous silicon (a-Si) film, an amorphous silicon germanium (a-SiGe) film, an amorphous silicon carbide (a-SiC) film, and an amorphous silicon tin (a-SiSn) film are typical semiconductor films having an amorphous structure, and any of these can be applied. A layer containing a catalyst element capable of lowering the crystallization temperature of the amorphous semiconductor film is then formed. In FIG. 8A this is formed on the semiconductor film 402 having an amorphous structure, but it may also be formed on the substrate side. Catalyst elements capable of being applied here are the same as those of Embodiment Mode 2, and are formed by a similar method.

Heat treatment is then performed for 1 to 12 hours at 500 to 600° C. in a nitrogen or argon atmosphere, performing crystallization of the semiconductor film having an amorphous structure. Before crystallizing at this temperature, it is necessary to perform heat treatment at 400 to 500° C. for on the order of 1 hour, to drive out hydrogen contained within the film. Typical conditions are that heat treatment is performed for 8 hours at 570° C. after dehydrogenating processing for 1 hour at 450° C. A crystalline semiconductor film 404 having a crystalline structure is formed from the amorphous silicon film by this type of thermal crystallization method. (See FIG. 8B.)

However, the concentration of the catalyst element remaining in the crystalline semiconductor film 404 is approximately $5 \times 10^{16}$ to $2 \times 10^{18}$ atoms/cm$^2$. The catalytic element is effective in crystallization of the semiconductor film, but as a material functioning to form TFTs later, it exists unnecessarily with regard to usage aims. The catalyst element existing within the crystalline semiconductor film acts as an impurity, forming such things as a defect level, or forming trap centers or recombination centers, and brings about semiconductor junction defects. FIG. 8B is for explaining a gettering process for removing the catalyst element, and an aim is to reduce the concentration of the catalytic element within the crystalline semiconductor film to $1 \times 10^{17}$ atoms/cm$^3$ or less, preferably to $1 \times 10^{16}$ atoms/cm$^3$ or less.

First, a 150 nm thick insulating film 405 is formed as a mask from a film such as a silicon oxide film on the surface of the crystalline semiconductor film 404. An opening 406 is formed externally to a region forming an active layer, forming a region in which the surface of the crystalline semiconductor film is exposed. Phosphorous (P) is then added by ion doping or ion injection, forming a region 407 in the crystalline semiconductor film in which phosphorous has been selectively added. If heat treatment is performed in this state for 5 to 24 hours at 550 to 800° C. in a nitrogen atmosphere, for example for 12 hours at 600° C., then the phosphorous (P) added region 407 works as a gettering site, and the catalytic element remaining in the crystalline semiconductor film 404 can be segregated in the phosphorous (P) added region 407.

By next removing the mask insulating film 405 and the phosphorous (P) added region 407 by etching, a crystalline semiconductor film 408, in which the catalyst element concentration can be reduced to $1 \times 10^{17}$ atoms/cm$^3$ or less can be obtained. (See FIG. 8C.)

Further, FIGS. 9A to 9D show another example of a method of forming a crystalline semiconductor film. A substrate 410 and a semiconductor film 411 having an amorphous structure used in FIG. 9A are similar to those explained in FIG. 9A. An insulating film 412 for a mask is formed on the semiconductor film 411 having an amorphous structure, and an opening 414 is selectively formed. A solution containing between 1 and 100 ppm by weight of a catalyst element is next applied, forming a catalyst element containing layer 413. The catalyst element containing layer 413 is formed with a structure contacting the semiconductor film 411 having an amorphous structure only in the opening 414.

Heat treatment is performed next at 500 to 650° C. for between 1 and 24 hours, for example at 600° C. for 12 hours, forming a crystalline semiconductor film. Crystallization proceeds from where the catalytic element contacts the semiconductor film 415 in this crystallization process, and crystallization progresses in a direction parallel to the surface of the substrate 410 (horizontal direction). The crystalline semiconductor film thus formed is composed of a set of rod shape or needle shape crystals, and looking macroscopically, are grown possessing a certain fixed directionality, and therefore there is an advantage of the crystallinity being matched.

After forming the crystalline semiconductor film, a gettering process is performed for removing the catalyst element from the crystalline semiconductor film, similar to that of FIG. 8B. Phosphorous (P) is added from the opening 414 already formed, forming a phosphorous (P) added region 416 in the crystalline semiconductor film. Heat treatment is performed in this state in a nitrogen atmosphere at 550 to 800° C. for 5 to 24 hours, for example at 600° C. for 12 hours, segregating the catalyst element, which remains in the crystalline semiconductor film into the phosphorous (P) added region 416. (See FIG. 9C.)

By next removing the mask insulating film 412 and the phosphorous (P) added region 416 by etching, a crystalline semiconductor film 417 in which the catalyst element concentration is reduced to $1 \times 10^{17}$ atoms/cm$^3$ or less can be obtained. (See FIG. 9D.)

The crystalline semiconductor film 408 shown in FIG. 8C and the crystalline semiconductor film 417 shown in FIG. 9D are both suitable for use in forming an active layer of the TFT. Island shape semiconductor films 420 to 423 are formed by partitioning this type of crystalline semiconductor film into island shapes, as in FIG. 10A. For convenience, four semiconductor layers are shown in FIG. 10A. Subsequent explanation is made by assuming that the semiconductor layers 420 and 421 are manufactured into TFTs of circuits driven at a low voltage, such as a shift register circuit, and that the semiconductor layers 422 and 423 are manufactured into TFTs of circuits driven at a high voltage, such as a latch circuit. The latter is formed with a thin gate insulating film in order to make it capable of high speed operation. Therefore, a two-stage film formation process is performed.

In consideration of the driving voltage of the circuits, the gate insulating films formed on the semiconductor layers are formed with different film thicknesses, even though for TFTs formed on the same substrate. Therefore, a two-stage film formation process is necessary. Initially, an insulating film such as a silicon oxide film or an oxynitride silicon film is formed with a thickness of 20 to 50 nm, for example 40 nm. This type of insulating film is formed by plasma CVD or thermal CVD. One example of manufacturing conditions for thermal CVD is the use of $SiH_4$ and $N_2O$, a temperature of 800° C., and a pressure of 40 Pa, and by suitably setting the gas mixture ratio, a dense film can be formed. The insulating film formed on the semiconductor layers 422 and 423 are removed next by etching with a substance such as hydrofluoric acid, forming a first insulating film 424. In addition, the surface is cleaned of contaminants and formation of an oxide film is performed in an atmosphere containing a halogen (typically chlorine) at 800 to 1000° C. (preferably 950° C.).

The oxide film is formed to have a thickness of 30 to 50 nm (for example, 40 nm) in the semiconductor layers 422 and 423. As a result, an 80 nm thick insulating film is formed on the semiconductor layers 420 and 421. By forming the oxide film in the halogen atmosphere, microscopic amounts of impurities such as metallic impurities are removed, and a good insulating film, in which the interface level density with the semiconductor film is reduced, can be formed. Thus, a second insulating film 425 having a different thickness between the semiconductor layers 420 and 421, and the semiconductor layers 422 and 423, is formed, and the insulating film is utilized as a gate insulating film. (See FIG. 10B.)

Additionally, in FIG. 10B, a first conductive film 426 and a second conductive film 427 are formed on the second insulating film 425 in order to form a gate electrode. These conductive films are manufactured similarly to Embodiment Mode 1, and the first conductive film 426 is formed from a TaN film with a 50 to 100 nm thickness, and the second conductive film 427 is formed from a W film having a 100 to 300 nm thickness.

Subsequent processing is performed similarly to that of Embodiment Mode 2, forming n-channel type TFTs and p-channel type TFTs. The formation of the gate electrode is performed by a two-stage etching. FIG. 10C shows a state in which a resist mask 428 is formed, and then first shape conductive layers 429 to 432 (first conductive layers 429a to 432a and second conductive layers 429b to 432b) are formed by a first etching process in which taper etching is performed. Further, FIG. 10D shows a state in which second shape conductive layers 433 to 436 (first conductive layers 433a to 436a and second conductive layers 433b to 436b) are formed by a second etching process by anisotropic etching.

The formation of impurity regions of the n-channel type TFTs and the p-channel type TFTs is in a self-aligning manner, using the second shape conductive layers. Two types of impurity regions having different concentrations are formed in the n-channel type TFTs. FIG. 10E shows first impurity regions 437 to 440 formed by a first doping process (conditions of high acceleration voltage and low dosage) and second impurity regions 441 to 444 formed by a second doping process (conditions of low acceleration voltage and high dosage). As for the impurity regions of the p-channel type TFTs, as shown in FIG. 10F, a resist mask 445 is formed so as to protect a region in which the n-channel type TFT is formed, and regions 446 to 449, in which an impurity element for imparting p-type conductivity is added, are formed by a third doping process.

After forming the impurity regions, a first interlayer insulating film 450 is formed, and activation of the impurity elements is performed by performing heat treatment at 400 to 700° C. In addition, heat treatment is performed for 1 to 12 hours at 300 to 450° C. in an atmosphere containing 3 to 100% hydrogen, hydrogenating the semiconductor layers and performing reduction of the defect level density. A second interlayer insulating film 451 is formed with an average thickness of 1.0 to 2.0 μm from an inorganic insulating material such as silicon oxide or oxynitride silicon, or by using an organic insulating material. Wirings 452 to 459 are formed from a material such as Al or Ti.

A driver circuit having p-channel type TFTs 460 and 462, and n-channel type TFTs 461 and 463 can thus be formed. The gate insulating films of the p-channel type TFT 462 and the n-channel type TFT 463 are formed thinner than the gate insulating films of the p-channel type TFT 460 and the n-channel type TFT 461, becoming a structure driven at high speed by a low voltage. The former TFTs are suitable for forming a circuits such as a latch circuit driven at a low voltage of 3 to 5 V, and the latter TFTs are suitable for forming a circuit such as a shift register circuit driven at a voltage of 5 to 12 V.

The channel length of these TFTs is from 0.3 to 1 μm (preferably 0.6 μm) for the low voltage portion, and from 0.6 to 1.5 μm (preferably 0.9 μm) for the mid-level voltage portion. Therefore, it is necessary for design rules, which must be applied to have precision of 0.3 to 1.5 μm for line and space (line width and an interval between adjoining lines), and on the order of 0.9 μm for contact holes.

The TFTs manufactured in this embodiment mode are suitable for forming the stick driver of the data line side. In particular, a circuit such as a latch circuit driven at 3 V at several tens of MHz is formed using the p-channel type TFT 462 and the n-channel type TFT 463 shown in FIG. 10G. Further, a circuit such as a shift register circuit may be formed by applying the p-channel type TFT 460 and the n-channel type TFT 461. Processes of forming the n-channel type TFTs and the p-channel type TFTs are shown here, but it can be easily assumed that the same process can be used to form a capacitor element or a resistive element, and therefore that is omitted. Furthermore, the TFT size required for circuit formation (channel length/channel width) and the layout thereof may be suitably determined by the operator.

Whichever method is used, in the TFTs manufactured in this embodiment mode, when the gate insulating film is formed, the channel forming regions are formed from the crystalline semiconductors having good crystallinity, and heat treatment is performed in an oxidizing atmosphere containing a halogen, the TFTs having a good interface and are suitable for being driven at high speed, can be obtained. The driver circuit formed from this type of TFT may easily correspond to the operating frequency of several tens MHz.

Embodiment Mode 4

Another example of a method of manufacturing a TFT suitable for a stick driver formed on a data line side is shown. A process of forming a crystalline semiconductor film for forming an active layer of the TFT is the same as that of Embodiment Mode 3. In FIG. 12A, a quartz substrate having an insulating surface and able to withstand heat treatment at 600° C. (ideally 950° C.) is preferable as a substrate 501. A semiconductor film 502 having an amorphous structure formed in close contact with this type of substrate 501 is formed with a thickness of 40 to 100 nm, for example 70 nm, by plasma CVD or reduced pressure CVD. To form a good quality crystalline semiconductor film on the quartz substrate, it is necessary to make the film thickness of the amorphous semiconductor film formed as a start film somewhat thick. If the film thickness is equal to or less than 30 nm, then there is a fear that crystallization cannot be sufficiently achieved due to influences such as lattice misalignment between the film and the substrate as a base. The semiconductor film having an amorphous structure is the same material as that shown in Embodiment Mode 2 or Embodiment Mode 3, and typically amorphous silicon is used. A layer 503 containing a catalyst element capable of lowering the crystallization temperature of the amorphous semiconductor film is then formed.

Crystallization consists of performing dehydrogenation by heat treatment for 1 hour at 450° C. and performing next heat treatment for 12 hours at 600° C. As shown in FIG. 12B, an insulating film 505 used as a mask is formed on a crystalline semiconductor film 504 thus obtained, and phosphorous (P) is added from an opening 506, forming a phosphorous (P) added region 507. A gettering process for removing the catalyst element is performed by heat treatment in a nitrogen atmosphere at 550 to 800° C. for 5 to 24 hours, for example at 600° C. 12 hours, segregating the catalyst element remaining in the crystalline semiconductor film 504 into the phosphorous (P) added region 507. The mask insulating film 505 and the phosphorous (P) added region 507 are removed afterward by etching, and a crystalline semiconductor film 508 in which the catalyst element concentration is reduced to $1 \times 10^{17}$ atoms/cm$^3$ or less is obtained. The amorphous semiconductor film becomes dense due to crystallization, and therefore its volume decreases on the order of 1 to 10%, and the film thickness is reduced slightly.

FIG. 12C shows a process of oxidizing, by heat treatment, the crystalline semiconductor film thus formed. Thermal oxidation is performed by forming an oxide film in an atmosphere containing a halogen (typically chlorine) at 800 to 1000° C. (preferably 950° C.). The crystalline semiconductor film 508 becomes thinner by the formation of an oxide film 509, and becoming thinner than the original thickness. For example, by forming the oxide film with a thickness of 60 nm, the semiconductor film is reduced by approximately 30 nm, and 40 nm of the crystalline semiconductor film can be remained. (See FIG. 12C.)

The crystalline semiconductor film 508 thus formed is subjected to an etching process, and then partitioned into island shapes to form semiconductor films 511 to 514. In consideration of the driving voltage of the circuits, gate insulating films formed on the semiconductor films are formed with different film thicknesses, even though for TFTs formed on the same substrate. FIGS. 12D and 12E show the formation process, and an insulating film such as a silicon oxide film or an oxynitride silicon film is formed initially with a thickness of 20 to 50 nm, for example 40 nm. These insulating films are formed by plasma CVD or by thermal CVD. One example of manufacturing conditions in thermal CVD is the use of SiH$_4$ and N$_2$O, at a temperature of 800° C. and a pressure of 40 Pa, and by suitably setting the gas mixture ratio, a dense film can be formed. The insulating film formed on the semiconductor layers 513 and 514 is removed next by etching with a substance such as hydrofluoric acid, forming a first insulating film 515. In addition, the surface is cleaned of contaminants and formation of an oxide film is performed in an atmosphere containing a halogen (typically chlorine) at 800 to 1,000° C. (preferably 950° C.). The oxide film is formed to have a thickness of 30 to 50 nm (for example, 40 nm) in the semiconductor layers 513 and 514. On the other hand, an 80 nm thick insulating film is formed in the semiconductor layers 511 and 512. By forming the oxide film in the halogen atmosphere, microscopic amounts of impurities such as metallic impurities are removed, and a good insulating film, in which the interface level density with the semiconductor film is reduced, can be formed. Thus a second insulating film 516, having a different thickness between the semiconductor layers 511 and 512, and the semiconductor layers 513 and 514, is formed, and the insulating film is utilized as a gate insulating film.

Care must be taken for a gate electrode formed on the gate insulating film because the gate insulating film is formed thin. Of course, it is possible to use a metallic conductive material formed by sputtering or vapor deposition, but it is preferable that a first layer contacting the gate insulating film is a polycrystalline silicon film doped with phosphorous (P), manufactured by reduced pressure CVD. The phosphorous (P) doped polycrystalline silicon film is formed with a thickness of 100 to 200 nm, preferably 150 nm, by using $SiH_4$ and $PH_3$, with He and $H_2$ used as dilution gasses, and heating at 450 to 500° C. In addition, in order to reduce the resistance value of the gate electrode, a material such as a metallic silicide is formed in an upper layer. There is no limitation on applicable metallic suicides, such as tungsten silicide or titanium silicide, and the film may be formed by a method such as sputtering to a thickness of 100 to 200 nm, preferably 150 nm.

In this way, from a state of being divided into two layers of a first conductive layer and a second conductive layer, gate electrodes 517 to 520 (first conductive layers 517a to 520a and second conductive layers 517b to 920b) are formed, as shown in FIG. 12F.

A first doping process is performed next in order to form LDD regions of n-channel type TFTs. The doping is performed as a typical method by ion doping using phosphine ($PH_3$), and first impurity regions 521 to 524 are formed in a self-aligning manner using the gate electrodes as masks. The phosphorous (P) concentration of these regions is set within a range of from $2\times10^{16}$ to $5\times10^{19}$ atoms/cm$^3$.

Then, a second doping process is performed, forming second impurity regions in which an n-type impurity is added. These impurity regions form source regions and drain regions of the n-channel type TFT, and a resist mask 526 is formed in order to form the impurity regions in a region external to the gate electrode. Further, a resist mask 525 is formed so that phosphorous (P) is not added to the semiconductor layers forming p-channel type TFTs. Phosphorous (P) is used as an impurity element which imparts n-type conductivity, and ion doping using phosphine ($PH_3$) is performed so that the phosphorous concentration is within a concentration range of from $1\times10^{20}$ to $1\times10^{21}$ atoms/cm$^3$.

Then, third impurity regions 530 and 531 for forming source regions and drain regions are formed in the semiconductor layers forming the p-channel type TFTs. Ion doping is performed using diborane ($B_2H_6$) with the gate electrode 612 as a mask, forming the third impurity regions in a self-aligning manner. The entire surface of the semiconductor layers forming the n-channel type TFT is covered by a resist mask 529 at this time. The boron (B) concentration in the third impurity regions is set to be from $3\times10^{20}$ to $3\times10^{21}$ atoms/cm$^3$.

After forming these impurity regions, a first interlayer insulating film 532 formed of a film such as a silicon nitride film, a silicon oxide film, or an oxynitride silicon film, and the activation of impurity elements is performed by performing heat treatment for 10 to 60 minutes at 400 to 950° C., preferably between 800 and 900° C. A second interlayer insulating film 451 is formed with an average film thickness of 1.0 to 2.0 µm using an inorganic insulating material such as silicon oxide or oxynitride silicon, or by using an organic insulating material. Wirings 538 to 545 are formed from a material such as Al or Ti. In addition, heat treatment is performed for 1 to 12 hours in an atmosphere containing 3 to 100% hydrogen at 450° C., hydrogenating the semiconductor layers and performing a process of reducing the defect level density.

A driver circuit having p-channel type TFTs 546 and 548, and n-channel type TFTs 547 and 549 can thus be formed. The gate insulating films of the p-channel type TFT 548 and the n-channel type TFT 549 are formed thinner than the gate insulating films of the p-channel type TFT 546 and the n-channel type TFT 547, becoming a structure driven at high speed by a low voltage. The former TFTs are suitable for forming a circuits such as a latch circuit driven at a low voltage of 3 to 5 V, and the latter TFTs are suitable for forming a circuit such as a shift register circuit driven at a voltage of 5 to 12 V.

The p-channel type TFTs 546 and 548 have a single drain structure composed of channel forming regions 550 and 555, and source or drain regions 551 and 556 made from the third impurity regions. The n-channel type TFTs 547 and 549 are composed of channel forming regions 552 and 557, LDD regions 553 and 558 formed from the first impurity regions, and source or drain regions 554 and 559 formed from the second impurity regions. The LDD regions formed in the n-channel type TFTs are formed with a length of 0.2 to 1 µm, and approximately 0.1 µm diffuses into the gate electrodes by the activation heat treatment, forming a structure in which the LDD regions overlap agate electrode. With this structure, it is possible to prevent degradation of the characteristics due to the hot carrier effect, and it is possible to operate at high speed while reducing the parasitic capacitance to a minimum level.

The channel length of these TFTs is from 0.3 to 1 µm (preferably 0.6 µm) for the low voltage portion, and from 0.6 to 1.5 µm (preferably 0.9 µm) for the mid-level voltage portion. Therefore, it is necessary for design rules, which must be applied to, have precision of 0.3 to 1.5 µm for line and space (line width and an interval between adjoining lines), and on the order of 0.9 µm for contact holes.

The TFTs manufactured in this embodiment mode are suitable for forming the stick driver of the data line side. In particular, a circuit such as a latch circuit, which is driven at 3 V at several tens of MHz, is formed using the p-channel type TFT 548 and the n-channel type TFT 549 shown in FIG. 13E. Further, a circuit such as a shift register circuit may be formed by applying the p-channel type TFT 546 and the n-channel type TFT 547. Processes of forming the n-channel type TFTs and the p-channel type TFTs are shown here, but it can be easily assumed that the same process can be used to form a capacitor element or a resistive element, and therefore that is omitted. Furthermore, the TFT size required for circuit formation (channel length/channel width) and the layout thereof may be suitably determined by the operator.

Whichever method is used, in the TFTs manufactured in this embodiment mode, the crystalline semiconductor having good crystallinity is further thinned to form the channel forming region, with the result that it becomes easy to realize a high electric field-effect mobility, and in addition in an insulating film formation process, heat treatment is performed in an oxidizing atmosphere containing a halogen, the TFTs having a good interface and are suitable for being driven at high speed, can be obtained. The driver circuit formed from this type of TFT may easily correspond to the operating frequency of several tens MHz.

Embodiment Mode 5

Figure 14:
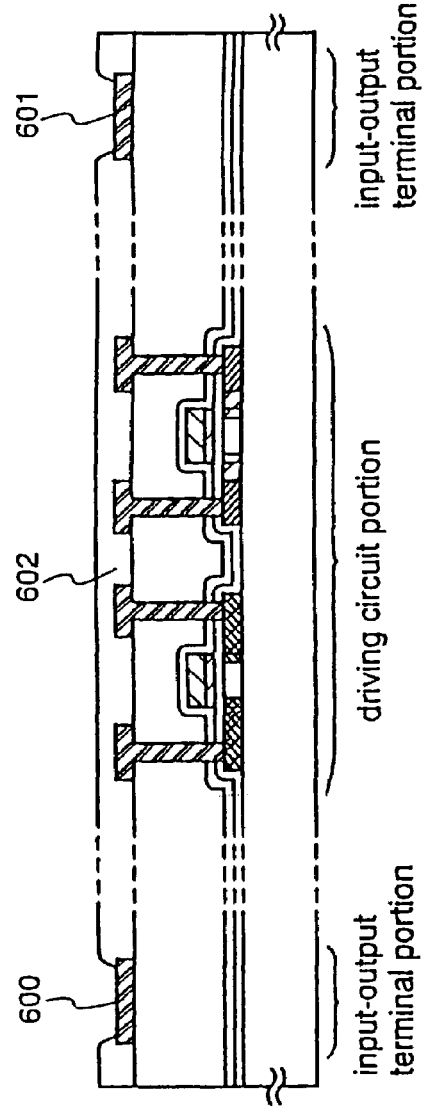
FIG. 14 is a cross-sectional drawing explaining the structure of terminal portions of the stick driver.

A driver circuit of a scanning line side stick driver or a data line side stick driver can be formed from a TFT manufactured in accordance with any of the methods of Embodiment Modes 2 to 4. An input-output terminal formed in this type of stick driver is formed on the same layer as a source wiring or a drain wiring, as shown in FIG. 14. FIG. 14 shows a state in which input-output terminals 600 and 601 are formed in an edge portion of a stick substrate. In order to mount the input-output terminal on a first substrate on which a pixel region is formed by using a face down COG method, surface passivation is necessary, and therefore the surface is passivated by an insulating layer 602. This type of input-output terminal portion can also be applied to a stick substrate manufactured in Embodiment Modes 2 to 4.

Figure 15A:
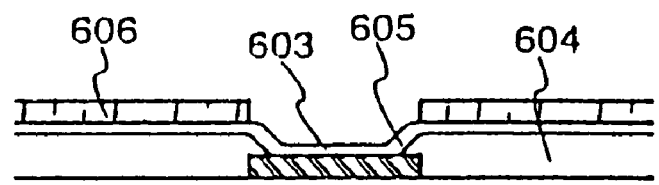
FIGS. 15A to 15D show a manufacturing process of a bump formed in an input-output portion of the stick driver.

Further, it is necessary to form a bump on the input-output terminal for mounting the stick driver by COG. The bump may be formed by a known method, and one example is explained using FIGS. 15A to 15D. In FIG. 15A, reference numeral 603 denotes an input-output terminal formed on the same layer as the source wiring or the drain wiring, and a barrier metal layer 605 is formed on the input-output terminal 603 from a lamination of Ti and Pd, or Cr and Cu. A method such as sputtering or vapor deposition is applied to the formation of the barrier metal layer. A resist mask 606 for plating use is then formed.

Figure 15B:
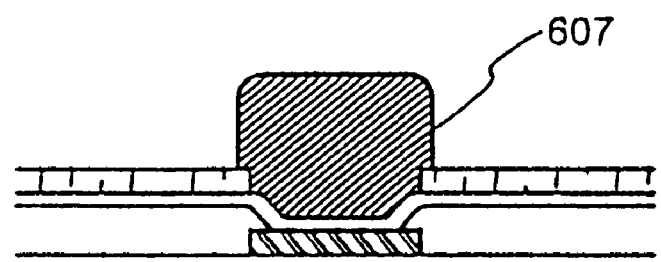
Figure 15C:
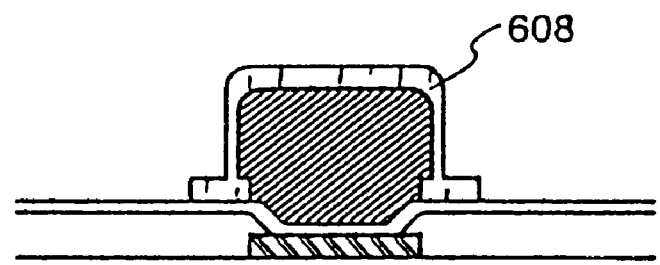
Figure 15D:
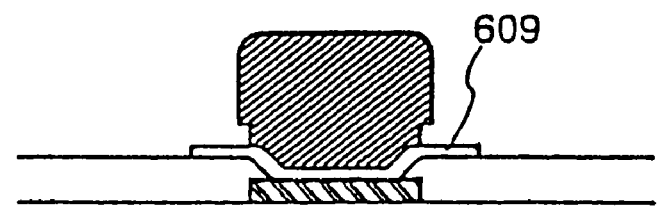

Then, as shown in FIG. 15B, a bump 607 formed from Au is formed with a thickness of 5 to 20 μm by electroplating. The unnecessary resist mask 606 is then removed, and resist is newly applied onto the bump, forming a resist mask 608 for etching the barrier metal layer 605. The photolithography process for forming this resist mask is performed through the bump, and therefore a high resolution cannot be obtained. The resist mask 608 is formed to cover the bump and its periphery. By utilizing the resist mask 608 and etching the barrier metal layer, a barrier metal layer 609 is formed as shown in FIG. 15D. Heat treatment is performed next at 200 to 300° C. in order to increase the adhesion of the bump and the barrier metal layer. A stick driver capable of being mounted on other substrates is thus completed.

Embodiment 1

Figure 16:
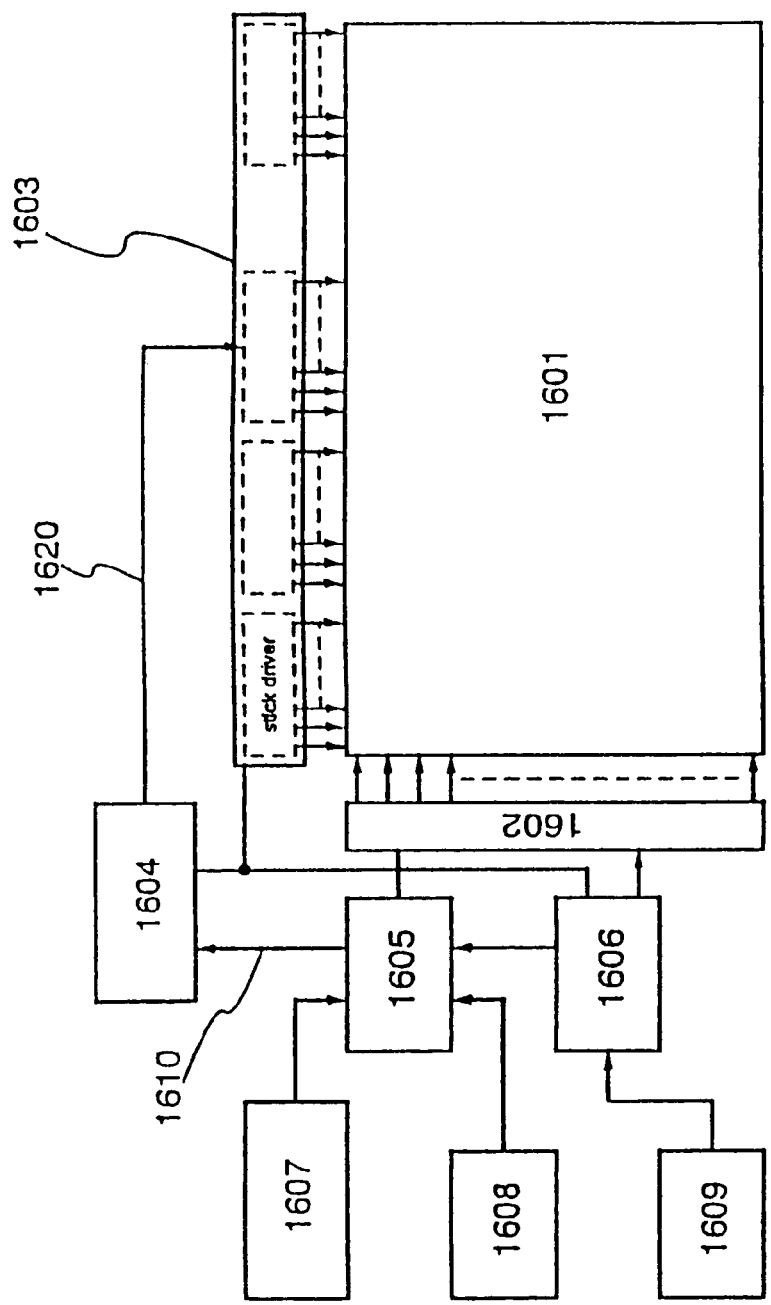
FIG. 16 is a block diagram explaining the circuit structure of a display device.

As described above, the stick driver can be used as a method of mounting a driver circuit of a liquid crystal display device, an El display device, etc. FIG. 16 shows a block diagram of such a display device. A pixel region 1601 is formed of a plurality of scanning lines and data lines, and may be an active matrix type in which TFTs are formed, or a passivation type. Stick drivers are used for a scanning line driver 1602 and a data line driver 1603 in a periphery region. A clock signal and a data signal 1607, and a picture quality signal 1608 inputted from the outside are inputted to a control circuit 1605 for converting to the stick driver input specifications, and are converted to the respective timing specifications. Further, a power source 1609 and a power source circuit 1606 made from an op-amp are provided by circuits attached externally. By mounting this type of control circuit 1605 and power source circuit 1606 by the TAB method, the display device can be made smaller.

These signals are outputted from the control circuit 1605 to the scanning line side and the data line side. A signal dividing circuit 1604 is formed on the data line side, and an input digital signal is partitioned into m pieces and supplied. The number of partitions m is a natural number equal to or greater than 2, and in practice it is suitable to partition into 2 to 16 pieces. In this case, if the number of input digital signal lines 1610 is taken as n, then the number of correcting digital signal lines 1620 becomes n×m. Although depending upon the pixel density, at least a plurality of data line side stick drivers are formed, and the load on the stick drivers is reduced by lowering the frequency of the input digital signal with the signal dividing circuit to 1/m. The signal dividing circuit may be implemented by an IC chip formed from a semiconductor integrated circuit, and it is also possible to form the signal dividing circuit by the same chip as that of the stick driver formed from integrated circuits of the TFTs shown in Embodiment Mode 3 or Embodiment Mode 4.

Embodiment 2

Figure 17A:
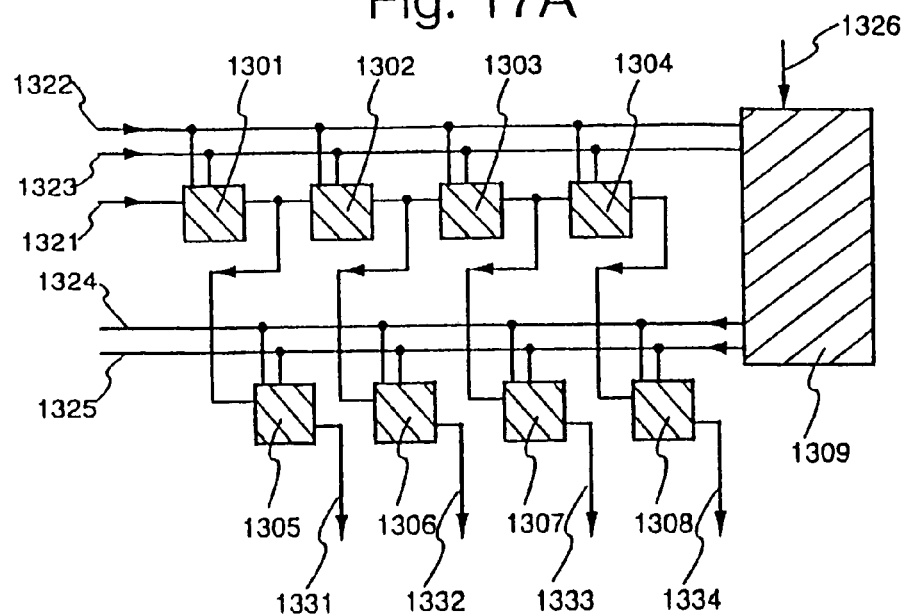
FIGS. 17A and 17B are diagrams explaining the structure of a signal dividing circuit.
Figure 17B:
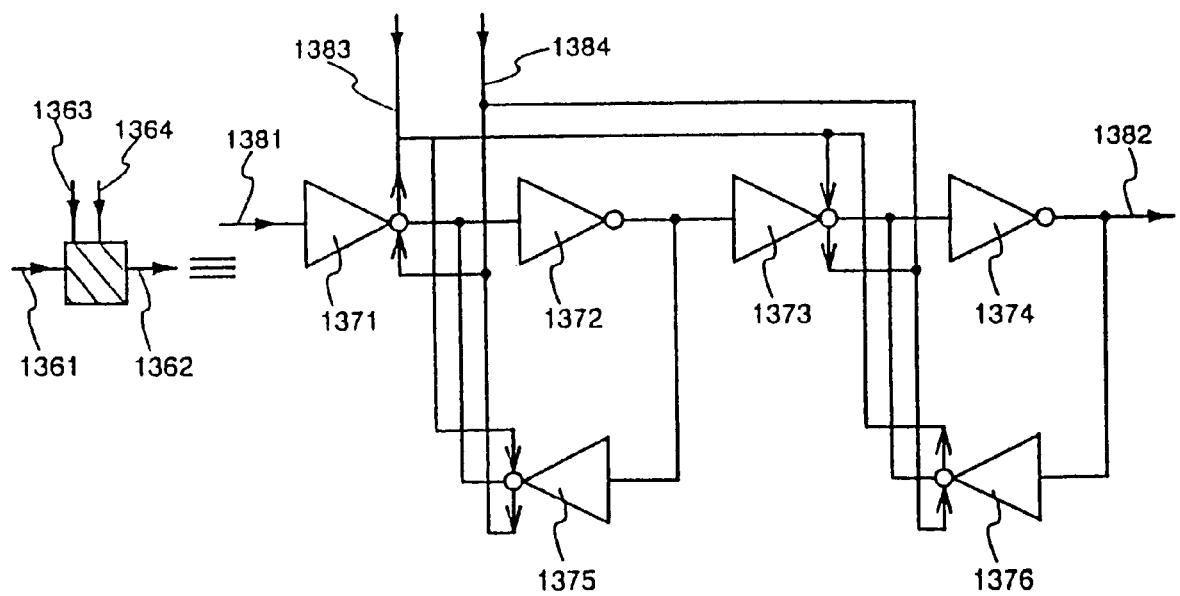

FIG. 17 shows an example of a signal dividing circuit. In this embodiment, an explanation is made with the number of input digital signal lines n set to 1, and the number of signal dividing m set to 4. Latch circuit pre-stages 1301 to 1304 and latch post-stages 1305 to 1308 are each composed of two inverters 1372 and 1374, and four clocked inverters 1371, 1373, 1375, and 1376, as shown in FIG. 17B. A signal input portion 1381 corresponds to reference numeral 1361, a signal output portion 1382 corresponds to reference numeral 1362, and clock signal input portions 1383 and 1384 correspond to reference numerals 1363 and 1364, respectively.

A clock signal of a clock signal line 1322 and an inverted clock signal line 1323 is inputted into a counter circuit 1309, and when an input is received from a reset signal 1326, sends an output to a corrected clock signal line 1324 and an inverted corrected signal line 1325. The input digital signal is inputted from reference numeral 1321, and is sent in order from the latch circuit pre-stage 1301 to 1302 for each period of the clock signal. When the reverse clock signal is then inverted, the electric potential information of the input digital signal stored in the latch circuit pre-state is moved to the latch circuit post-stage. For example, the electric potential information of the latch circuit pre-stage 1301 is moved to the latch circuit post-stage 1305. Through this type of operation, the corrected digital signal is sent out from each of the corrected digital signal lines 1331 to 1334 connected to the output portion of the latch circuit post-stages 1305 to 1308. A case in which the number of partitions m is set equal to 4 is explained, and therefore the frequency of the corrected digital signal becomes ¼ the frequency of the input digital signal. Of course, the number of partitions is not limited to 4, and can be freely selected within a range of 2 to 32 (in practice, from 4 to 16).

Embodiment 3

Figure 18:
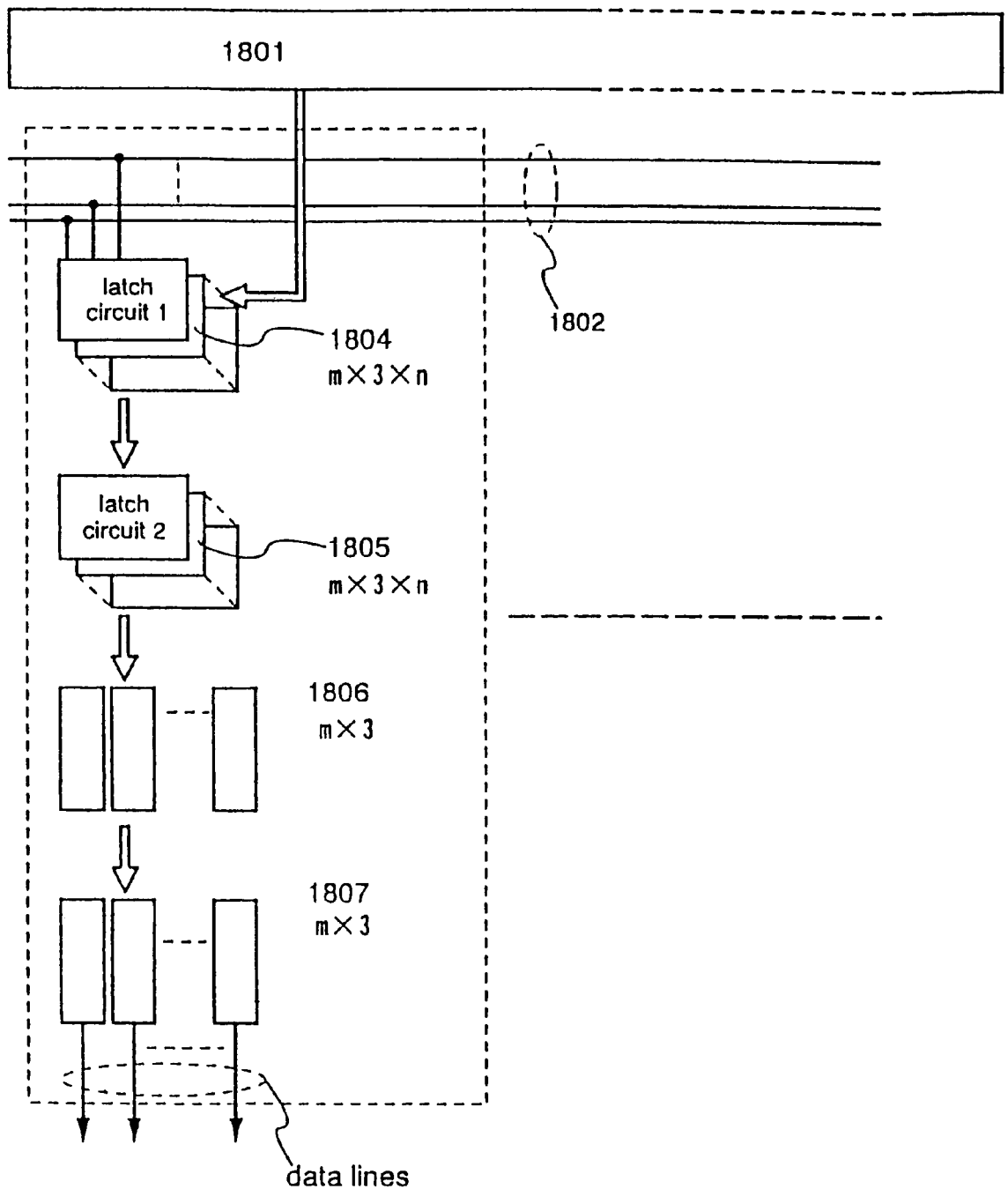
FIG. 18 is a diagram explaining the structure of the driver circuit of the stick driver connected to a data line.

One example of a circuit structure of the stick driver circuit, shown in FIG. 16, formed on the data line side is shown in FIG. 18. From the input side, the circuit structure is formed from a shift register circuit 1801, latch circuits 1804 and 1805, a level shifter circuit 1806, and a D/A converter circuit 1807. When an input digital signal is n-bits expressing information for one pixel for performing RGB display, if the input digital signal is partitioned into m partitions, then m×3×n latch circuits 1804, and m×3×n latch circuits 1805 are required, and m×3 level shifter circuits 1806 and m×3 D/A converter circuits 1807 are needed.

Figure 19A:
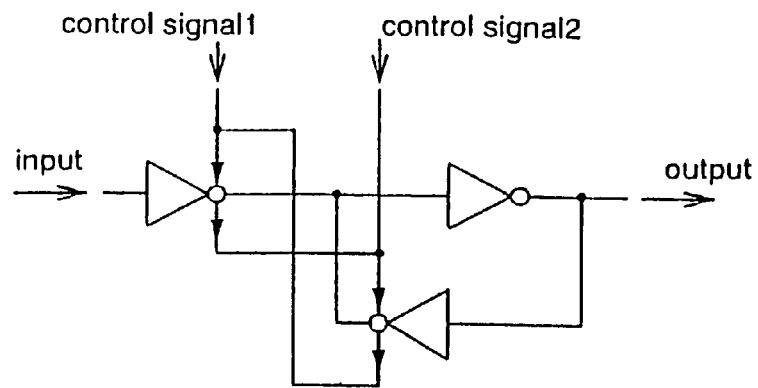
FIGS. 19A to 19C are diagrams explaining a specific example of a latch circuit.
Figure 19B:
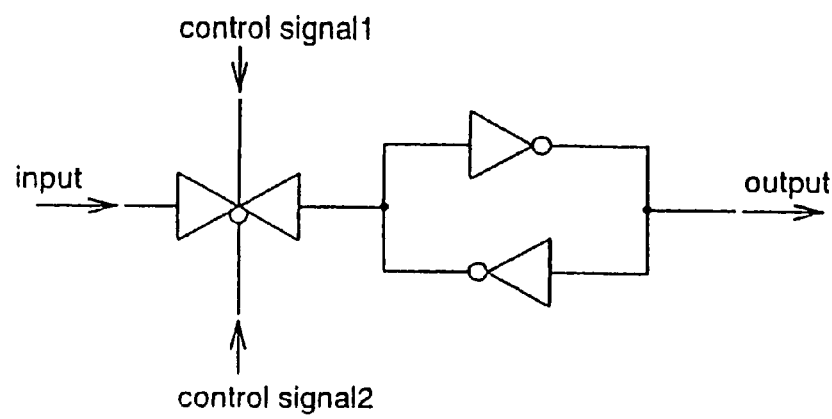
Figure 19C:
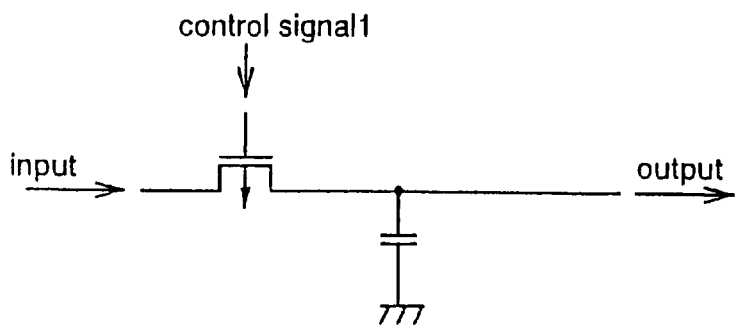

FIG. 19 is a typical example of a latch circuit, FIG. 19A is an example using a clocked inverter, FIG. 19B is an SRAM type circuit, and FIG. 19C is DRAM type circuit. These are typical examples, and other structures are also possible.

The shift register circuit and the latch circuit have a driver voltage of 3 V, and send a signal, amplified to 10 V by the level shifter circuit, to the D/A converter circuit. A resistance partitioning type or a switched capacitance type can be employed as the D/A converter circuit.

Figure 13D:
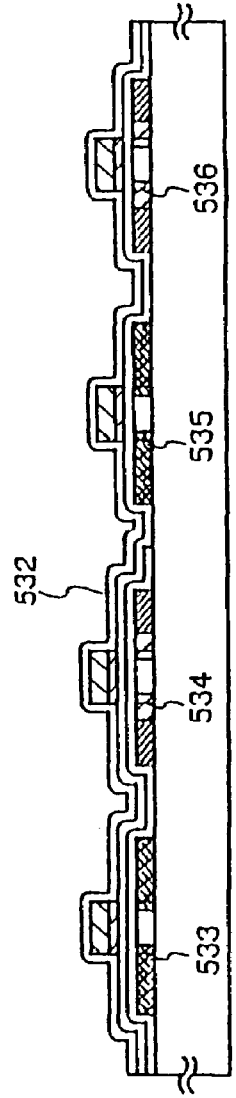
Figure 13E:
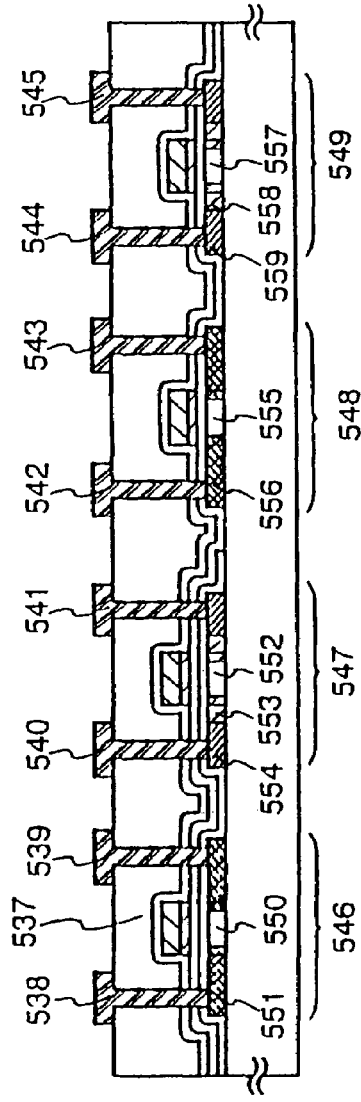

TFTs forming the shift register circuit and the latch circuit may be manufactured using the p-channel type TFT 462 or the n-channel type TFT 463 shown in FIG. 10G in Embodiment Mode 3, or by using the p-channel type TFT 548 or the n-channel 549 sown by FIG. 13E in Embodiment Mode 4.

Embodiment 4

Figure 20A:
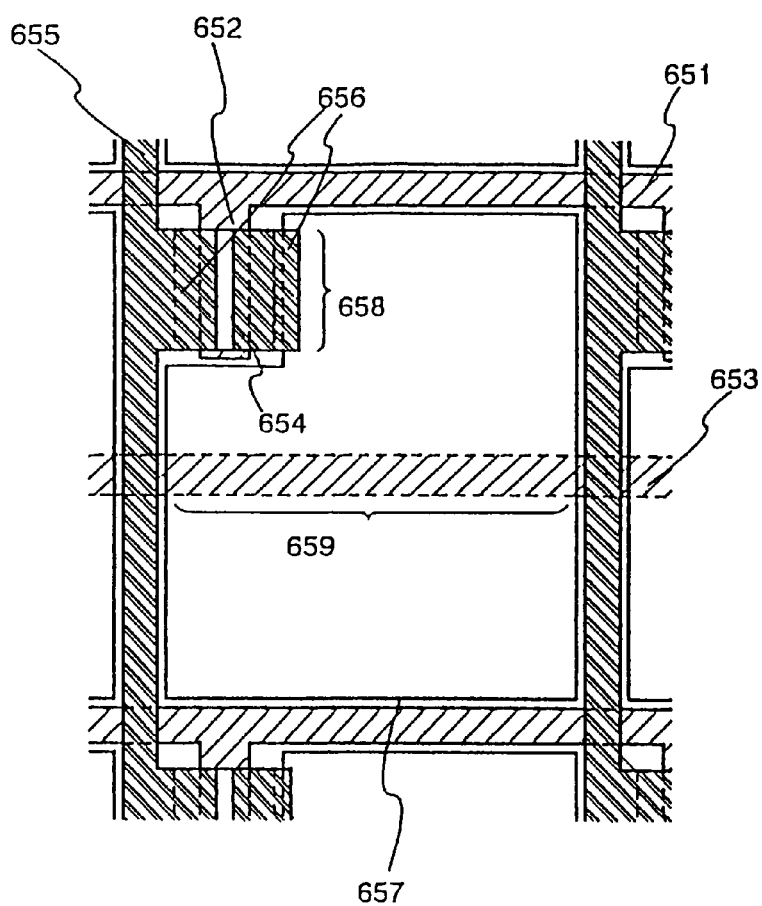
FIGS. 20A and 20B are a top view and a circuit diagram explaining an example of the structure of a pixel region of a liquid crystal display device.
Figure 20B:
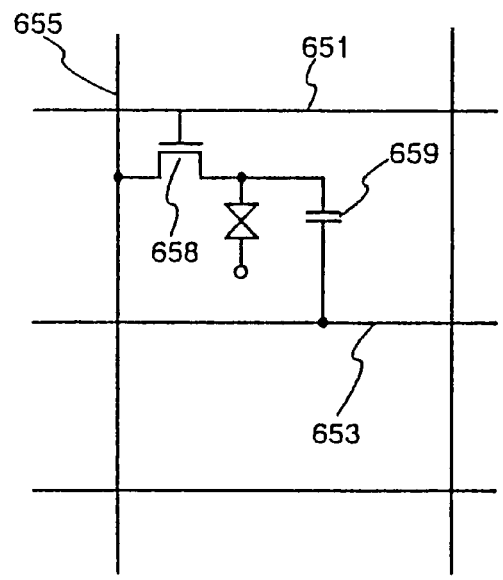
Figure 21A:
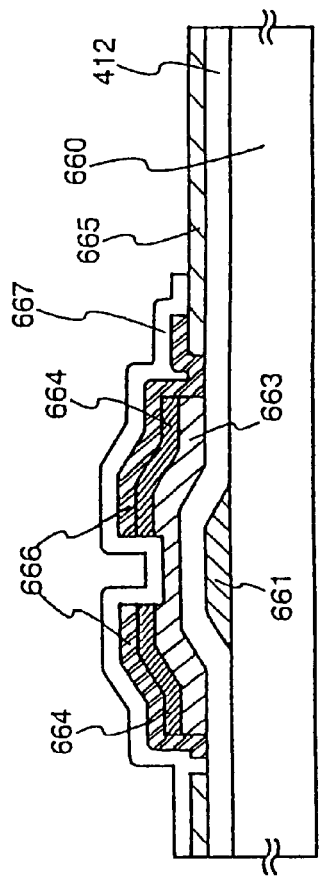
FIGS. 21A to 21C are views explaining a cross-sectional structure of a bottom gate type pixel TFT.

An example of the structure of a pixel region connecting a stick driver is explained with reference to FIGS. 20A and 20B and FIGS. 21A to 21C. FIG. 21A is a top view showing the structure of a pixel region of a liquid crystal display device. A scanning line 651 and a data line 655 intersect with each other to form one pixel. On the intersecting portion, a pixel TFT 658 is formed. The pixel TFT shown here has a bottom gate type structure, one side of a source/drain electrode 656 is connected to the data line 655, and the other side thereof is connected to a pixel electrode 657. A storage capacitor 659, which is necessary for driving a liquid crystal, is formed in between a capacitor wiring 653 formed on the same layer of a gated electrode 652 and the pixel electrode 657 through an insulating layer formed on the same layer of the gate insulating film. FIG. 20B shows an equivalent circuit thereof.

There is no limitation on the structure of the pixel TFT, however, it may be formed from bottom gate type TFTs, which is a channel etching type shown in FIG. 21A, for instance. A gate electrode 661 is formed from a material such as Ta, Cr, Mo, and Al on a substrate 660. A gate insulating film 662 is then formed by a film such as a silicon nitride film and a silicon oxide film, or a tantalum oxide film, and a semiconductor layer 663 having an amorphous structure is formed thereon into an island shape so as to overlap the gate electrode 661 in portion. A typical material of the semiconductor layer 663 having an amorphous structure is an amorphous silicon, and is formed to have a thickness of from 100 to 250 nm by plasma CVD. A semiconductor layer 664 in which an n-type or a p-type impurity is added, is initially formed while overlapping the semiconductor layer 663 having the amorphous structure.

A pixel electrode 665 is then formed from a transparent conductive film. The transparent conductive film is formed from a material such as indium oxide tin ($In_2O_3:SnO_2$, ITO) or zinc oxide (ZnO), a compound of indium oxide tin and zinc oxide, and zinc oxide in which gallium oxide ($Ga_2O_3$) is added. Next, a source/drain electrode 666 is formed from a material such as Cr, Ti, and Ta. The semiconductor layer 664 in which an n-type or a p-type impurity is added is subjected an etching process using as a mask the source/drain electrode 666 to divide into two regions. This etching process can not be selectively performed to the semiconductor layer 663 having the amorphous structure, and therefore a part thereof is etched to be removed. Finally, a protective film 667 is formed from nitride silicon, oxide silicon or the like to complete the pixel TFT.

Figure 21B:
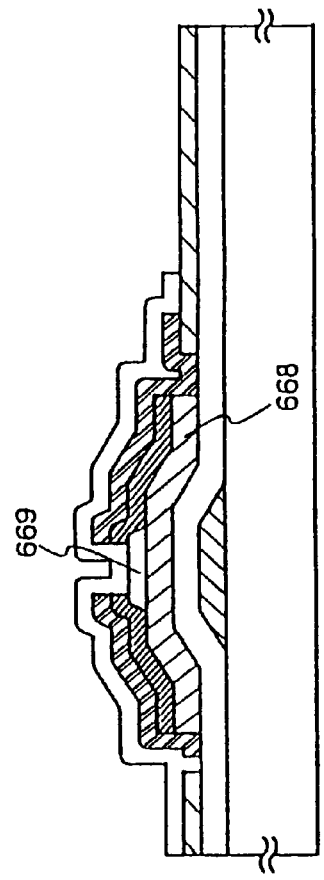

FIG. 21B shows the structure of a channel protective film type, in which a channel protective layer 669 formed from nitride silicon etc. is formed on a semiconductor layer 668 having the amorphous structure so that the semiconductor layer 668 having the amorphous structure is not etched during an etching process for forming a source/drain region.

Figure 21C:
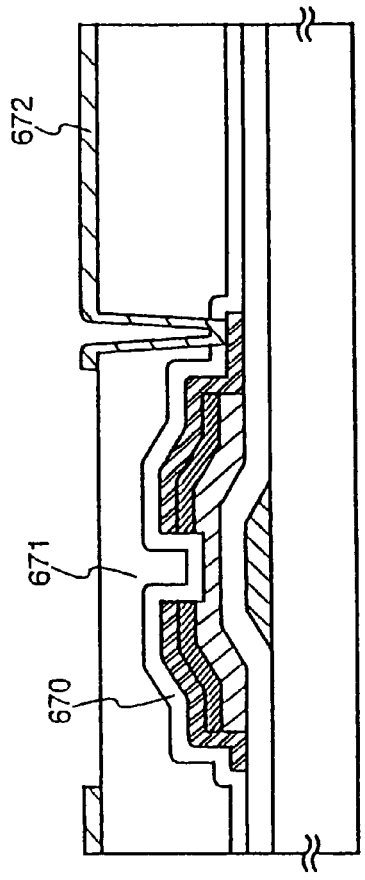

Further, FIG. 21C shows the structure in which a leveling film 671 is formed on a protective film 670 from an organic resin material such as acrylic, and a pixel electrode 672 is formed thereon. Employing a structure, in which the pixel electrode is connected to a pixel TFT via a contact hole, allows an opening ratio to be increased, and also leveling the surface allows the disturbance of orientation of the liquid crystal such as discrenation to be reduced.

In this embodiment, an example in which the bottom gate type TFT is used for the pixel TFT is described. However, even though the top gate type TFT is used, no obstacle exists. From the point of view of TFT's characteristics and manufacturing costs, the bottom gate type TFT is used in many cases. However, the stick driver according to the present invention can be applied to the one formed from a MIM type device in which a pixel region is formed from a combination of tantalum and oxide tantalum.

Embodiment 5

Figure 22:
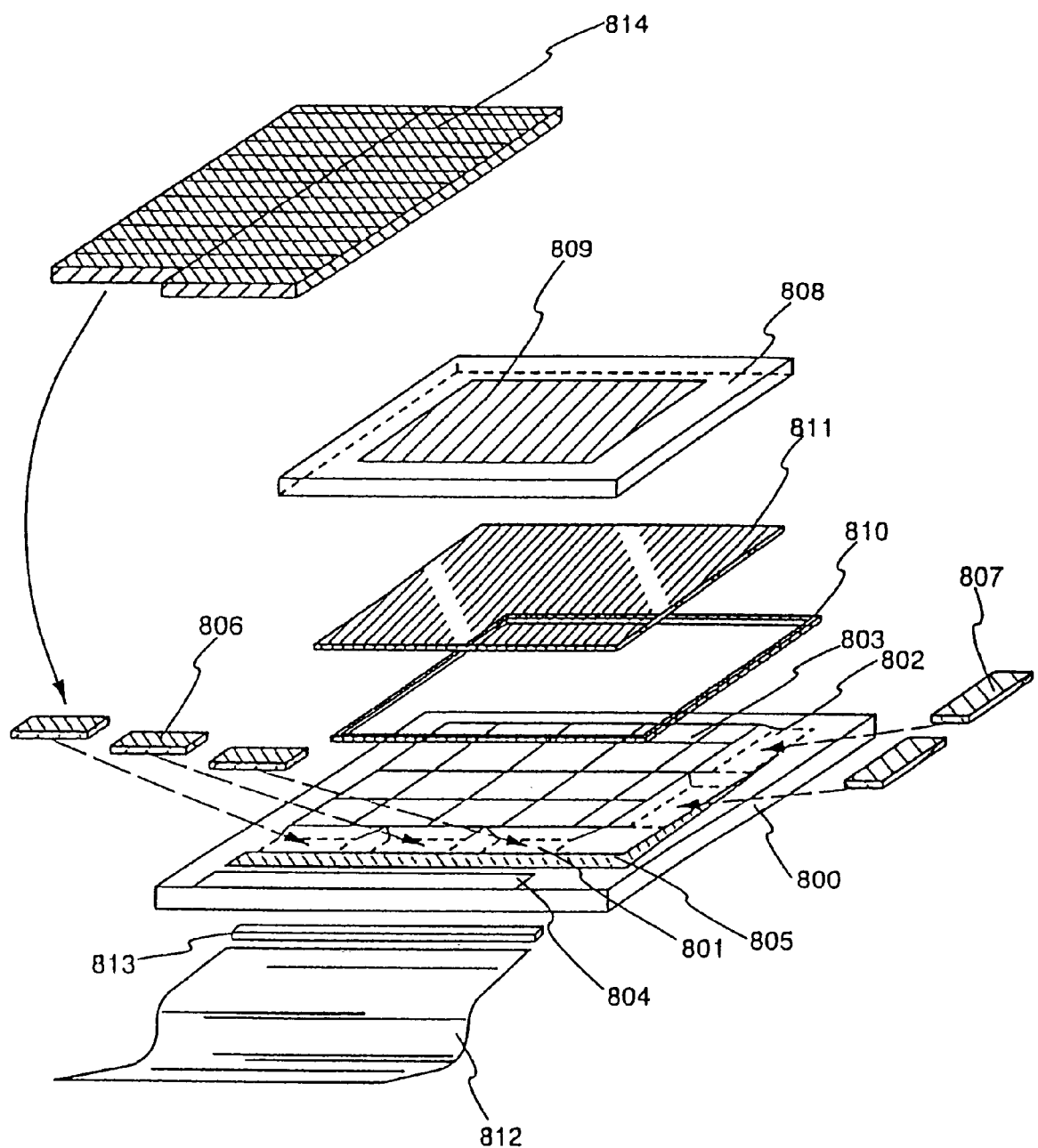
FIG. 22 shows an assembling of the liquid crystal display device in which the stick drivers are mounted.

FIG. 22 is a diagram schematically showing a state of a liquid crystal display device being constructed employing the stick driver of the present invention. A pixel region 803, an external input-output terminal 804, and a connection wiring 805 are formed on a first substrate. The regions enclosed by a dotted line are a region 801 for attaching the scanning line side stick driver and a region 802 for attaching the data line side stick driver. An opposing electrode 809 is formed in a second substrate 808, and the second substrate 808 is joined to the first substrate 800 by a sealing material 810. A liquid crystal is sealed inside the sealing material 810, forming a liquid crystal layer 811. The first substrate and the second substrate are joined together having a predetermined gap, and the gap is set from 3 to 8 μm for a nematic liquid crystal, and between 1 and 4 μm for a sumectic liquid crystal.

Stick drivers 806 and 807 have circuit structures, which differ between the data line side and the scanning line side as shown in FIG. 2. However, whatever is used, both are cut out of a third substrate 814. The stick driver is mounted on the first substrate, and that method is explained in Embodiment Mode 1 with FIG. 2 and FIGS. 3A and 3B. The stick driver shown in Embodiment Mode 2 is suitable for the stick driver mounted on the scanning line side, and the driver circuit is formed on a glass substrate. Even assuming partitioned driving, TFT characteristics which can respond to a high signal frequency is required for the stick driver mounted on the date line side, and therefore the stick driver formed on the quartz substrate shown in Embodiment Mode 3 or Embodiment Mode 4 is suitable. An FPC (flexible printed circuit) 812 is attached to an external input-output terminal 804 in order to input external power supply and control signals. In order to increase the adhesion strength of the FPC 812, a reinforcing plate 813 may also be formed. The liquid crystal display device can thus be completed. The final process yield of the liquid crystal display device can be increased by performing an electrical inspection before mounting the stick drivers on the first substrate, and further, the reliability can be increased.

Embodiment 6

The stick driver can be applied to a display device (EL display device) in which a light-emitting layer formed from an EL (electro luminescence) material is formed on a pixel region. The EL display device has the light-emitting layer formed on the pixel electrode directly. Accordingly, the second substrate, which is formed on an opposing side such as a liquid crystal display device, is not always necessary. The first substrate, on which a pixel region is formed, has an equivalent structure to that shown in FIG. 1. In the periphery of the pixel region, a lead line, a connection wiring and an external input terminal are formed, and the stick drivers are mounted on the scanning line side and the data line side, respectively. Note that the meaning of "light emission by an electro luminescence material" includes both of "fluorescence light emission" and "phosphorescence light emission", and either one or both of the light emission is included in this embodiment.

Figure 23A:
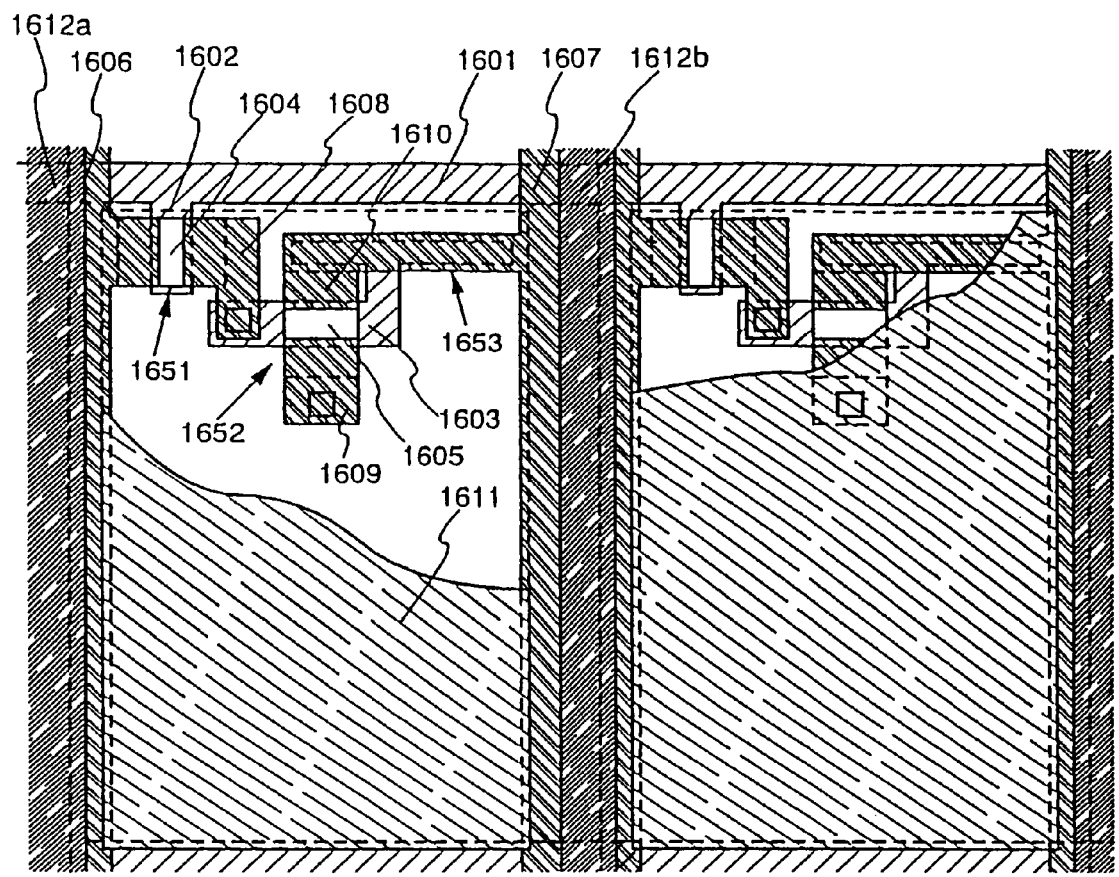
FIGS. 23A and 23B are a top view and a circuit diagram explaining an example of the structure of the pixel region of an EL display device.
Figure 23B:
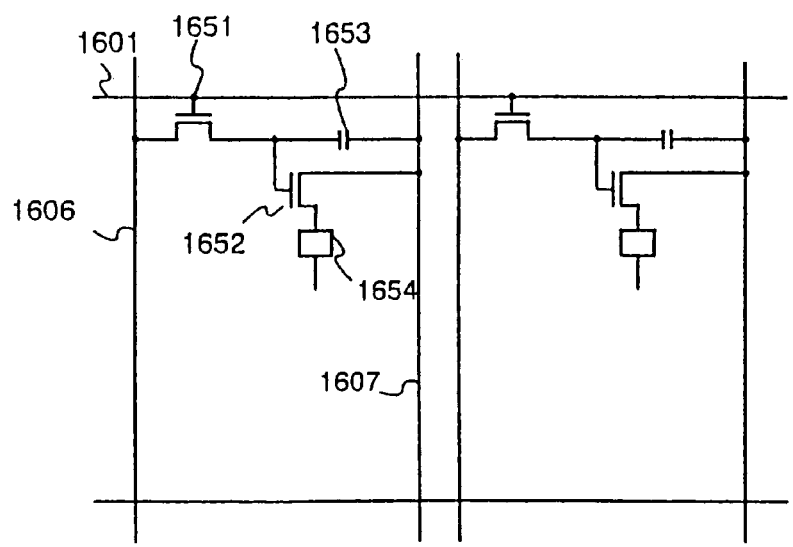

FIGS. 23A and 23B are drawings showing the structure of the pixel region of an El display. A switching TFT 1651 and a current controlling TFT 1652 are formed on the pixel region of the EL display device as shown in FIG. 23A as a typical mode. A gate electrode 1602 of the switching TFT 1651 is connected to a scanning line 1601, the source side is connected to a data line 1606, and a drain electrode 1608 is connected to a gate electrode 1603 of the current controlling TFT 1652. The TFT shown in FIG. 23A is an example of a bottom gate type, and the semiconductor layers 1602 and 1605 are formed from an amorphous silicon film. Besides, a capacitor portion 1653 is constructed of a source electrode 1610 and the gate electrode 1603 of the current controlling TFT 1652 via an insulating layer (not shown). The source electrode 1610 is connected to a power supply line 1607. A drain electrode 1609 is connected to a pixel electrode 1611 formed on an upper layer via an insulating layer. These source electrodes and drain electrodes may be formed from a material such as Al, Ti, Ta, and Mo, and an alloy material such as Mo—W can also be used. It is preferable to form the pixel electrode 1611 from a low resistance conductive material such as an aluminum alloy film, a copper alloy film, and a silver alloy film, or a lamination film thereof. Of course, it may employ a lamination structure with other conductive film.

FIG. 23B shows an equivalent circuit of the pixel region. A light-emitting layer 1654 is connected to the current controlling TFT 1652. The current controlling TFT is required to have a high current driving performance for driving a light-emitting layer formed from the EL material. Judging from its object, the semiconductor layer may be formed from an amorphous silicon germanium alloy film.

The light-emitting layer is formed in a groove (corresponding to a pixel) formed by the banks 1612*a* and 1612*b*, which are formed from an insulating film (preferably resin). As an organic EL material, which becomes the light-emitting layer, π-conjugated polymer materials are used. As a typical organic EL material, polyparaphenylene vinylene (PPV) based materials, polyvinylcarbazole (PVK) based materials, or polyfluorene based materials are exemplified. Although there are various types as the PPV organic EL material, for example, the material disclosed in "H. Shenk, H. Becker, O. Gelsen, E. Kluge, W. Kreuder, and H. Spreitzer, "Polymers for Light Emitting Diodes," Euro Display, Proceedings, 1999, p. 33-37", and the material disclosed in Japanese Patent Application Laid-open No. Hei 10-92576 may be used. Note that, although only one pixel is shown here, light-emitting layers corresponding to the respective colors of R (red), G (green) and B (blue) may be individually formed.

As the specific light-emitting layers, for the light-emitting layer that emits a red color, cyano polyphenylene vinylene may be used as the material thereof, for the light-emitting layer that emits a green color, polyphenylene vinylene may be used as the material thereof, and for the light-emitting layer that emits a blue color, polyphenylene vinylene or polyalkylphenylene may be used as the material thereof. The film thickness thereof may be set to 30 to 150 nm (preferably 40 to 100 nm). However, the above-mentioned examples are examples of the organic EL materials which can be used as the light-emitting layers, and therefore there is no need to limit thereto. The self-light-emitting layer (layer for light emission and carrier movement therefor) may be formed by freely putting a light-emitting layer, electric charge-transporting layer, or electric charge-injecting layer together. In this embodiment, for example, examples in which polymer based materials are used for the light-emitting layer, however, low molecular organic EL materials can be used therefor. Also, inorganic materials such as silicon carbide can be used for the electric charge-transporting layer or the electric charge-injecting layer. For these organic materials and inorganic materials, known material may be used.

In this embodiment, examples of active matrix EL display device are described, in which the light-emitting layer formed from the EL material is controlled by TFTs to been driven. However, even the passivation type EL display device, by arranging the stick drivers in the periphery of the pixel region, the display device can be completed as well. Whichever is used, in the pixel region and the driver circuit, the design rule to be required differ from each other, and therefore, the method of the present invention in which the pixel region and the driver circuit each are formed on the different substrates to be then put together, is suitable in view of increasing the manufacturing yield.

Embodiment 7

Figure 11:
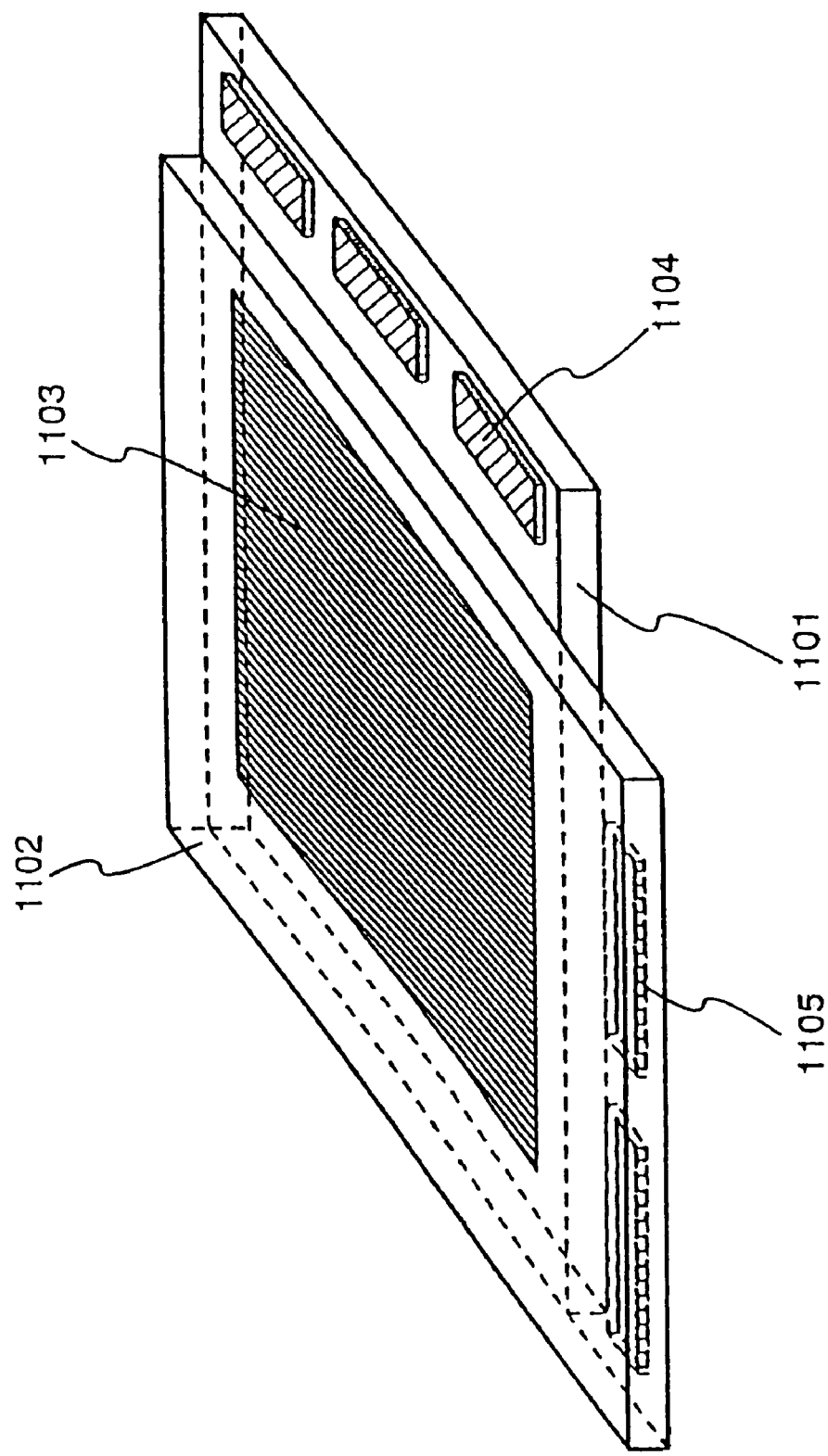
FIG. 11 a conceptual drawing of a passivation type display device in which the stick drivers are mounted.

The stick driver according to the present invention can be applied to the passivation type display device. FIG. 11 shows an example thereof, and stick drivers 1104 and 1105 are mounted on a first substrate 1101 and a second substrate 1105, respectively. A pixel region 1103 is formed by intersecting a plurality of strip-shaped electrodes formed on the first substrate 1101 side with a plurality of strip-shaped electrodes formed on the second substrate side. The stick drivers mounted on the first and second substrates are connected to the pixel electrodes, which are formed so as to correspond the respective substrates.

In FIG. 11, a liquid crystal layer is arranged between the first substrate and the second substrate, thereby capable of forming the liquid crystal display device. Further, the stick driver of the present invention can be applied to the EL display device, in which the light emitting layer is formed in the pixel region, though the structure thereof is different from the one shown in FIG. 11.

Embodiment 8

The stick driver can be applied to an active matrix display device of an IPS (in-plane switching) system (lateral electric field system) and an MVA (multi-domain vertical alignment) liquid crystal display device, other than the display device having an active matrix type pixel structure shown in Embodiment 4 and the display device having a passivation type pixel structure shown in Embodiment 7. In addition, the stick driver of the present invention can be applied to an active matrix liquid display device in which MIM elements are arranged in its pixel.

Embodiment 9

From the view point of the productivity of the stick driver, a suitable is such that as many stick drivers as possible are cut out from one substrate in one process. A glass substrate or a quartz substrate is used as the substrate, whichever is used, when dividing the large surface area substrate, a first problem is how process loss can be eliminated. From the view point of process precision, a dicing apparatus is suitable, but in order to directly process substrates used by liquid crystal lines of 300×400 mm, 550×650 mm, and in addition, 960×1000 mm, the scale of the apparatus becomes large. If anything, a glass scriber, although having inferior processing precision, but which can easily section a large surface area substrate, is used. By doing so, the process is appropriately divided into a first stage of dividing the large surface area substrate into a plurality of pieces, and a second stage of partitioning each of the stick drivers from the plurality of divided substrate by using the dicing device.

For example, a plurality of groups 902 made from a region having a size of 100 to 200 mm on a substrate with a surface area of 300×400 mm employed by a first generation liquid crystal line, and a plurality of stick drivers having a short side length of 1 to 6 mm are placed within. The spacing between each group is arranged between 3 and 10 mm, and they are divided out from the large surface area substrate by the glass scriber along process lines 904. The stick driver within the group are arranged in increments of 0.5 to 1 mm, and a method of dividing by using the dicing apparatus can be employed. If this type of process method is used, 360 stick drivers having a 2×20 mm size can be built into a 127×127 mm group, and 2160 stick drivers can be taken out of one substrate.

Further, a second problem in forming a plurality of stick drivers on a large surface area substrate is an exposure technique. The stick driver design rule is from 0.3 to 2 μm, preferably between 0.35 and 1 μm. With this type of design rule, it is necessary to perform exposure with good throughput. For the method of exposure, a proximity method and a projection method are effective in increasing the throughout, but there are disadvantages, such as a large size, high precision mask is necessary, and high resolution and precise alignment are difficult to obtain. On the other hand, with a stepper method as one example, an i-line (365 nm) is used and 44 mm square regions at a resolution of 0.7 μm, or 54×30 mm regions, can be exposed at a single time. Corresponding to this, if the length of the longer side of the stick driver is made to be within this exposure range, then even with a sub-micron pattern, it is possible to perform exposure with good efficiency.

It is not necessarily required to have a sub-micron design rule for the pixel region of a device such as a liquid crystal display device, and therefore the proximity method and the projection method can be considered to be suitable methods capable of exposing a large surface area at once. Therefore, performing different exposure methods for the driver circuit portion and the pixel region is not only for increasing productivity. Rather, by mounting the stick drivers as in the present invention, it becomes possible to reduce the surface area of a peripheral portion (frame region) of a large screen display device.

Embodiment 10

Figure 24:
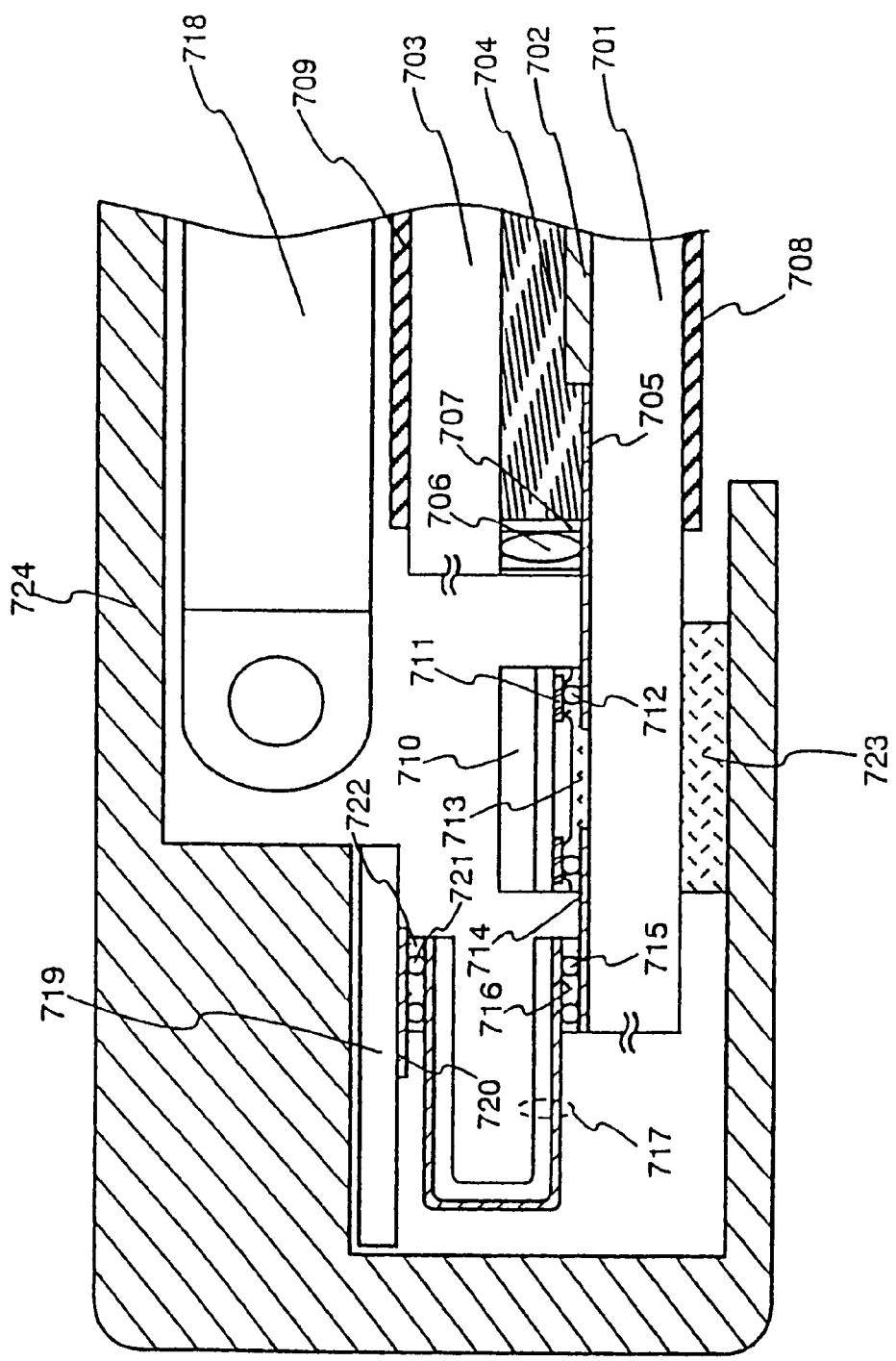
FIG. 24 is a diagram explaining an example of mounting a display device to a housing of an electro-optical device.
Figure 25:
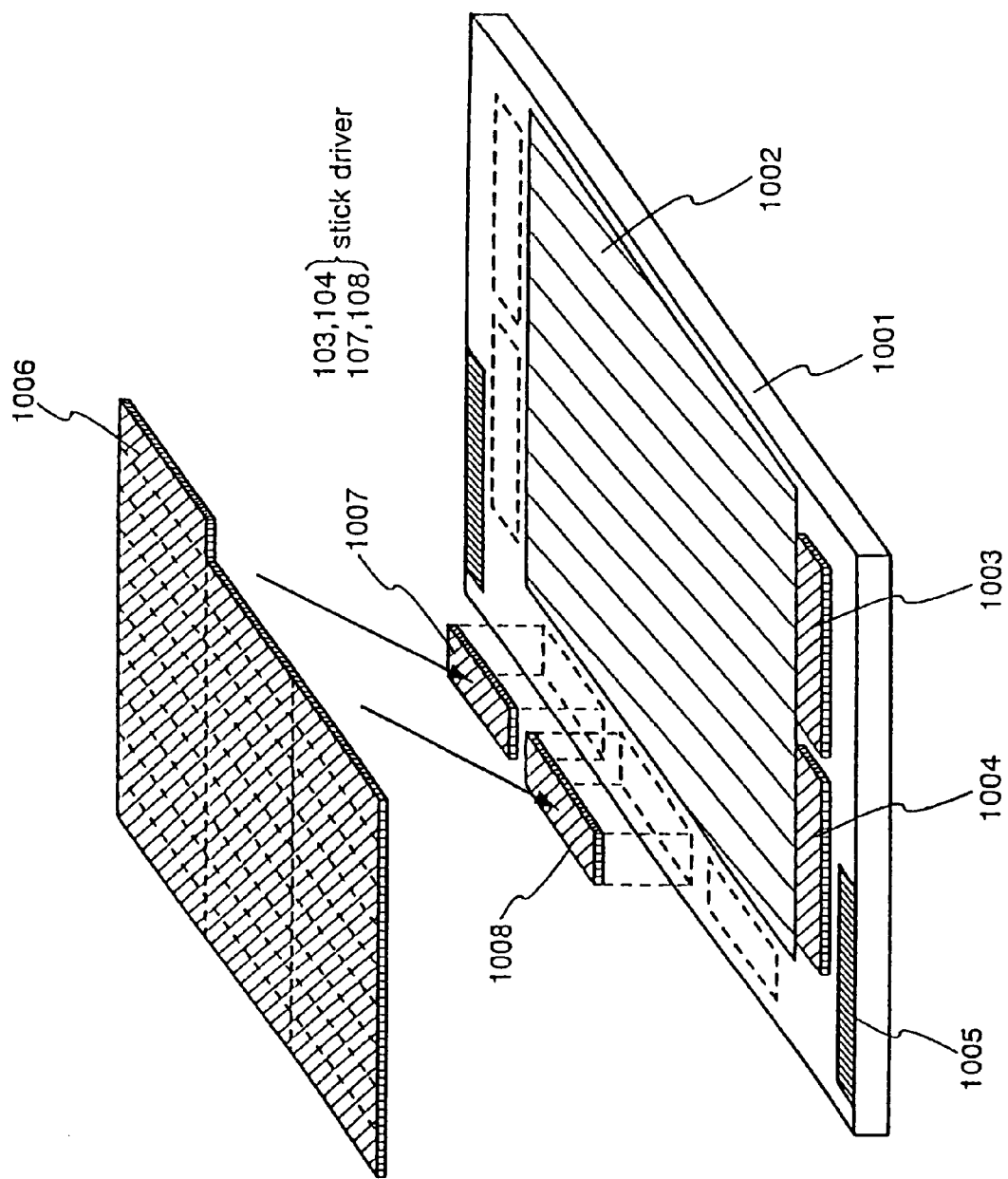
FIG. 25 is a conceptual diagram of an active matrix display device in which the stick drivers are mounted.

FIG. 24 shows an example of incorporating a display device into an electro-optical device, in which a stick driver is mounted as shown in Embodiment 5. In the display device, a stick driver 710 is mounted in an edge portion of a substrate 701 on which pixel region 702 is mounted. The substrate 701 is joined to an opposing substrate 703 with a sealing agent 707 which contains a spacer 706 therein, and further polarizing plates 708 and 709 are formed thereon. Then, the display device is fixed to a housing 724 with a connecting member 723.

The stick driver 710 is connected through an input/output terminal 711 to an input/output wiring 714 formed from a resin 713 containing a conductive particle 712, formed on the substrate 701. One end of the input/output wiring 714 is bonded to a flexible printed circuit (FPC) with a resin 716 containing a conductive particle 715. The FPC is also connected to a printed board 719 on which a signal processing circuit, an amplifier circuit, a power source circuit, etc. are formed, in a similar manner (with a resin 722 containing a conductive particle 721), so that a signal necessary for image display is transmitted to a display device on which the stick driver is mounted. If the display device is a transmissive type display device, a light source and a light conductive member is provided on the opposing substrate side to work as a back light 718.

The mounting method of the display device described here is merely one example, and therefore in correspondence with modes of the electronic devices can be appropriately assembled.

Embodiment 11

Semiconductor devices having an incorporated display device structured as in Embodiment 8 are shown in this embodiment. The following can be given as examples of such semiconductor devices: a portable information terminal (such as a personal organizer, a mobile computer, and a mobile telephone); a video camera; a still camera; a personal computer; and a television receiver. Examples of these electronic devices are shown in FIGS. 26A to 26E and 27A to 27C.

Figure 26A:
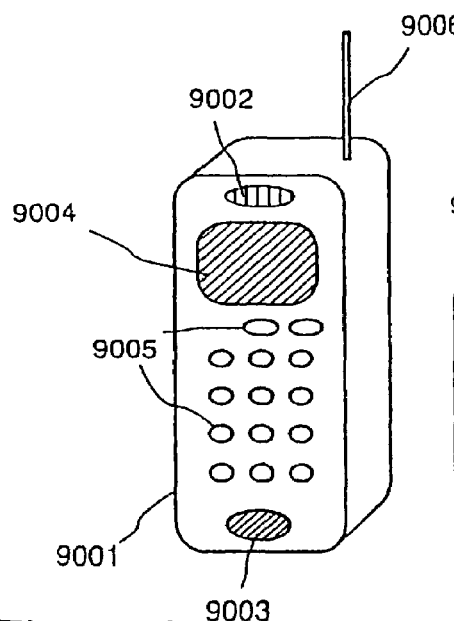
FIGS. 26A to 26E are diagrams explaining examples of semiconductor devices.

FIG. 26A is a portable telephone, and is composed of a main body 9001, an audio output portion 9002, an audio input portion 9003, a display device 9004, operation switches 9005, and an antenna 9006. For the display device 9004, an active matrix type and a passivation type liquid crystal display devices and an EL display device can be used.

Figure 26B:
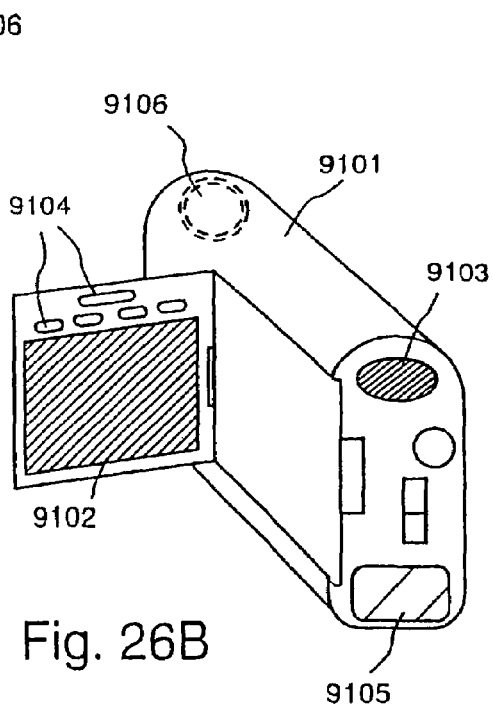

FIG. 26B is a video camera, and is composed of a main body 9101, a display device 9102, an audio input portion 9103, operation switches 9104, a battery 9105, and an image receiving portion 9106. For the display device 9102, an active matrix type and a passivation type liquid crystal display devices and an EL display device can be used.

Figure 26C:
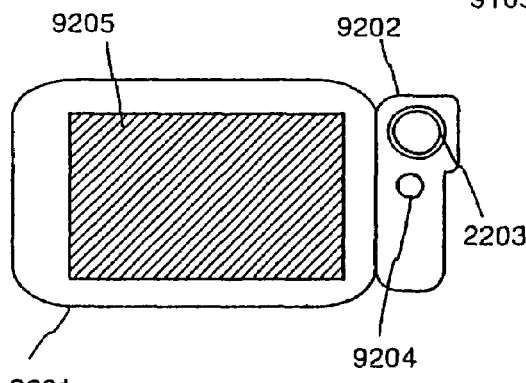

FIG. 26C is a mobile computer or a portable information terminal, and is composed of a main body 9201, a camera portion 9202, an image receiving portion 9203, operation switches 9204, and a display portion 9205. For the display device 9205, an active matrix type and a passivation type liquid crystal display devices and an EL display device can be used.

Figure 26D:
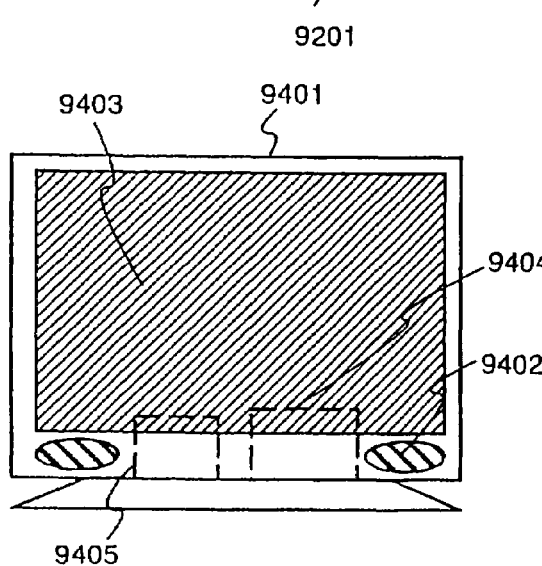

FIG. 26D is a television, and is composed of a main body 9401, speakers 9402, a display device 9403, a receiver device 9404, and an amplifying device 9405. For the display device 9403, an active matrix type and a passivation type liquid crystal display devices and an EL display device can be used.

Figure 26E:
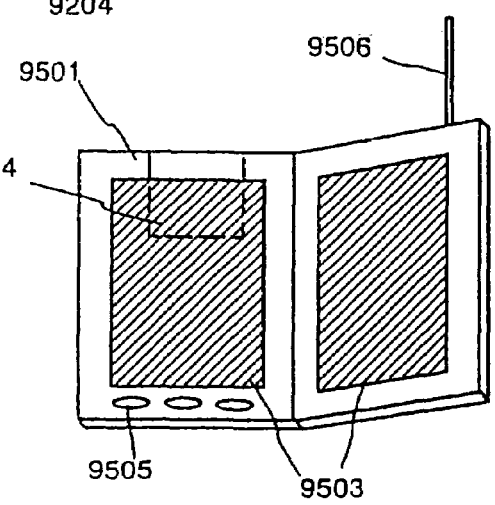

FIG. 26E is a portable book, and is composed of a main body 9501, display devices 9502 and 9503, a recording medium 9504, operation switches 9505, and an antenna 9506, and displays data recorded on a mini-disk (MD) or a DVD, and data received by the antenna. For the direct view display devices 9502 and 9503, an active matrix type and a passivation type liquid crystal display devices and an EL display device can be used.

Figure 27A:
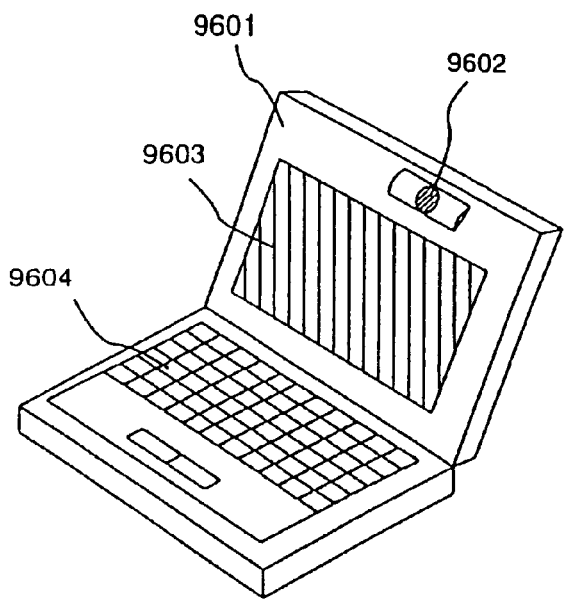
FIGS. 27A to 27C are diagrams explaining examples of semiconductor devices.

FIG. 27A is a personal computer, and is composed of a main body 9601, an image input portion 9602, a display device 9603, and a keyboard 9604. For the display device 9603, an active matrix type and a passivation type liquid crystal display devices and an EL display device can be used.

Figure 27B:
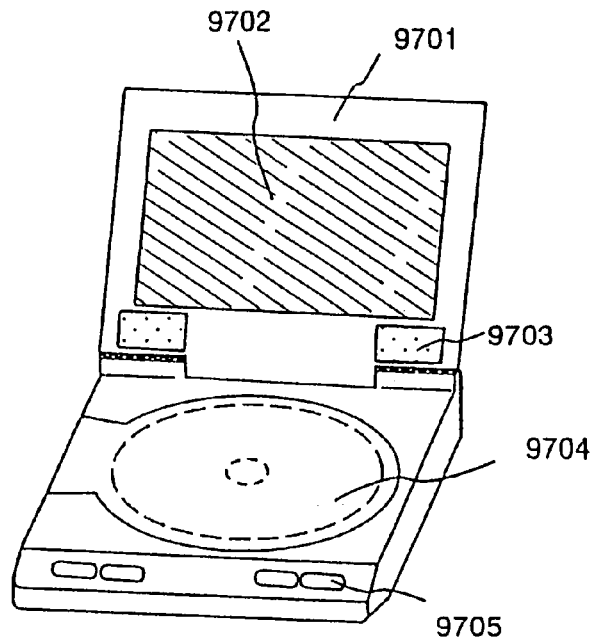

FIG. 27B is a player using a recording medium having recorded a program thereon (hereafter referred to as recording medium), and is composed of a main body 9701, a display device 9702, a speaker portion 9703, a recording medium 9704, and operation switches 9705. Note that this device uses a medium such as DVD (digital versatile disk) or a CD as a recording medium, and can be used for music appreciation, film appreciation, games, and accessing the Internet. For the display device 9702, an active matrix type and a passivation type liquid crystal display devices and an EL display device can be used.

Figure 27C:
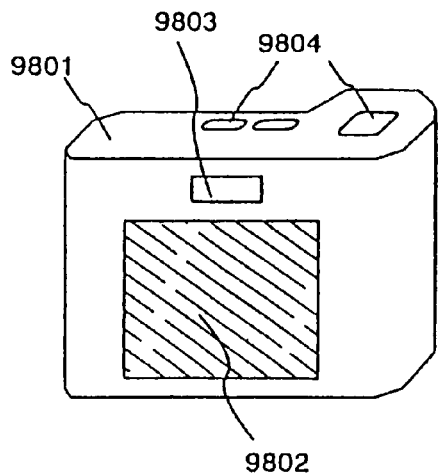

FIG. 27C is a digital camera, and is composed of a main body 9801, a display device 9802, an eyepiece 9803, operation switches 9804, and an image receiving portion (not shown). For the display device 9802, an active matrix type and a passivation type liquid crystal display devices and an EL display device can be used.

Embodiment 12

From the view point of the productivity of the stick driver, a suitable is such that as many stick drivers as possible are cut out from one substrate in one process. A glass substrate or a quartz substrate is used as the substrate, whichever is used, when dividing the large surface area substrate, a first problem is how process loss can be eliminated. From the view point of process precision, a dicing apparatus is suitable, but in order to directly process substrates used by liquid crystal lines of 300×400 mm, 550×650 mm, and in addition, 960×1000 mm, the scale of the apparatus becomes large. If anything, a glass scriber, although having inferior processing precision, but which can easily section a large surface area substrate, is used. By doing so, the process is appropriately divided into a first stage of dividing the large surface area substrate into a plurality of pieces, and a second stage of partitioning each of the stick drivers from the plurality of divided substrate by using the dicing device.

Figure 28:
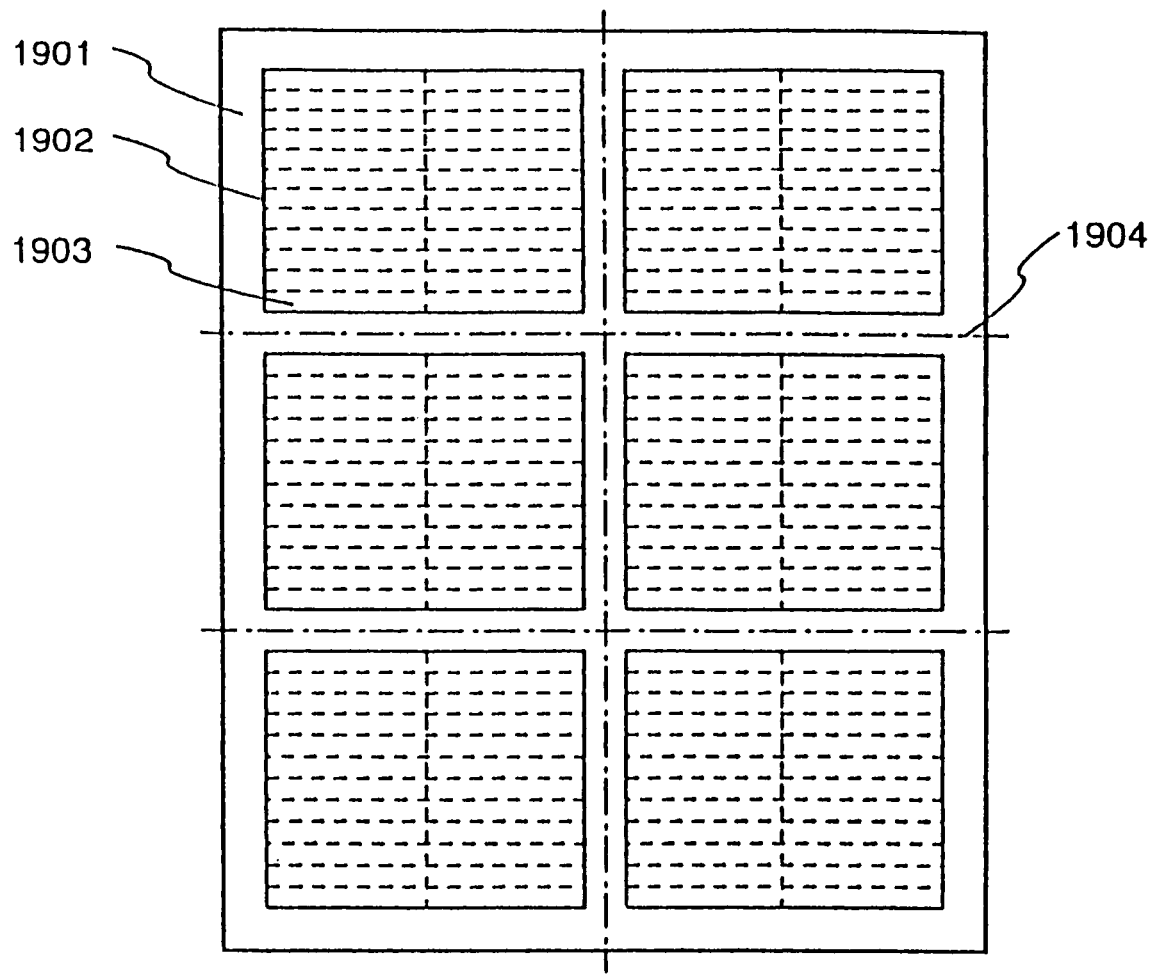
FIG. 28 is a diagram explaining a layout when multiple number of the stick drivers are formed on a large area substrate.

As shown in FIG. 28, a plurality of groups 1902 made from a region having a large size of 100 to 200 mm on a substrate 1901 with a large surface area, and a plurality of stick drivers having a short side length of 1 to 6 mm are placed within. The spacing between each group is arranged between 3 and 10 mm, and they are divided out from the large surface area substrate by the glass scriber along process lines 904. The stick driver within the group are arranged in increments of 0.5 to 1 mm, and then divided by using the dicing apparatus.

If this type of process method is used, for example, even if a substrate with a surface area of 300×400 mm employed by a first generation liquid crystal line, 360 stick drivers having a 2×20 mm size can be built into a 127×127 mm group, and 2160 stick drivers can be taken out of one substrate.

Further, a second problem in forming a plurality of stick drivers on a large surface area substrate is an exposure technique. The stick driver design rule is from 0.3 to 2 μm, preferably between 0.35 and 1 μm. With this type of design rule, it is necessary to perform exposure with good throughput. For the method of exposure, a proximity method and a projection method are effective in increasing the throughout, but there are disadvantages, such as a large size, high precision mask is necessary, and high resolution and precise alignment are difficult to obtain. On the other hand, with a stepper method as one example, an i-ray (365 nm) is used and 44 mm square regions at a resolution of 0.7 μm, or 54×30 mm regions, can be exposed at a single time. Corresponding to this, if the length of the longer side of the stick driver is made to be within this exposure range, then even with a sub-micron pattern, it is possible to perform exposure with good efficiency.

It is not necessarily required to have a sub-micron design rule for the pixel region of a device such as a liquid crystal display device, and therefore the proximity method and the projection method can be considered to be suitable methods capable of exposing a large surface area at once. Therefore, performing different exposure methods for the driver circuit portion and the pixel region is not only for increasing productivity. Rather, by mounting the stick drivers as in the present invention, it becomes possible to reduce the surface area of a peripheral portion (frame region) of a large screen display device.

Embodiment 13

A shift register circuit, a buffer circuit, a latch circuit and the like, which are constructed of a CMOS circuit as a basic structure, are formed on a stick driver. A method of manufacturing a TFT for forming those circuits is described with reference to FIG. 31.

In FIG. 31A, a glass substrate such as barium borosilicate glass or aluminum borosilicate glass, represented by a #7059 glass or a #1737 glass of Corning Corp., is used as a substrate 5501. This type of glass substrate shrinks even slightly due to heat treatment, and therefore, a glass substrate subjected to heat treatment which is 500 to 650° C. lower than the glass distortion point, may be used.

A blocking layer 5502 is formed in order to prevent diffusion into a semiconductor layer of materials such as alkaline metals contained in microscopic amounts within the substrate 5501, and is formed from an insulating film such as a silicon oxide film, a silicon nitride film, or an oxynitride silicon film. Further, in order to stabilize the threshold voltage ($V_{th}$) of the TFT, it is preferable to make the stress of the blocking layer into a tensile stress. The stress can be controlled by the manufacturing conditions of the above insulating film. For example, the blocking layer can be formed by laminating a 10 to 200 nm (preferable between 50 and 100 nm) thick oxynitride silicon film 5502a manufactured by plasma CVD from $SiH_4$, $NH_3$, and $N_2O$, and a 50 to 200 nm (preferably from 100 to 150 nm) thick oxynitride silicon film 5502b manufactured similarly by plasma CVD using $SiH_4$ and $N_2O$. In FIG. 11, though a base film 5502 has a two-layers structure, it may have a single-layer structure or a lamination structure consisting of the insulating films.

A crystalline semiconductor film obtained by crystallizing a semiconductor film having an amorphous structure with a laser crystallization method or a thermal crystallization method, is used for crystalline semiconductor layers 5503 and 5504, which are shaped into island like. The crystalline semiconductor layers 5503 and 5504 are given a thickness of from 25 to 80 nm (preferably 30 to 60 nm). There is no limitation on the material of the crystalline semiconductor film, but silicon or an alloy of silicon germanium (SiGe) is preferably used.

To form the crystalline semiconductor film by the laser crystallization method, a gas laser typified with a pulse oscillation type or a continuous-wave excimer laser, a solid laser typified with a YAG laser, or $YVO_4$ laser is used. In the case where such laser is used, it is appropriate to use a method in which laser light radiated from a laser oscillator is condensed by an optical system into a linear beam, and is irradiated to the amorphous semiconductor film. Although the condition of crystallization should be properly selected by an operator, in the case where the excimer laser is used, a pulse oscillation frequency is made 30 Hz, and a laser energy density is made 100 to 400 mJ/cm² (typically 200 to 300 mJ/cm²). Also, in the case where the YAG laser is used, it is appropriate that the second harmonic is used, and a pulse oscillation frequency is made 1 to 10 Hz, and a laser energy density is made 300 to 600 mJ/cm² (typically, 350 to 500 mJ/cm²). Then, laser light condensed into a linear shape with a width of 100 to 1000 μm, for example, 400 μm is irradiated to the whole surface of the substrate, and an overlapping ratio (overlap ratio) of the linear laser light at this time is made 80 to 98%.

A gate insulating film 5505 is formed from an insulating film containing silicon by using plasma CVD or sputtering into a thickness of from 40 to 200 nm. An oxynitride silicon film formed from a mixture gas of $SiH_4$ and $N_2O$ by plasma CVD is suitable for the gate insulating film, and is formed into a thickness of 80 nm to obtain the gate insulating film. Of course, the gate insulating film is not limited to such oxynitride silicon film, but another insulating film containing silicon may be used as a single-layer structure or a lamination structure. For example, in the case where a silicon oxide film is used, TEOS (tetraethyl ortho silicate) and $O_2$ are mixed with each other by the plasma CVD method, a reaction pressure is made 40 Pa, a substrate temperature is made 300 to 400° C., and discharge is made at a high frequency (13.56 MHz) with a power density of 0.5 to 0.8 W/cm², to form the film. Then, the silicon oxide film thus formed is subjected to thermal annealing at 400 to 500° C. to obtain excellent characteristics as the gate insulating film.

Then, a first conductive film 5506 and a second conductive film 5507, for forming a gate electrode on the gate insulating film 5505. The gate electrode of TFT according to this embodiment is formed into two-layers structure, and the first conductive film 5506 is formed from a tantalum (Ta) film into a thickness of 50 to 100 nm, and the second conductive film is formed from a W film into a thickness of 100 to 300 nm.

The Ta film is formed by sputtering using TA as a target. When a suitable amount of Xe or Kr is added to Ar for sputtering, it is possible to relieve internal stress of the Ta film, thereby being capable of preventing the film from peeling. The resistivity of an á-phase Ta film is on the order of 20 μΩcm and can be used as the gate electrode. However, the resistivity of a β-phase Ta film is on the order of 180 μΩcm, thereby being not suitable for the gate electrode. To form the á-phase Ta film, if tantalum nitride having crystalline structure close to the á-phase of Ta is formed to a thickness of on the order of 10 to 50 nm as a base of Ta, the á-phase Ta film can be easily obtained.

The W film is formed by sputtering with a W target. In addition, the W film can be formed by thermal CVD using tungsten hexafluoride ($WF_6$). Whichever method is used, it is necessary to make the material have low resistance for use as the gate electrode. By making the crystal grains large, it is possible to make the W film have lower resistivity. However, for cases when there are many impurity elements such as oxygen within the W film, crystallization is inhibited and the resistance becomes higher. By forming the W film using a target having a purity of 99.9999%, and in addition, taking sufficient consideration so that there is no mixing in of impurities within the gas phase during film formation, a resistivity of 9 to 20 μΩcm can be realized.

A mask 5508 is formed from resist, as shown in FIG. 31B, and a first etching process is performed. There are no limitation placed on the etching process, but preferably an ICP (inductively coupled plasma) etching apparatus is used, and the etching is performed using $CF_4$ and $Cl_2$ as etching gasses, at a pressure of 0.5 to 2 Pa, preferably at 1 Pa, with an RF (13.56 MHz) input of 500 W from a coil shape electrode, performing plasma generation. A 100 W RF (13.56 MHz) power is inputted to the substrate side (sample stage) as well, substantially applying a negative self bias voltage. When $CF_4$ and $Cl_2$ are mixed together, the W film and the Ta film can be etched at approximately the same rate.

In the first etching process, processing is performed so that edge portions of the first conductive film and the second conductive film are made into a tapered shape. The angle of the tapered portion is set from 15 to 45°. However, in order to etch without any residue remaining on the gate insulating film, an over-etching process, in which the etching time is increased by a ratio on the order of 10 to 20%, may be performed. The selectivity of the oxynitride silicon film is 2 to 4 (typically 3) with respect to the W film, and therefore the oxynitride silicon film is etched on the exposed surface by approximately 20 to 50 nm due to the over-etching process. First shape conductive layers 5509 to 5510 (first conductive layers 5509a to 5510a and second conductive layers 5509b to 5510b) are thus formed from the first conductive film and the second conductive film by the first etching process. Reference numeral 5511 denotes an gate insulating film, and regions which are not covered with the first shape conductive layers 5509 to 5510 are etched by about 20 to 50 nm so that thinned regions are formed.

Then, a first doping treatment is carried out to add an impurity element to give an n-type. Doping may be carried out by ion doping or ion injecting. The condition of the ion doping method is such that a dosage is $1 \times 10^{13}$ to $5 \times 10^{14}$ atoms/cm², and an acceleration voltage is 60 to 100 keV. As the impurity element to give the n type, an element belonging to group 15, typically phosphorus (P) or arsenic (As) is used. When the doping is carried out by ion doping, the first shape conductive layers 5509 to 5510 become masks to the impurity element to give the n type, and first impurity regions 5520 to 5523 are formed in a self aligning manner. The phosphorus (P) in the concentration range of $1 \times 10^{20}$ to $1 \times 10^{21}$ atoms/cm³ is added thereto.

A second etching process is performed next, as shown in FIG. 31C. The ICP etching device is used, and $CF_4$, $Cl_2$, and $O_2$ are mixed in an etching gas, and an RF power (13.56 MHz) of 500 W is applied to a coil type electrode under a pressure of 1 Pa to generate plasma. An RF (13.56 MHz) power of 50 W is applied to the side of the substrate (sample stage) and a low self bias voltage as compared with the first etching treatment is applied. The W film is anisotropically etched in accordance with these conditions, and the Ta film is anisotropically etched at a slower etching rate, forming second shape conductive films 5514 to 5515 (first conductive layers 5514a to 5515a and second conductive layers 5514b to 5515b). Reference numeral 5516 is a gate insulating film, and a region not covered by the second shape conductive layers 5514 to 5515 are etched on the order of 20 to 50 nm, so that thinned regions are formed.

Figure 31D:
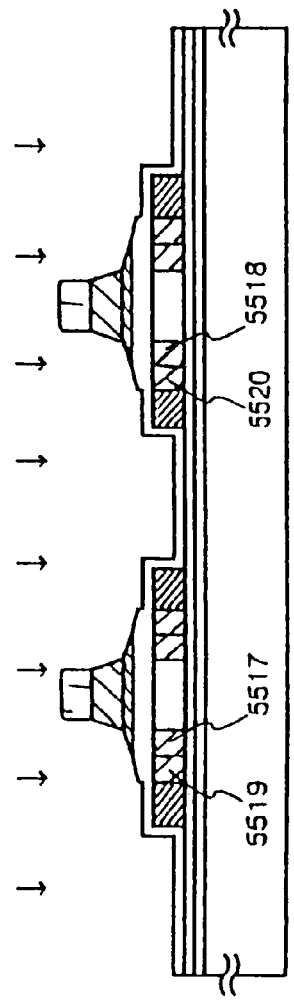

Then, as shown in FIG. 31D, a second doping treatment is carried out. In this case, a dosage is made lower than that of the first doping treatment and under the condition of a high acceleration voltage, and an impurity element to give the n type is doped. For example, an acceleration voltage is made 70 to 120 keV, and the treatment is carried out at a dosage of $1 \times 10^{13}$ atoms/cm², so that new impurity regions are formed inside of the first impurity regions formed into the island-shape semiconductor layers in FIG. 3B. Doping is carried out using as the masks the second shape conductive layers 5514 to 5515 to add the impurity element to the regions under the second conductive layers 5514a and 5515a. In this way, third impurity regions 5517 to 5518 overlapping with the second conductive layers 5514a and 5515a, and second impurity regions 5519 to 5520 between the first impurity regions and the third impurity regions are formed. The concentration of phosphorus to be added is set so that the concentration of the second impurity regions become $1 \times 10^{17}$ to $1 \times 10^{19}$ atoms/cm³, and the concentration of the third impurity regions become $1 \times 10^{16}$ to $1 \times 10^{18}$ atoms/cm³.

Figure 31E:
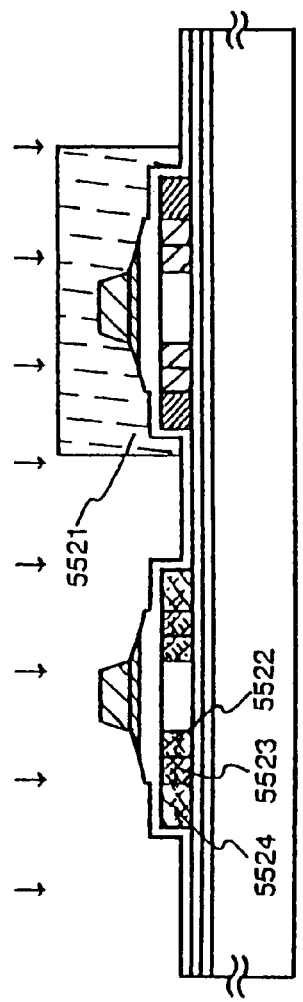

Then, as shown in FIG. 31E, fourth impurity regions 5522 to 5524 are formed, to which impurity elements that impart p type to an island-like semiconductor layer for forming p-channel type TFTs is added. At this time, the whole surfaces of the island-like semiconductor layer 5504 forming n-channel TFTs is covered with resist masks 5521. Phosphorus is added to the impurity regions 5522 to 5524 at different concentrations, respectively. However, the regions are formed by ion doping using diborane ($B_2H_6$) and the impurity concentration is made $2 \times 10^{20}$ to $2 \times 10^{21}$ atoms/cm³ in any of the regions.

By the steps up to this, the impurity regions are formed in the respective island-like semiconductor regions. The second shape second conductive layers 5514 to 5515 function as gate electrodes. A process of activating the impurity elements added into each of the semiconductor layers is performed next with the aim of controlling the conductivity type. Thermal annealing using an annealing furnace, laser annealing, or rapid thermal annealing (RTA) can be applied to this process. Thermal annealing is performed at 400 to 700° C., typically between 500 and 600° C., in a nitrogen atmosphere having an oxygen concentration equal to or less than 1 ppm, preferably equal to or less than 0.1 ppm.

Laser annealing uses excimer laser light having a wavelength equal to or less than 400 nm, or the second harmonic (532 nm) of a YAG laser or a YVO₄ laser. The conditions of activation may be appropriately selected by the operator, and when the excimer laser is used, the pulse emission frequency is set to 30 Hz and the laser energy density is set from 100 to 300 mJ/cm². Further, when the YAG laser is used, the second harmonic is used, with the pulse emission frequency set from 1 to 10 KHz, and the laser energy density may be set from 200 to 400 mJ/cm². The laser light, which is condensed into a linear shape having a width from 100 to 1000 μm, for example 400 μm, is then irradiated over the entire substrate surface, and the process is performed at this point so that the overlap ratio of the linear shape laser light is from 80 to 98%.

In addition, a hydrogenation process of the semiconductor layer is performed by performing heat treatment for 1 to 12 hours at 300 to 450° C. in an atmosphere containing between 3 and 100% hydrogen. This process is one of terminating dangling bonds in the semiconductor layers by thermally excited hydrogen. Plasma hydrogenation (using hydrogen, which is excited by the plasma) may also be used as another means of hydrogenation.

Figure 31F:
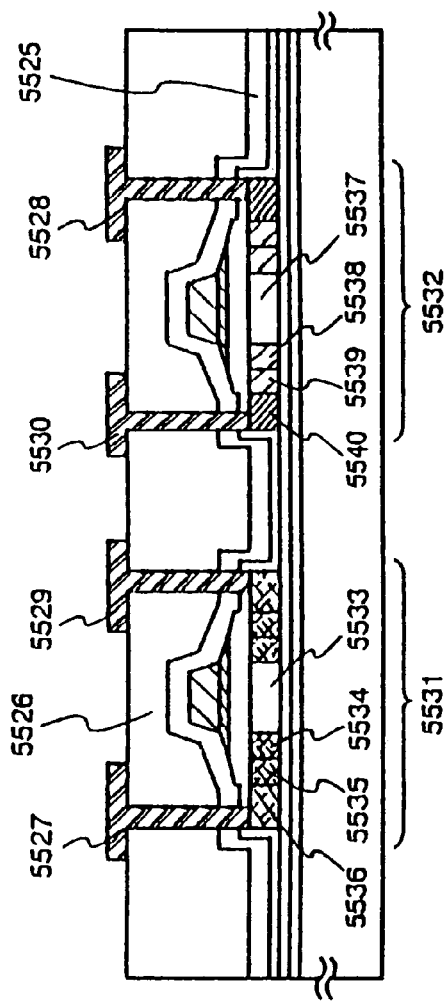

In FIG. 31F, a first interlayer insulating film 5525 is formed from a silicon Oxynitride film into a thickness of 100 to 200 nm. A second interlayer insulating film 5526 formed from an organic insulating material is formed thereon. The second interlayer insulating film 5526 is formed with an average film thickness of 1.0 to 2.0 μm. As the organic insulating material, there can be used polyimide, acrylic, polyamide, polyimide-amide, BCB (benzocyclobutene), and the like. For example, when using a thermally setting type polyimide after application to the substrate, it is formed by annealing in a clean oven at 300° C. Further, when acrylic is used, a two-liquid type is used, and after mixing a main material and a hardening agent, it is applied to the entire substrate by using a spinner, after which provisional heat treatment is performed on a hotplate for 60 seconds at 80° C., and then annealing is performed for 60 minutes at 250° C. using a clean oven.

Wirings 5527 to 5530 for contacting the first impurity regions or the fourth impurity regions formed in the semiconductor layers are then formed. The wirings are formed from a 50 to 200 nm-thick-Ti film, a 100 to 300 nm-thick-Al film, and a 50 to 200 nm-thick-tin (Sn) film or Ti film. The wirings 5527 to 5530 formed by this type of structure, the Ti film formed first contacts the semiconductor layers and the heat resistance of the contact portion is increased.

In the manner described above, the driver circuit having the p-channel type TFT 5530 and the n-channel type TFT 5531 can thus be formed. The p-channel type TFT 5530 has: a channel forming region 5532; a fourth impurity region 5533 overlapping the second conductive film 5514 (gate electrode); and a fourth impurity region 5534 formed externally to the gate electrode; and an impurity region 5535 that forms contacts with wirings 5527 and 5529. The impurity regions formed on the p-channel type TFTs function as sources or drains. The n-channel type TFT 5531 has: a channel forming region 5536; a third impurity region 5537 (GOLD region: gate overlapped drain overlapping the second conductive layer 5515 (gate electrode); and a second impurity region 5538 (LDD region: lightly doped drain) formed externally to the gate electrode; and a first impurity region 5539 functioning as a source region or a drain region. Like this, provision of the third impurity region (GOLD region) enables to prevent the degradation of the TFT due to the hot carrier, and even if a high voltage equal to or greater than 10 V is applied, extremely stable operation can be obtained. In addition, provision of the second impurity region enable the off current to be lower.

According to the manufacturing process shown in FIG. 11, TFT that forms a CMOS circuit can be formed with 5 sheets of photomasks. Specifically, it consists of: a mask (Pm1) for partitioning the semiconductor layer into an island-shape; a mask (PM2) for forming a gate electrode; a mask (PM3) for doping; a mask (PM4) for forming a contact hole; and a mask (PM5) for forming wiring. However, according to the manufacturing step shown in FIG. 31, it is possible to incorporate two kinds of LDD regions into n-channel TFT as described above. That is, not only forming a structure that enhances the stability of TFT, but also reducing the manufacturing steps, thereby enabling the improvement of yields and the drastic reduction of manufacturing costs.

The stick driver is formed by using the TFTs manufactured in this way. In particular, the n-channel type TFT 5531 shown in FIG. 31F is suitable for the buffer circuit etc. to which a high voltage on the order of 30 V is applied. Processes of forming the n-channel type TFTs and the p-channel type TFTs are described here, but it can be assumed that the same process can be easily used to form a capacitor element or a resistive element, thereby being omitted. Furthermore, the TFT size required for circuit formation (channel length/channel width) and the layout may suitably determined by the operator.

Embodiment 14

Figure 32D:
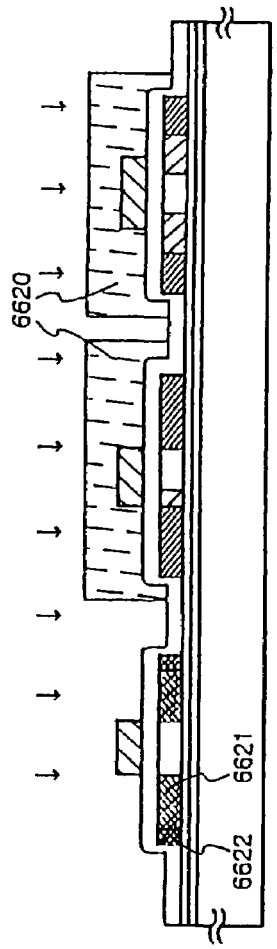

Another example of the TFT manufactured by the different process of FIGS. 31A to 31F, which is suitable to the stick driver, is described with reference to FIGS. 32A to 32E. In FIG. 32A, a substrate 6601, blocking layers 6602 (6602a to 6602b), semiconductor layers 6603 to 6605 formed into an island-shape are equivalent to that of Embodiment 13, and therefore description thereof is omitted.

For the purpose of controlling a threshold voltage (Vth) of n-channel TFT, an impurity element imparting p type may be added to semiconductor layers 6604 and 6605 at a concentration on the order of $1\times10^{16}$ to $5\times10^{17}$ atoms/cm$^3$. A gate insulating film 6606 is formed by plasma CVD or sputtering using an insulating film containing silicon into a thickness of 40 to 200 nm. For example, the gate insulating film is formed from a silicon oxynitride film into a thickness of 75 nm. The silicon oxynitride film formed by adding $O_2$ into $SiH_4$ and $N_2O$ is reduced in a stationary electric field density, thereby being suitable as the material for this purpose. Of course, the gate insulating film is not limited to this type of oxynitride film, and the insulating film containing silicon may be formed into a single layer or a lamination structure.

Then, in order to form an LDD region of n-channel type TFT, an impurity element imparting n type is selectively added to the semiconductor layers 6604 and 6605. Masks 6607 to 6609 formed from resist are aimed therefor. Doping is carried out by ion doping as a typical method using phosphine ($PH_3$). The impurity regions formed are defined as low concentration n-type impurity regions 6610 and 6611, and the concentration of phosphorus (P) in this region is set within a range of $2\times10^{16}$ to $5\times10^{19}$ atoms/cm$^3$. Thereafter, the masks 6607 to 6609 are removed, and an activation process of the added impurity element is carried out. The activation process may be performed by laser annealing, because it is easy and convenience. An example of the conditions of the laser annealing is such that a laser pulse emission frequency is set to 1 KHz, and a laser energy density is set to 100 to 300 mj/cm$^2$ (typically 150 to 250 mJ/cm$^2$). A linear laser beam is then irradiated over the entire substrate surface with a 80 to 98% (preferably 95 to 99%) overlap ratio of the linear laser beam at this stage. An excimer laser of a gas laser, a YAG laser, or $YVO_4$ laser, $YalO_3$, YLF laser of a solid laser, and the like may be used as a laser oscillator upon laser annealing. In the case where the solid laser such as the YAG laser, the second harmonic (532 nm) and the third harmonic (355 nm) may be used in addition to the base harmonic (1064 nm). By carrying out the activation process with the above-mentioned conditions, the channel forming region and the low concentration n-type impurity region can be joined together satisfactory.

Then, as shown in FIG. 32B, gate electrodes 6611 to 6614 are formed on a gate insulating film 6606. Those gate electrodes may be formed from a material selected from the group consisting of tantalum (Ta), titanium (Ti), tungsten (W), and molybdenum (Mo), or an alloy containing as a main component the above element, or an alloy of combining the above elements (typically Mo—W alloy film, Mo—Ta alloy film). Below the conductive layer 111 formed from the above-mentioned materials, nitride such as a tantalum nitride (TaN) film, a tungsten nitride (WN) film, a titanium nitride (TiN) film, or molybdenum (MoN), silicide such as tungsten silicide, titanium silicide, or silicide mollybdenum may be formed. The thickness of the gate electrode may be set to 200 to 400 nm (preferably 250 to 350 nm). Also gate electrodes 6613 and 6614 are formed so as to partially overlap with low concentration n-type impurity region 6610 and 6611, respectively.

Then, as shown in FIG. 32C, a high concentration n-type impurity region that functions as a source region or a drain region of n-channel type TFT is formed. First, masks 6615 and 6616 consisting of resist are formed, and an impurity element imparting n type is added to form the high concentration n-type impurity regions 6618 and 6619. As the impurity imparting n type, phosphorus (P) is used, and ion doping using phosphine ($PH_3$) is carried out so that the concentration thereof falls within the concentration range of $1\times10^{20}$ to $1\times10^{21}$ atoms/cm$^3$. A high concentration n-type impurity region 6617 formed at the edge of the semiconductor layer 6603 forming a p-channel type TFT does not directly influence the operation of the p-channel type TFT, but can be used when the gettering process is required for the impurity element within the channel forming region.

Then, a high concentration p-type impurity region 6621 for forming a source region and a drain region in the semiconductor layer 6603 for forming p-channel type TFT is formed. Ion doping is performed using diborane ($B_2H_6$) with a gate electrode 6612 as a mask, forming a high concentration p-type impurity region in a self-aligning manner. The entire surface of the semiconductor layers 6604 and 6605 forming the n-channel type TFT is covered by a resist mask 6620 at this time. The boron (B) concentration in this impurity regions is set to be from $3\times10^{20}$ to $3\times10^{21}$ atoms/cm$^3$.

Figure 32E:
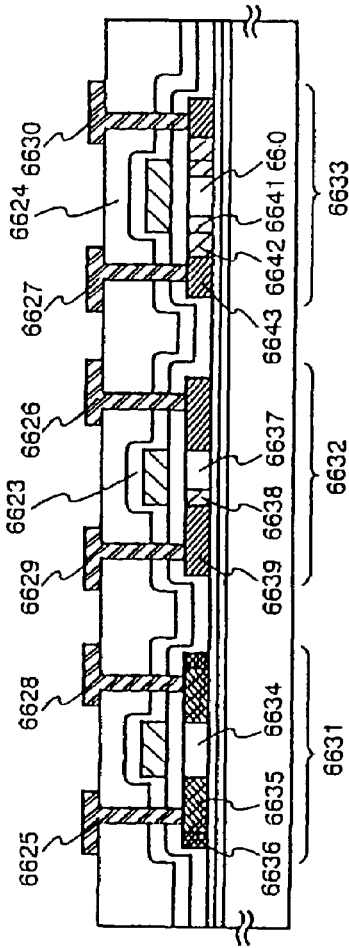

Thereafter, as shown in FIG. 32E, a first interlayer insulating film 6623 is formed from the gate electrode and gate insulating film. The first interlayer insulating film 6623 is formed from a silicon oxide film, a silicon oxynitride film, a silicon nitride film, or a lamination film thereof into a thickness of 100 to 200 nm. For example, when applying a silicon oxide film, it can be formed by plasma CVD in which TEOS (tetraethyl orthosilicate) and $O_2$ are mixed, with a reaction pressure of 40 Pa, and a substrate temperature set from 300 to 400° C., and discharge at a high frequency (13.56 MHz) power density of 0.5 to 0.8 W/cm$^2$. When applying a silicon oxynitride film, the silicon oxynitride film formed by plasma CVD using $SiH_4$, $N_2O$ and $NH_3$, or the silicon oxynitride film formed from $SiH_4$ and $N_2O$. In this case, manufacturing conditions are such that a reaction pressure is set to from 20 to 200 Pa, a substrate temperature is set to from 300 to 400° C., and a high frequency (60 MHz) power density is set to 0.1 to 1.0 W/cm$^2$. The silicon oxynitride film can be manufactured by plasma CVD using $SiH_4$ and $N_2O$.

Then, a process of activating the impurity elements added at each concentration, which impart n type or p-type conductivity, is performed. Thermal annealing using an annealing furnace is preferred to this process. In the thermal annealing, heat treatment is performed in a nitrogen atmosphere having an oxygen concentration equal to or less than 1 ppm, preferably equal to or less than 0.1 ppm, at 400 to 700° C., typically between 500 and 600° C., more typically 550° C. for 4 hours.

In addition to the heat treatment, a hydrogenation process of the semiconductor layer is performed by performing heat treatment for 1 to 12 hours at 300 to 450° C. in an atmosphere containing between 3 and 100% hydrogen. This is a process for terminating dangling bonds of $10^{16}$ to $10^{18}$/cm$^3$ in the semiconductor layers by thermally excited hydrogen. Plasma hydrogenation (using hydrogen, which is excited by the plasma) may also be used as another means of hydrogenation.

A second interlayer insulating film 6624 formed from an organic material is then formed with an average film thickness of 1.0 to 2.0 μm. A material such as polyimide, acrylic, polyamide, polyimideamide, BCB (benzocyclobutene) can be used as the organic insulating material. Like this, the surface of the interlayer insulating film can be flattened by forming the film using the organic insulating material.

In addition, organic resin materials generally have low dielectric constant, thereby being capable of reducing a parasitic capacitor and being a very important factor for operating TFT with a higher speed. However, these organic insulating materials are hygroscopic, thereby being not suitable as a protective film. Accordingly, it is preferable to use the organic insulating materials together with a silicon oxide film, a silicon oxynitride film, a silicon nitride film, and the like, formed for the first interlayer insulating film 6623.

Contact holes are then formed in the first and second interlayer insulating film, and source or drain wirings 6625 to 6630 are formed. The formation of the contact holes is conducted by dry etching using as an etching gas a mixture gas of $CF_4$, $O_2$ and He. The interlayer insulating film formed from an organic resin material is first etched, and the protective film 6624 is succeedingly etched using $CF_4$ and $O_2$ as the etching gas. In addition, in order to increase the selection ratio to the semiconductor layer, the etching gas is changed over to $CHF_3$ to etch the gate insulating film, with the result that it is possible to form contact holes satisfactorily. After forming the wirings, hydrogenation process and sintering process may simultaneously be performed at a temperature on the order of 300° C. As a result, electric characteristics of the TFT can be enhanced.

Thus, a p-channel TFT 6631 and n-channel TFTs 6632 and 6633 can be formed. The p-channel TFT 6631 has a channel forming region 6634 and a single-layer structure in which a source or a drain region 6635 consisting of a high concentration p-type impurity region is formed. The n-channel TFT 6632 has a channel forming region 6637, an LDD region 6638 (GOLD region) overlapping a gate electrode 6613, and a source or a drain region 6639, formed therein. If the LDD region 6638 is represented as Lov, the length in a channel length direction is set to 0.5 to 3.0 μm, preferably 1.0 to 2.0 μm. If the length of the LDD region 6638 is set within such ranges, a high electric field, which is generated in the vicinity of the drain region is relieved, to thereby protect a hot carrier from generating. As a result, degradation of TFT characteristics can be prevented. Formed in the n-channel TFT 6633 are a channel forming region 6640; an LDD region 6641 (GOLD region) overlapping a gate electrode 6614; an LDD region 6642 not overlapping the gate electrode 6614; and a source or a drain region 6643. If the LDD region 6643 is represented as Loff, the length in a channel length direction may be set 0.5 to 4.0 μm, preferably 1.5 to 2.5 μm. As a result, off-current can be mainly reduced with this LDD region.

The n-channel TFT 6632 has the LDD region 6638 overlapping the gate electrode 6613, formed therein. This LDD region is formed on the drain side. With this structure, degradation of characteristics due to hot carrier effect can be prevented from occurring, and the parasitic capacitor is suppressed to the lowest limit to enable a high speed operation. In addition, edges of the source and drain regions and an edge of the gate electrode are substantially made coincide with each other, with the result that a resistance loss is reduced to thereby enhance the current driving performance. Accordingly, the structure of the n-channel TFT 6632 is suitable for the buffer circuit, etc.

On the other hand, the n-channel TFT 6633 has a structure in which the LDD region 6641 overlapping the gate electrode 6614 and the LDD region not overlapping the gate electrode 6614 are provided, and therefore degradation of the TFT due to hot carrier effect is prevented from occurring, and off-current is reduced at the same time. This type of structure is suitable for TFT for forming an analog switch, etc. These TFTs are appropriately arranged to form a stick driver. The n-channel TFT 6632 has a structure suitable for a buffer circuit to which a high voltage equal to or greater than 30 V is applied. The TFT size required for various circuit formation (channel length/channel width) and the layout may suitably determined by the operator.

Figure 33:
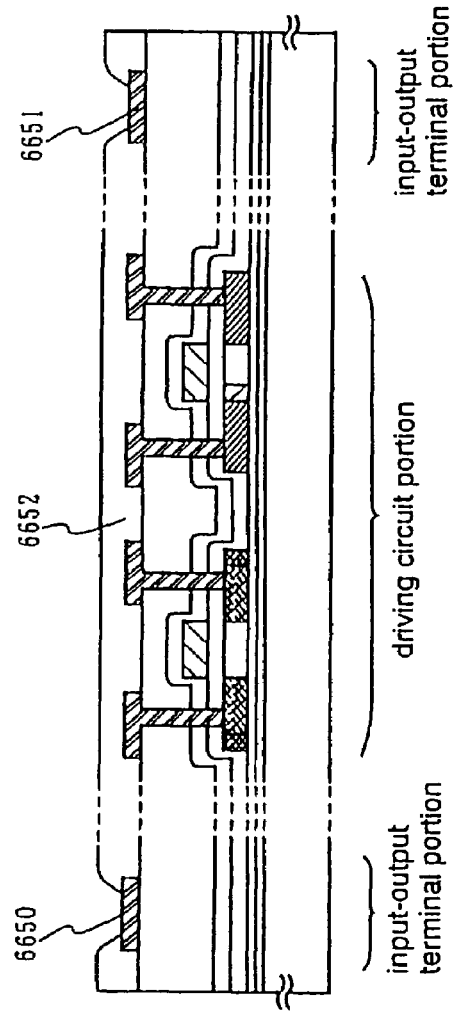
FIG. 33 is a cross-sectional drawing explaining the structure of the stick driver.

Input-output terminals provided on a stick driver are formed on the same layer as the source or drain wiring as shown in FIG. 33. FIG. 33 shows a state in which input/output terminals 6650 and 6651 are formed in an edge portion of a stick substrate. In order to mount the input-output terminals on a first substrate by using a face down COG method, surface passivation is necessary, and therefore the surface is passivated by an insulating layer 6652. The mode of input-output terminal can also be applied to a stick substrate manufactured in Embodiment 13.

Embodiment 15

Figure 29:
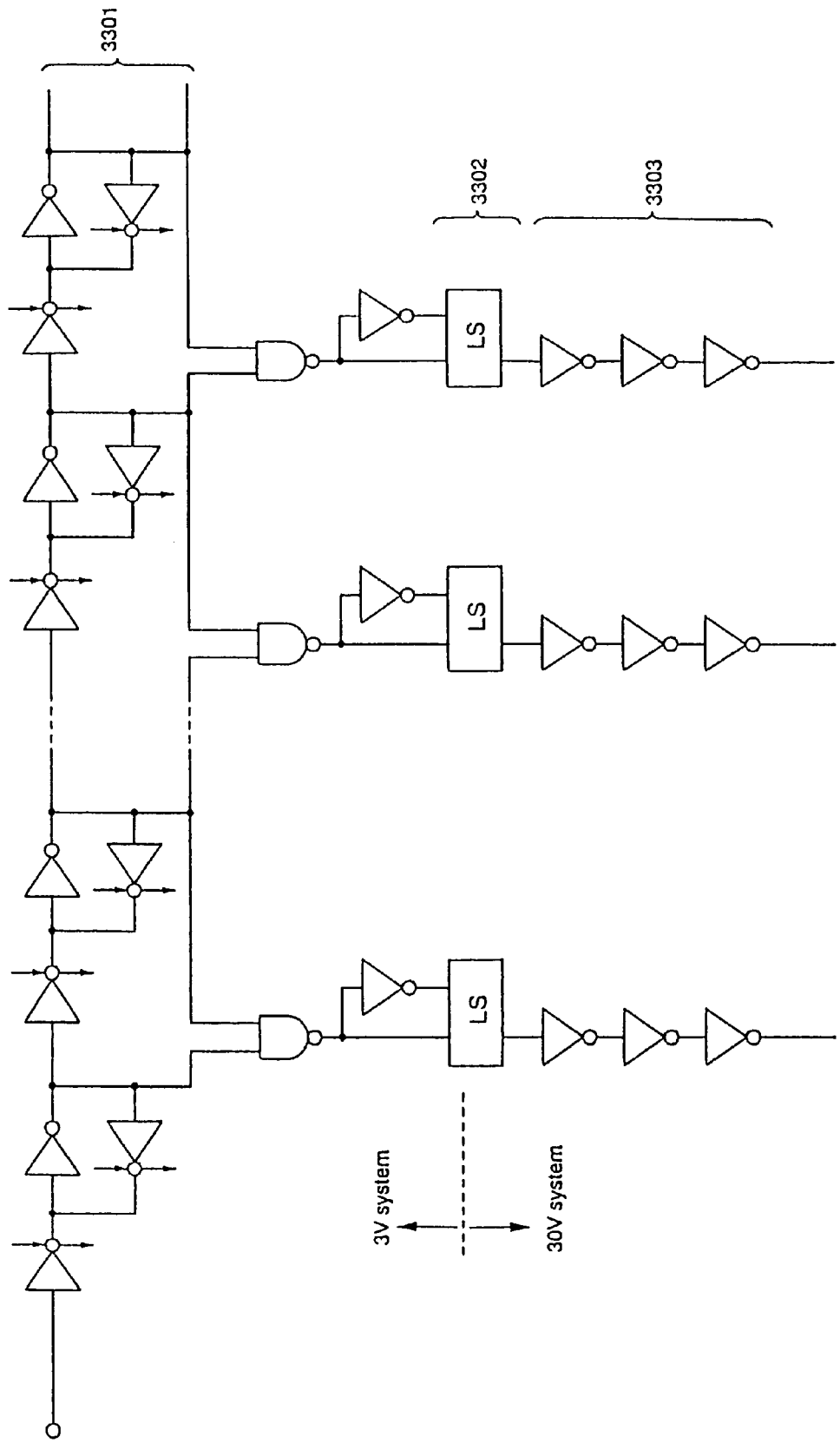
FIG. 29 is a diagram explaining the structure of the driver circuit of the stick driver connected to a scanning line.
Figure 30:
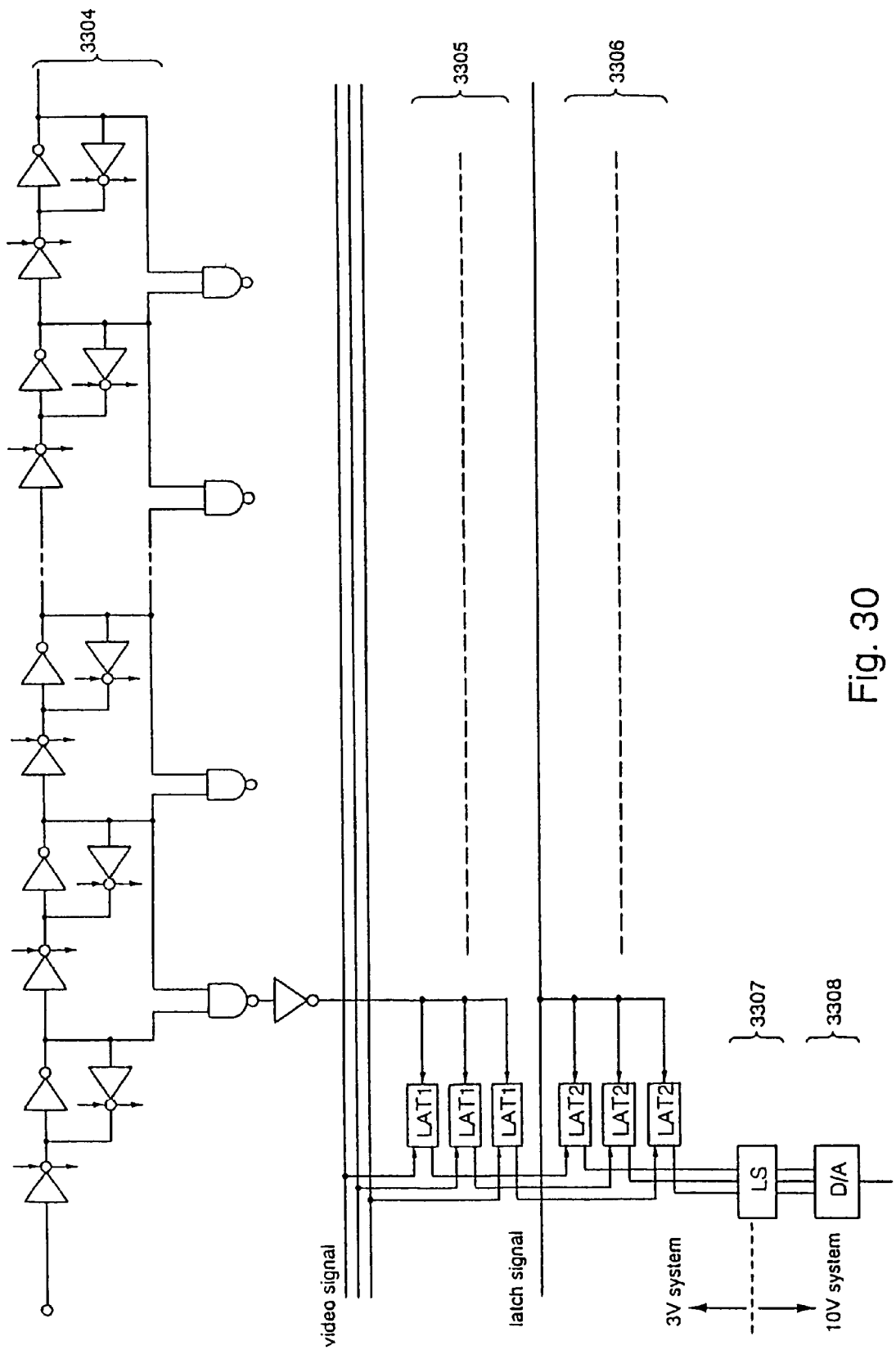
FIG. 30 is a diagram explaining the structure of the driver circuit of the stick driver connected to a scanning line.

The circuit structure of the stick drivers connected to a pixel region differs between on the scanning line side and on the data line side. FIG. 29 shows an example of a circuit structure of the stick driver to be connected to the scanning line side. This driver circuit has a shift register circuit 3301, a level shifter circuit 3302, and a buffer circuit 3303 arranged in the stated order from a signal input side. The shift register circuit is driven at a power supply voltage of 3 V, but the buffer circuit is driven at 20 to 30 V for driving the liquid crystal. Therefore the withstand voltage of the buffer circuit is required to be increased. The TFT used for the circuit formation may employ a structure described in Embodiment 13 or 14. However, such a structure must be employed in which the channel length is set to equal or greater than 5 μm, and the LDD region overlapping the gate electrode is necessarily provided. In addition, it is desirable that the thickness of the gate insulating film is set to 100 to 200 nm, preferably 150.

TFTs shown in FIGS. 31F and 32E each are described as a single-layer structure in which single gate electrode is provided between a pair of the source/drain. However, in order to increase the withstand voltage, a multi-gate structure having a plurality of gate electrodes may be used for the formation of TFT.

On the other hand, a stick driver connected on a data line side has a shift register circuit 3304, latch circuits 3305 and 3306, a level shifter circuit 3307, a D/A converter circuit 3308 are arranged in the stated order from an input side. The shift register circuit and the latch circuit are driven at 3 V, and a consideration to the withstand voltage of the D/A converter, which is driven at 10 V, may be ignored. However, since the high speed operation equal to or greater than 50 MHz is required, it is desired that the channel length is set to 0.5 to 5 μm, and the thickness of the gate insulating film is set to 40 to 100 nm, preferably 75 nm. In addition, in order to realize a high speed operation, it is desired that the length of the LDD region overlapping the gate electrode is set to 0.5 to 1 μm, and the influence of the parasitic capacitor is reduced as much as possible.

According to the present invention, the structures of the TFTs formed in the respective driver circuits of the stick driver formed on the scanning line side and the stick driver formed on the data line side can be made optimum. For the TFT of the stick driver on the scanning line side, TFT that can withstand the voltage on the order of 30 V can be fabricated. It is also possible for the TFT of the stick driver on the data line side to be driven at 3 to 5 V with a frequency equal to or greater that 50 MHz.

Otherwise, the signal dividing circuit is provided on the data line side to dividingly drive the TFT, and a load on the stick driver is reduced, thereby being capable of obtaining more stable circuit operation.

Further, the driver circuit is divided into the low voltage driver portion and the high voltage driver portion, and the TFTs suitable therefor are fabricated, realizing low power consumption driving.

What is claimed is:

1. A method of manufacturing a semiconductor device, comprising:

forming over a first substrate a pixel region provided with thin film transistors having amorphous semiconductors;

forming over a second substrate an opposing electrode corresponding to said pixel region;

bonding said first substrate and said second substrate with a liquid crystal layer sandwiched therebetween;

forming over a third substrate a plurality of driver circuits from thin film transistors having crystalline semiconductors;

dividing said plurality of driver circuits formed over said third substrate to form plural stick-like substrates; and adhering said plural stick-like substrates to the periphery of said pixel region of said first substrate to electrically connect said pixel region to said plurality of driver circuits, wherein the step of forming said plurality of driver circuits includes a step of forming a first thickness gate insulating film and a step of forming a second thickness gate insulating film.

2. A method of manufacturing a semiconductor device according to claim 1, wherein the step of forming the first thickness gate insulating film and the step of forming the second thickness gate insulating film include a first stage of depositing an insulating film from a reactive gas containing silicon as well as oxygen or nitrogen, and a second stage of subjecting said insulating film to heat treatment in an oxidizing atmosphere.

3. A method of manufacturing a semiconductor device according to claim 1, wherein the step of forming the first thickness gate insulating film and the step of forming the second thickness gate insulating film include a first stage of depositing an insulating film from a reactive gas containing silicon as well as oxygen or nitrogen, and a second stage of subjecting said insulating film to heat treatment in an oxidizing atmosphere containing halogen.

4. A method of manufacturing a semiconductor device according to claim 1, wherein each of said thin film transistors having amorphous semiconductors is formed to have a bottom gate structure whereas each of said thin film transistors having crystalline semiconductors is formed to have a top gate structure.

5. A method of manufacturing a semiconductor device according to claim 1, wherein said semiconductor device is a device selected from the group consisting of: a portable telephone; a video camera; a mobile computer; a portable electronic book; a digital camera; a personal computer; a DVD player; and a television.

6. A method of manufacturing a semiconductor device comprising:

forming over a first substrate a pixel region having thin film transistors, each of said thin film transistors having a channel region comprising an amorphous semiconductor and formed adjacent to each intersection between a plurality of scanning lines and a plurality of data lines which intersect each other through an insulating layer;

forming over a second substrate an opposing electrode corresponding to said pixel region;

bonding said first substrate and said second substrate with a liquid crystal layer sandwiched therebetween;

forming over a third substrate a plurality of units each including a driver circuit that is formed from a thin film transistor having a crystalline semiconductor, each of said plurality of units further including an input terminal and an output terminal which belong to said driver circuit;

dividing said plurality of driver circuits formed over said third substrate to form plural stick-like substrates; and adhering said plural stick-like substrates to the periphery of said pixel region of said first substrate to electrically connect output terminals of said plurality of driver circuits to said plurality of scanning lines or data lines of said pixel region, wherein the step of forming said plurality of units includes a step of forming a first thickness gate insulating film and a step of forming a second thickness gate insulating film.

7. A method of manufacturing a semiconductor device according to claim 6, wherein the step of forming the first thickness gate insulating film and the step of forming the second thickness gate insulating film include a first stage of depositing an insulating film from a reactive gas containing silicon as well as oxygen or nitrogen, and a second stage of subjecting said insulating film to heat treatment in an oxidizing atmosphere.

8. A method of manufacturing a semiconductor device according to claim 6, wherein the step of forming the first thickness gate insulating film and the step of forming the second thickness gate insulating film include a first stage of depositing an insulating film from a reactive gas containing silicon as well as oxygen or nitrogen, and a second stage of subjecting said insulating film to heat treatment in an oxidizing atmosphere containing halogen.

9. A method of manufacturing a semiconductor device according to claim 6, wherein said thin film transistor having an amorphous semiconductor is formed to have a bottom gate structure whereas said thin film transistor having a crystalline semiconductor is formed to have a top gate structure.

10. A method of manufacturing a semiconductor device according to claim 6, wherein said semiconductor device is a device selected from the group consisting of: a portable telephone; a video camera; a mobile computer; a portable electronic book; a digital camera; a personal computer; a DVD player; and a television.

11. A method of manufacturing a semiconductor device, comprising:

forming over a first substrate a pixel region provided with thin film transistors having amorphous semiconductors;

forming over a second substrate an opposing electrode corresponding to said pixel region;

forming over a third substrate a plurality of driver circuits formed from thin film transistors having crystalline semiconductors;

bonding said first substrate and said second substrate with a liquid crystal layer sandwiched therebetween;

dividing said plurality of driver circuits formed over said third substrate to form plural stick-like substrates; and adhering said plural stick-like substrates to the periphery of said pixel region of said first substrate to electrically connect said pixel region to said plurality of driver circuits.

12. A method of manufacturing a semiconductor device according to claim 11, wherein said first substrate, said second substrate and said third substrate have the same thickness.

13. A method of manufacturing a semiconductor device according to claim 11, wherein said first substrate, said second substrate and said third substrate are formed of the same material.

14. A method of manufacturing a semiconductor device according to claim 11,
wherein each of said thin film transistors having amorphous semiconductors is formed to have a bottom gate structure whereas each of said thin film transistors having crystalline semiconductors is formed to have a top gate structure.

15. A method of manufacturing a semiconductor device according to claim 11,
wherein said semiconductor device is a device selected from the group consisting of: a portable telephone; a video camera; a mobile computer; a portable electronic book; a digital camera; a personal computer; a DVD player; and a television.

16. A method of manufacturing a semiconductor device comprising:
forming over a first substrate a pixel region having thin film transistors, each of said thin film transistors having a channel region comprising an amorphous semiconductor and formed adjacent to each intersection between a plurality of scanning lines and a plurality of data lines which intersect each other through an insulating layer;
forming over a second substrate an opposing electrode corresponding to said pixel region;
forming over a third substrate a plurality of units each including a driver circuit that is formed from a thin film transistor having a crystalline semiconductor, each of said plurality of units further including an input terminal and an output terminal which belong to said driver circuit;
bonding said first substrate and said second substrate with a liquid crystal layer sandwiched therebetween;
dividing said plurality of driver circuits formed over said third substrate to form plural stick-like substrates; and
adhering said plural stick-like substrates to the periphery of said pixel region of said first substrate to electrically connect output terminals of said plurality of driver circuits to said plurality of scanning lines or data lines of said pixel region.

17. A method of manufacturing a semiconductor device according to claim 16,
wherein said first substrate, said second substrate and said third substrate have the same thickness.

18. A method of manufacturing a semiconductor device according to claim 16, wherein said first substrate, said second substrate and said third substrate are formed of the same material.

19. A method of manufacturing a semiconductor device according to claim 16, wherein said thin film transistor having an amorphous semiconductor is formed to have a bottom gate structure whereas said thin film transistor having a crystalline semiconductor is formed to have a top gate structure.

20. A method of manufacturing a semiconductor device according to claim 16,
wherein the step of forming said plurality of units includes a step of forming one of said plurality of units in a rectangular region whose shorter side is 1 to 6 mm in length and whose longer side is 15 to 80 mm in length, and groups of said plurality of units are formed over said third substrate with each group forming a 10 to 20 cm square.

21. A method of manufacturing a semiconductor device according to claim 16,
wherein the step of forming said plurality of units includes a step of forming one of said plurality of units in a rectangular region whose shorter side is 1 to 6 mm in length and whose longer side is 15 to 80 mm in length, and groups of said plurality of units are formed over said third substrate with each group forming a 10 to 20 cm square, and
wherein the step of dividing said plurality of driver circuits includes a stage of dividing said third substrate by scribing to cut out said groups of 10 to 20 cm squares, and a stage of separating said groups of 10 to 20 cm squares from one another by dicing to cut out stick-like substrates formed with said plurality of units.

22. A method of manufacturing a semiconductor device according to claim 16,
wherein said semiconductor device is a device selected from the group consisting of: a portable telephone; a video camera; a mobile computer; a portable electronic book; a digital camera; a personal computer; a DVD player; and a television.

23. A method of manufacturing a semiconductor device, comprising:
forming over a first substrate a pixel region provided with thin film transistors having amorphous semiconductors;
forming over a second substrate a plurality of driver circuits formed from thin film transistors having crystalline semiconductors;
dividing said plurality of driver circuits formed over said second substrate to form plural stick-like substrates; and
adhering said plural stick-like substrates to the periphery of said pixel region of said first substrate to electrically connect said pixel region to said plurality of driver circuits,
wherein forming the plurality of driver circuits includes a step of forming a first thickness gate insulating film and a step of forming a second thickness gate insulating film.

24. A method of manufacturing a semiconductor device according to claim 23,
wherein the step of forming the first thickness gate insulating film and the step of forming the second thickness gate insulating film include a first stage of depositing an insulating film from a reactive gas containing silicon as well as oxygen or nitrogen, and a second stage of subjecting said insulating film to heat treatment in an oxidizing atmosphere.

25. A method of manufacturing a semiconductor device according to claim 23,
wherein the step of forming the first thickness gate insulating film and the step of forming the second thickness gate insulating film include a first stage of depositing an insulating film from a reactive gas containing silicon as well as oxygen or nitrogen, and a second stage of subjecting said insulating film to heat treatment in an oxidizing atmosphere containing halogen.

26. A method of manufacturing a semiconductor device according to claim 23,
wherein each of said thin film transistors having amorphous semiconductors is formed to have a bottom gate structure whereas each of said thin film transistors having crystalline semiconductors is formed to have a top gate structure.

27. A method of manufacturing a semiconductor device according to claim 23,
wherein said semiconductor device is a device selected from the group consisting of a portable information terminal; a camera, a personal computer, a player using a recording medium, and a television.

28. A method of manufacturing a semiconductor device according to claim 23,
wherein said semiconductor device is an electroluminescence display device.

29. A method of manufacturing a semiconductor device comprising:
- forming over a first substrate a pixel region having thin film transistors, each of said thin film transistors having a channel region comprising an amorphous semiconductor and formed adjacent to each intersection between a plurality of scanning lines and a plurality of data lines which intersect each other through an insulating layer;
- forming over a second substrate a plurality of units each including a driver circuit that is formed from a thin film transistor having a crystalline semiconductor, each of the plurality of units further including an input terminal and an output terminal which belong to said driver circuit;
- dividing said plurality of driver circuits formed over said second substrate to form plural stick-like substrates; and
- adhering said plural stick-like substrates to the periphery of said pixel region of said first substrate to electrically connect output terminals of said plurality of driver circuits to said plurality of scanning lines or data lines of said pixel region,
- wherein forming the plurality of units includes a step of forming a first thickness gate insulating film and a step of forming a second thickness gate insulating film.

30. A method of manufacturing a semiconductor device according to claim 29,
- wherein the step of forming the plurality of units includes a step of forming one of the plurality of units in a rectangular region whose shorter side is 1 to 6 mm in length and whose longer side is 15 to 80 mm in length, and groups of the plurality of units are formed over said second substrate with each group forming a 10 to 20 cm square.

31. A method of manufacturing a semiconductor device according to claim 29,
- wherein the step of forming the plurality of units includes a step of forming one of the plurality of units in a rectangular region whose shorter side is 1 to 6 mm in length and whose longer side is 15 to 80 mm in length, and groups of the plurality of units are formed over said second substrate with each group forming a 10 to 20 cm square, and
- wherein the step of dividing said plurality of driver circuits includes a stage of dividing said second substrate by scribing to cut out said groups of 10 to 20 cm squares, and a stage of separating said groups of 10 to 20 cm squares from one another by dicing to cut out stick-like substrates formed with the plurality of units.

32. A method of manufacturing a semiconductor device according to claim 29,
- wherein the step of forming the first thickness gate insulating film and the step of forming the second thickness gate insulating film include a first stage of depositing an insulating film from a reactive gas containing silicon as well as oxygen or nitrogen, and a second stage of subjecting said insulating film to heat treatment in an oxidizing atmosphere.

33. A method of manufacturing a semiconductor device according to claim 29,
- wherein the step of forming the first thickness gate insulating film and the step of forming the second thickness gate insulating film include a first stage of depositing an insulating film from a reactive gas containing silicon as well as oxygen or nitrogen, and a second stage of subjecting said insulating film to heat treatment in an oxidizing atmosphere containing halogen.

34. A method of manufacturing a semiconductor device according to claim 29,
- wherein said thin film transistor having an amorphous semiconductor is formed to have a bottom gate structure whereas said thin film transistor having a crystalline semiconductor is formed to have a top gate structure.

35. A method of manufacturing a semiconductor device according to claim 29,
- wherein said semiconductor device is a device selected from the group consisting of a portable information terminal; a camera, a personal computer, a player using a recording medium, and a television.

36. A method of manufacturing a semiconductor device according to claim 29,
- wherein said semiconductor device is an electroluminescence display device.

37. A method of manufacturing a semiconductor device, comprising:
- forming over a first substrate a pixel region provided with thin film transistors having amorphous semiconductors;
- forming over a second substrate a plurality of driver circuits formed from thin film transistors having crystalline semiconductors;
- dividing said plurality of driver circuits formed over said second substrate to form plural stick-like substrates; and
- adhering said plural stick-like substrates to the periphery of said pixel region of said first substrate to electrically connect said pixel region to said plurality of driver circuits.

38. A method of manufacturing a semiconductor device according to claim 37,
- wherein each of said thin film transistors having amorphous semiconductors is formed to have a bottom gate structure whereas each of said thin film transistors having crystalline semiconductors is formed to have a top gate structure.

39. A method of manufacturing a semiconductor device according to claim 37,
- wherein said semiconductor device is a device selected from the group consisting of a portable information terminal; a camera, a personal computer, a player using a recording medium, and a television.

40. A method of manufacturing a semiconductor device according to claim 37,
- wherein said semiconductor device is an electroluminescence display device.

41. A method of manufacturing a semiconductor device comprising:
- forming over a first substrate a pixel region having thin film transistors, each of said thin film transistors having a channel region comprising an amorphous semiconductor and formed adjacent to each intersection between a plurality of scanning lines and a plurality of data lines which intersect each other through an insulating layer;
- forming over a second substrate a plurality of units each including a driver circuit that is formed from a thin film transistor having a crystalline semiconductor, each of the plurality of units further including an input terminal and an output terminal which belong to said driver circuit;
- dividing said plurality of driver circuits formed over said second substrate to form plural stick-like substrates; and
- adhering said plural stick-like substrates to the periphery of said pixel region of said first substrate to electrically connect output terminals of said plurality of driver circuits to said plurality of scanning lines or data lines of said pixel region.

42. A method of manufacturing a semiconductor device according to claim 41,
wherein the step of forming the plurality of units includes a step of forming one of the plurality of units in a rectangular region whose shorter side is 1 to 6 mm in length and whose longer side is 15 to 80 mm in length, and groups of the plurality of units are formed over said second substrate with each group forming a 10 to 20 cm square.

43. A method of manufacturing a semiconductor device according to claim 41,
wherein the step of forming the plurality of units includes a step of forming one of the plurality of units in a rectangular region whose shorter side is 1 to 6 mm in length and whose longer side is 15 to 80 mm in length, and groups of the plurality of units are formed over said second substrate with each group forming a 10 to 20 cm square, and
wherein the step of dividing said plurality of driver circuits includes a stage of dividing said second substrate by scribing to cut out said groups of 10 to 20 cm squares, and a stage of separating said groups of 10 to 20 cm squares from one another by dicing to cut out stick-like substrates formed with the plurality of units.

44. A method of manufacturing a semiconductor device according to claim 41,
wherein said thin film transistor having an amorphous semiconductor is formed to have a bottom gate structure whereas said thin film transistor having a crystalline semiconductor is formed to have a top gate structure.

45. A method of manufacturing a semiconductor device according to claim 41,
wherein said semiconductor device is a device selected from the group consisting of a portable information terminal; a camera, a personal computer, a player using a recording medium, and a television.

46. A method of manufacturing a semiconductor device according to claim 41,
wherein said semiconductor device is an electroluminescence display device.

* * * * *